United States Patent
Tsern et al.

(10) Patent No.: US 9,691,504 B2
(45) Date of Patent: Jun. 27, 2017

(54) DRAM RETENTION TEST METHOD FOR DYNAMIC ERROR CORRECTION

(71) Applicant: Rambus Inc., Sunnyvale, CA (US)

(72) Inventors: Ely Tsern, Los Altos, CA (US); Frederick A Ware, Los Altos Hills, CA (US); Suresh Rajan, Fremont, CA (US); Thomas Vogelsang, Mountain View, CA (US)

(73) Assignee: Rambus Inc., Sunnyvale, CA (US)

( * ) Notice: Subject to any disclaimer, the term of this patent is extended or adjusted under 35 U.S.C. 154(b) by 195 days.

(21) Appl. No.: 14/353,401

(22) PCT Filed: Oct. 19, 2012

(86) PCT No.: PCT/US2012/061212
§ 371 (c)(1),
(2) Date: Apr. 22, 2014

(87) PCT Pub. No.: WO2013/062874
PCT Pub. Date: May 2, 2013

(65) Prior Publication Data
US 2014/0289574 A1 Sep. 25, 2014

Related U.S. Application Data

(60) Provisional application No. 61/550,845, filed on Oct. 24, 2011, provisional application No. 61/695,210, filed on Aug. 30, 2012.

(51) Int. Cl.
*G11C 29/00* (2006.01)
*G11C 29/24* (2006.01)
*G06F 11/10* (2006.01)
*G11C 29/50* (2006.01)
(Continued)

(52) U.S. Cl.
CPC .......... *G11C 29/24* (2013.01); *G06F 11/1008* (2013.01); *G11C 29/50016* (2013.01); *G11C 5/04* (2013.01); *G11C 2029/4402* (2013.01); *G11C 2211/4061* (2013.01)

(58) Field of Classification Search
CPC ..... G11C 29/24; G11C 29/50016; G11C 5/04; G06F 11/1008
See application file for complete search history.

(56) References Cited

U.S. PATENT DOCUMENTS

| | | |
|---|---|---|
| 4,748,627 A | 5/1988 | Ohsawa |
| 7,444,577 B2 | 10/2008 | Best et al. |
| 7,522,464 B2 | 4/2009 | Yoo et al. |

(Continued)

OTHER PUBLICATIONS

International Search Report and Written Opinion dated Dec. 27, 2012 in International Application No. PCT/US2012/061212. 8 pages.

*Primary Examiner* — Sam Rizk
(74) *Attorney, Agent, or Firm* — Lance Kreisman; Peninsula Patent Group

(57) ABSTRACT

A method of operation in an integrated circuit (IC) memory device is disclosed. The method includes refreshing a first group of storage rows in the IC memory device at a first refresh rate. A retention time for each of the rows is tested. The testing for a given row under test includes refreshing at a second refresh rate that is slower than the first refresh rate. The testing is interruptible based on an access request for data stored in the given row under test.

18 Claims, 36 Drawing Sheets

(51) Int. Cl.
 *G11C 5/04* (2006.01)
 *G11C 29/44* (2006.01)

(56) References Cited

U.S. PATENT DOCUMENTS

| | | |
|---|---|---|
| 7,565,479 B2 | 7/2009 | Best et al. |
| 7,565,593 B2 | 7/2009 | Dixon et al. |
| 7,734,866 B2 | 6/2010 | Tsern |
| 7,961,542 B2 | 6/2011 | Smith |
| 8,023,350 B2 | 9/2011 | Bunker et al. |
| 2004/0199717 A1* | 10/2004 | Kanda ............. G11C 11/406 711/106 |
| 2005/0041502 A1 | 2/2005 | Perner |
| 2007/0030746 A1* | 2/2007 | Best ............... G11C 11/406 365/222 |
| 2007/0033338 A1 | 2/2007 | Tsern |
| 2007/0097677 A1* | 5/2007 | Oh ................. G11C 7/04 362/222 |
| 2009/0024884 A1 | 1/2009 | Klein |
| 2009/0316501 A1 | 12/2009 | Bunker et al. |
| 2010/0208537 A1 | 8/2010 | Pelley, III et al. |

\* cited by examiner

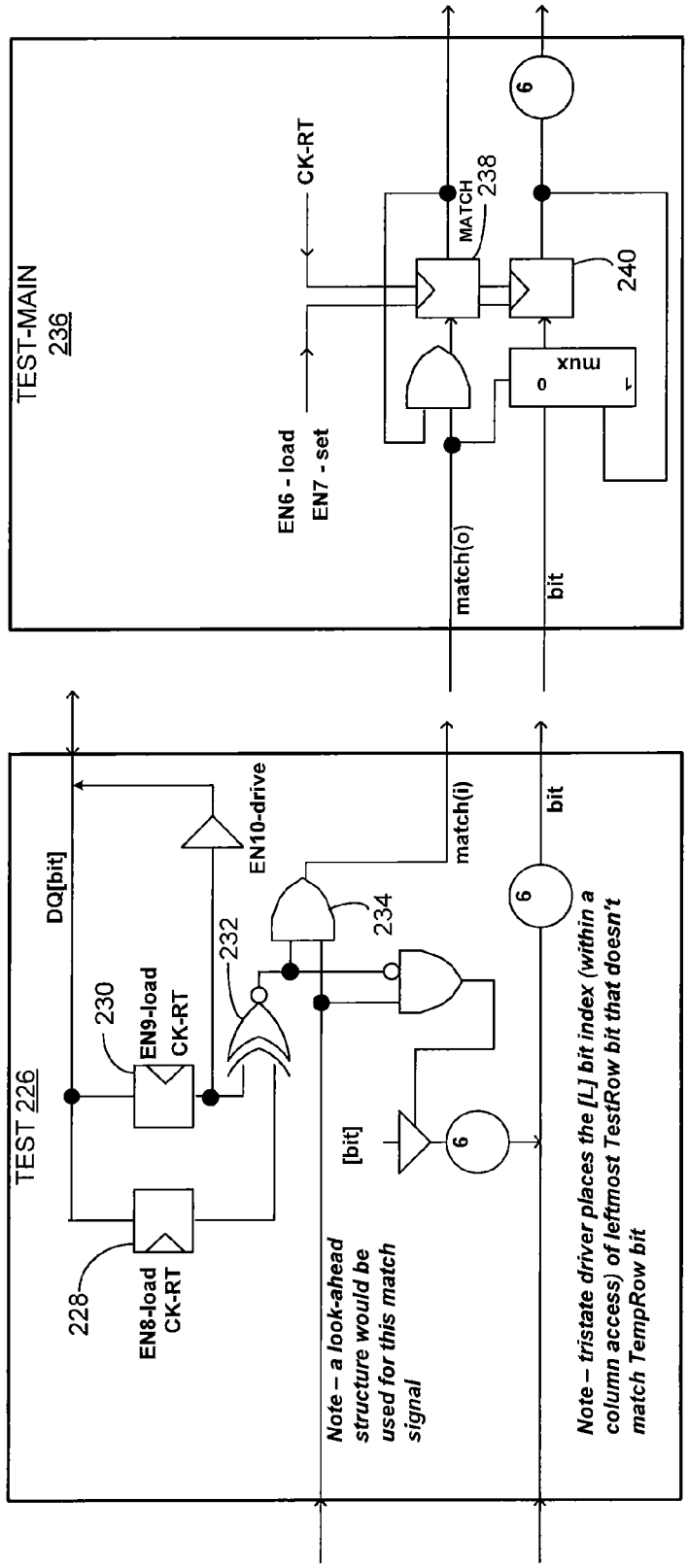

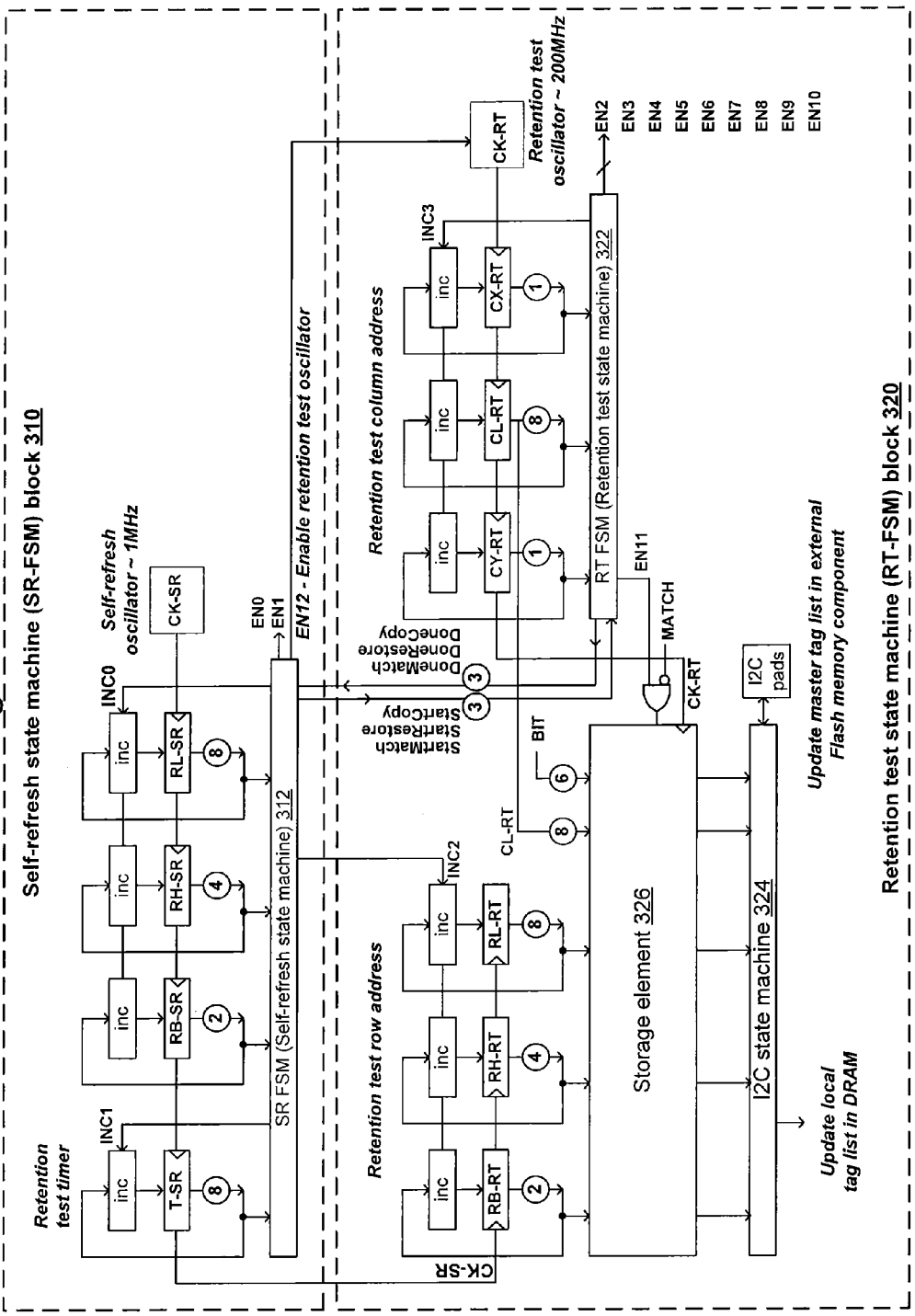

Figure 6 Retention Test (RT) - Match sequence

918  To 906

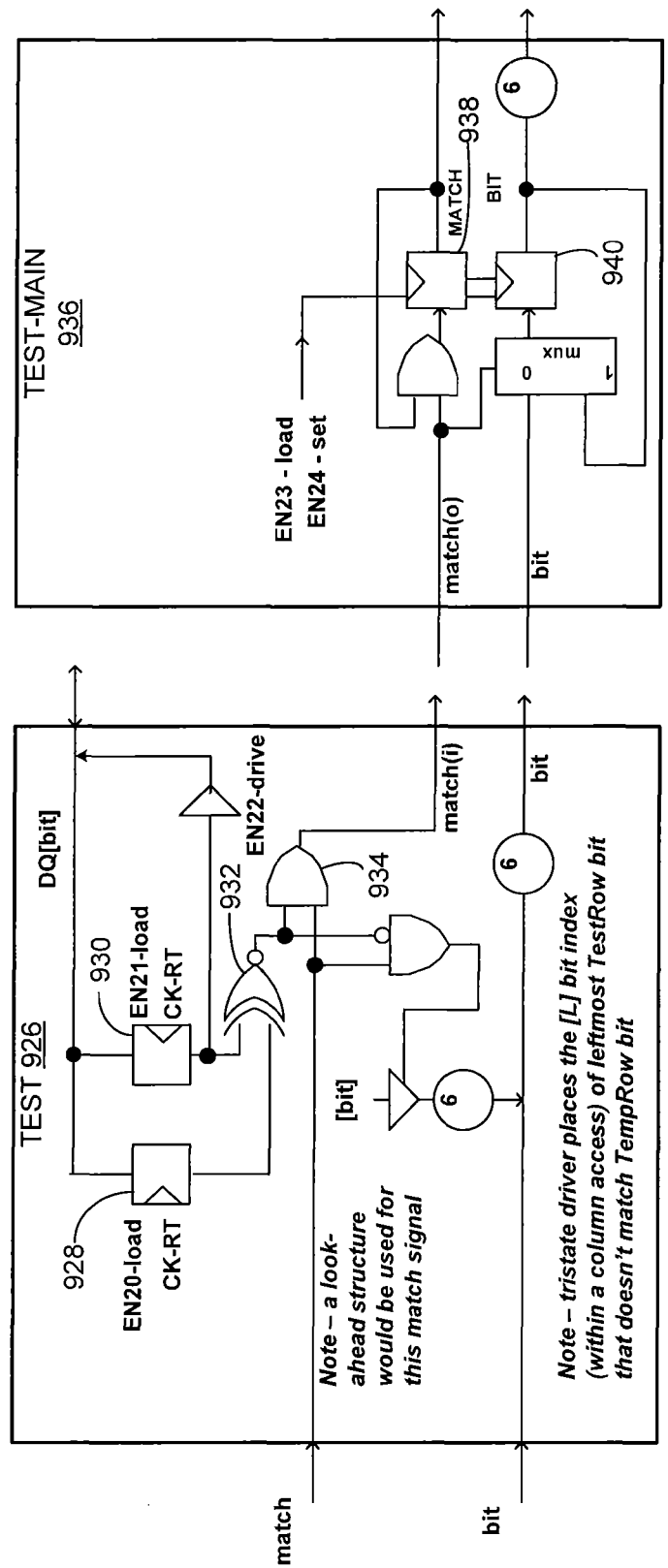

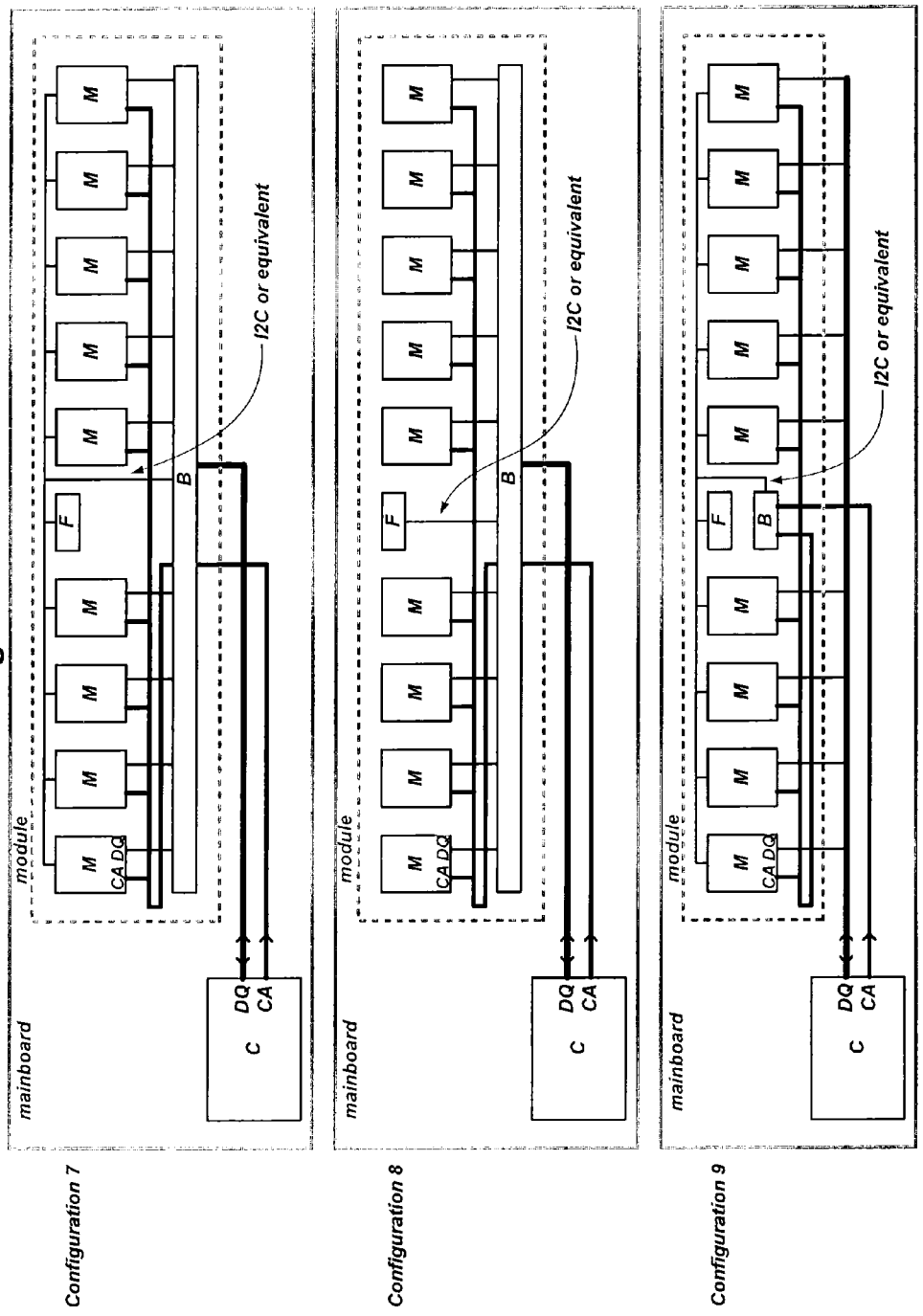

Figure 22
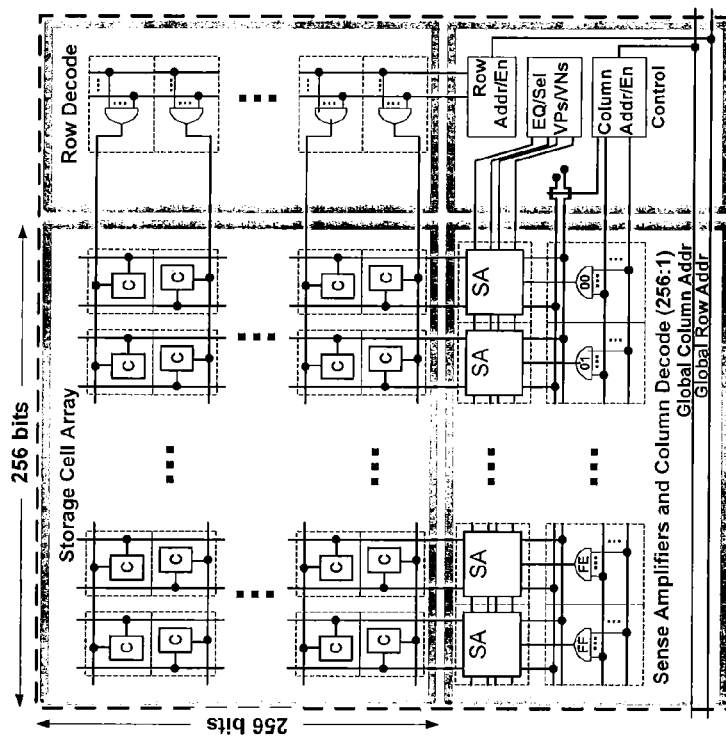
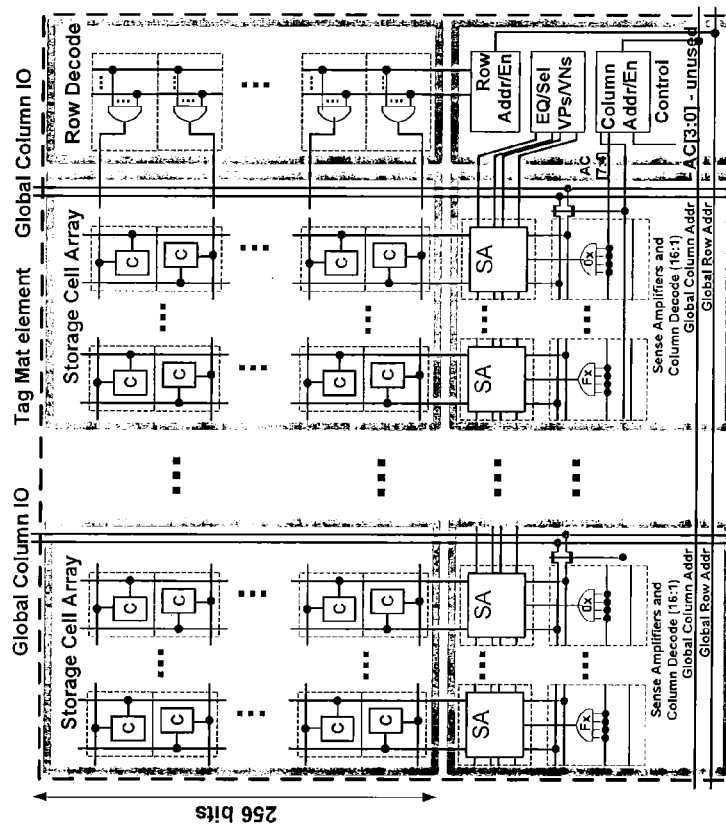

DRAM RETENTION TEST METHOD FOR DYNAMIC ERROR CORRECTION

CROSS-REFERENCE TO RELATED APPLICATIONS/TECHNICAL FIELD

Pursuant to 35 U.S.C. § 365, this application claims priority from International Application No. PCT/US2012/061212 published as WO 2013/062874 A1 on May 2, 2013, which claims priority from U.S. Provisional Application No. 61/550,845, filed Oct. 24, 2011, entitled "DRAM RETENTION TEST METHOD, COMPONENTS, AND SYSTEM CONFIGURATIONS FOR DYNAMIC ERROR CORRECTION", and U.S. Provisional Application No. 61/695,210, filed Aug. 30, 2012, and entitled "DRAM RETENTION TEST METHOD FOR DYNAMIC ERROR CORRECTION." International Application No. PCT/US2012/061212 and U.S. Provisional Applications Nos. 61/550,845 and 61/695,210 are hereby incorporated by reference in their entirety. The disclosure herein relates to memory systems, and more specifically to methods and apparatus for memory refresh operations.

BACKGROUND

Memory systems typically employ large amounts of DRAM memory as main memory. At the transistor level, a DRAM cell is a capacitor structure, with the capability of maintaining a charge representing a "bit" on the order of approximately 64 ms. To maintain the charge, the cell needs to be periodically refreshed—generally involving a read and write operation every 64 ms. Conventionally, the entire DRAM array is blindly refreshed even though much of the memory may not be active. Conventional refresh operations can consume as much as a third of the power consumption associated with the memory.

While DRAMs traditionally employ hardware-based refresh operations at very high rates, a variety of other memory technologies provide fast access times similar to DRAM, but with much slower refresh rate requirements. For example, some forms of RRAM can operate with refresh rates on the order of seconds. Slower refresh rates can also be beneficial for memory technologies that are susceptible to repetitive write operations that can degrade cell retention.

Thus, the need exists for an improved refresh scheme for memory systems that can minimize power dissipation and take advantage of reduced-rate refresh requirements.

BRIEF DESCRIPTION OF THE DRAWINGS

Embodiments of the disclosure are illustrated by way of example, and not by way of limitation, in the figures of the accompanying drawings and in which like reference numerals refer to similar elements and in which:

FIGS. 2A-2E illustrate an exemplary DRAM component modified to implement the DRAM retention test and dynamic error correction techniques, according to one embodiment;

FIG. 3 illustrates an embodiment that implements the two finite state machines described in FIGS. 2A-2E;

FIG. 9A-9E illustrate an exemplary DRAM component modified to implement the alternate retention test method, according to one embodiment;

FIGS. 16A-16D show embodiments of different system configurations employing the storage cell repair techniques discussed herein;

FIG. 22 illustrates an embodiment for the special mat cell used to implement the column repair method disclosed herein.

Like reference numerals refer to corresponding parts throughout the drawing figures.

DETAILED DESCRIPTION

As lithographic feature sizes get smaller in successive generations of dynamic random access memory (DRAM) components, individual storage cell capacitance correspondingly lowers. In an inverse manner, leakage current associated with access transistor elements increases in each successive DRAM generation because of reductions in gate threshold voltages. Since the retention time of a dynamic storage cell is proportional to the storage capacitance divided by leakage current, the trend is for average DRAM retention times to decrease for each process generation.

In order to "retain" data in a DRAM storage cell, each storage cell typically undergoes a periodic refresh that involves sensing a row and rewriting it. The parameter for a timing interval between successive sensing operations is called a refresh time, or "tREF." The tREF interval is less than the retention time interval of every storage cell on each DRAM component.

During manufacture, DRAM components are exposed to testing operations to confirm acceptable tREF parameters. The testing is usually performed at worst case temperature and supply voltage conditions. If the retention time of a storage cell degrades after manufacture, the DRAM (and a module or board into which it is soldered) may become unusable. Apparatus and methods of detecting degraded storage cell retention times and dynamic error correction techniques are disclosed in various embodiments herein.

In addition, several embodiments are presented that enable remapping information to be stored in different locations on or proximate the DRAM component. Moreover, the remapping information may be accessed by different devices in a system.

System Environment

Figure 1:
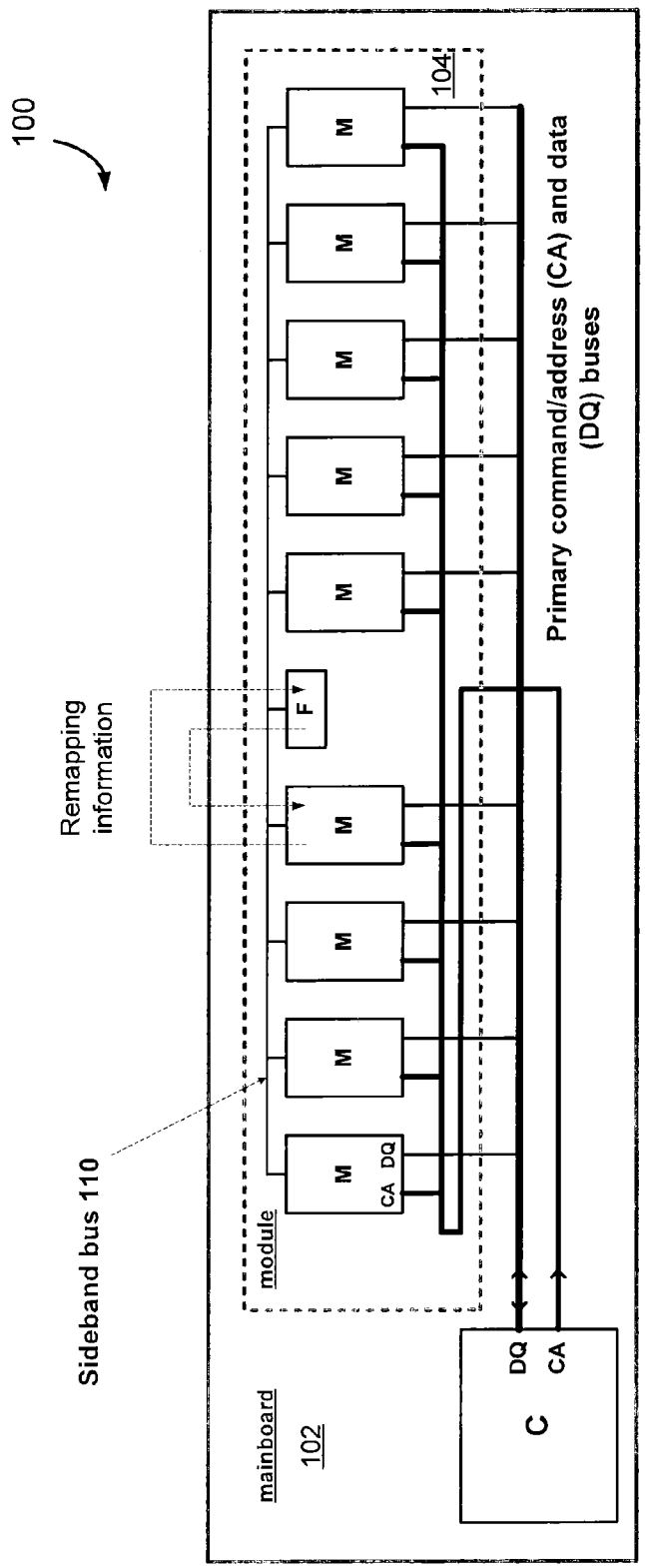
FIG. 1 illustrates an exemplary system incorporating the DRAM retention test and dynamic error correction techniques in accordance with one embodiment.

FIG. 1 illustrates one embodiment of a system 100 that incorporates an in-system retention test method. The system includes a mainboard substrate 102 that mounts a controller component "C", DRAM memory components "M", and a non-volatile Flash memory component "F". The DRAM and Flash memory components "M" and "F" can be attached to a second "module" substrate 104, or may be attached to the mainboard substrate 102 directly. The module substrate 104 may include dual inline memory module (DIMM) or small outline DIMM (SO-DIMM) assemblies, or may also include more compact package assemblies, such as integrated packages with multiple stacked dies and/or stacked package assemblies like so-called package-on-package "POP" configurations.

In an embodiment, the memory components M contain a test, analysis and repair mechanism that enables the substitution of storage cells with marginal or failing retention times with spare storage cells having nominal or enhanced retention times.

As explained in further detail below, in some embodiments, a remapping address is stored in a content-addressable-memory (CAM) block inside corresponding mat blocks. Each mat block on each memory component M has a plurality of mats, with each mat including a plurality of memory cells. As described in fuller detail later, in some embodiments, a given memory component M may have mat blocks with extra rows for background retention test operations. In other embodiments, a given memory component M may have extra mat blocks for bit-level repairs using remapping information in the form of, for example, tag entries and/or CAM entries.

In several embodiments, the remapping information is loaded into the DRAM when it is initially powered up. In such embodiments, the non-volatile memory component F, which contains this remapping information, transfers the information to the DRAM memory components M as one of the steps during initialization. In one system configuration shown in FIG. 1, this transfer is completed on a private bus (e.g., sideband bus 110) connecting the nonvolatile component F and the DRAM components M. In other embodiments described more fully below, other configurations are used to facilitate the transfer of the remapping information between the nonvolatile and volatile memory components.

The basic remapping method noted above is often sufficient to resolve retention problems that are detected at the time the DRAM component is manufactured. Nonetheless, to address retention time degradation problems in a DRAM component after it has operated for a period of time, a dynamic method of performing retention testing, including updating the remapping information is now described.

One way to accomplish the dynamic retention testing and remapping information updating noted above is by adding additional rows of storage cells to selected mat blocks. According to the present embodiments, the additional rows allow background retention tests to be performed when the DRAM components are placed into self-refresh mode. It is also possible to perform these background retention tests during normal operation.

After the retention tests are performed, it may be necessary to add or update the addresses of any marginally passing or failing cells to the remapping information. In some embodiments, this is accomplished by a maintenance process, which performs this transfer across the private bus between the volatile and nonvolatile components in FIG. 1. The maintenance process can also update the remapping information inside the DRAM component so that the system can benefit sooner from the replacement of storage cells with marginal retention time. More specifically, during the initialization phase, the remapping information is transferred from the nonvolatile component to the DRAM components. During the maintenance phase, new remapping information may result from the retention testing, and the new remapping information is updated to the nonvolatile and DRAM components.

DRAM Component Overview

FIGS. 2A-2E illustrate an overview of one embodiment of an integrated circuit (IC) memory device in the form of a DRAM component. The DRAM component implements a retention test method that involves row swapping for dynamic error correction. For purposes of clarity, the DRAM component is illustrated and described at a high-level, and corresponds to the DRAM component M of FIG. 1.

Figure 2A:
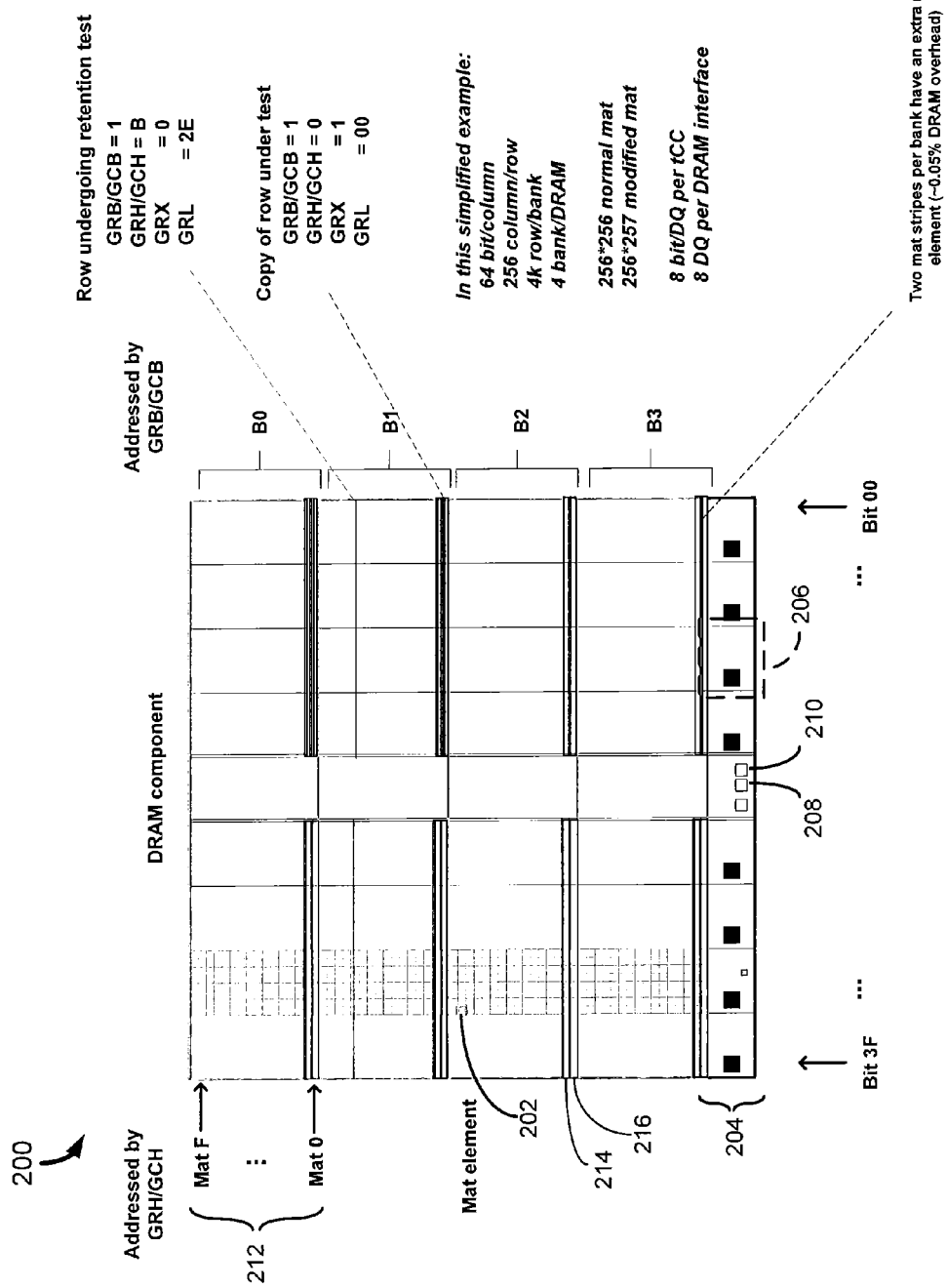
Figure 2B:
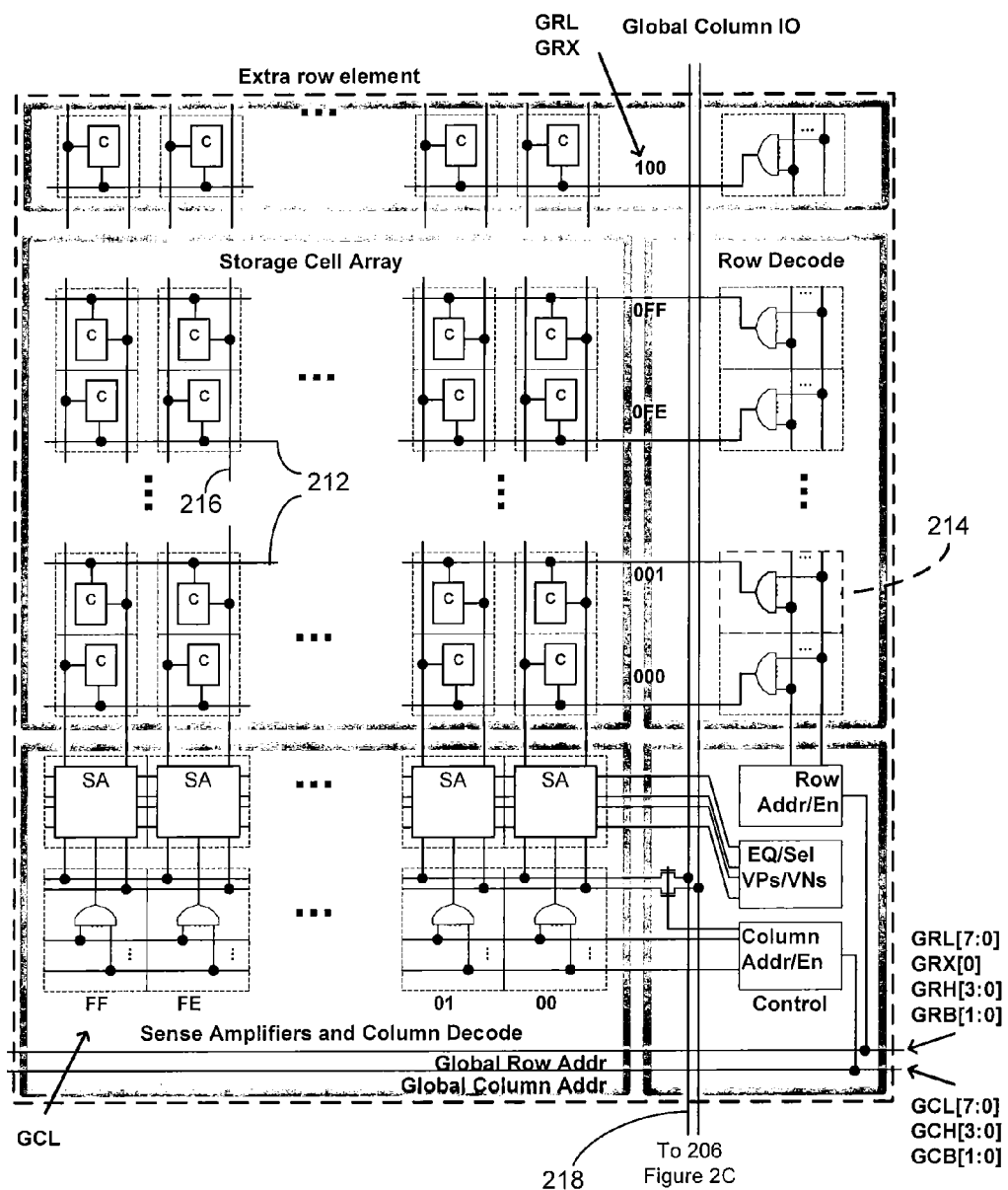
Figure 2C:
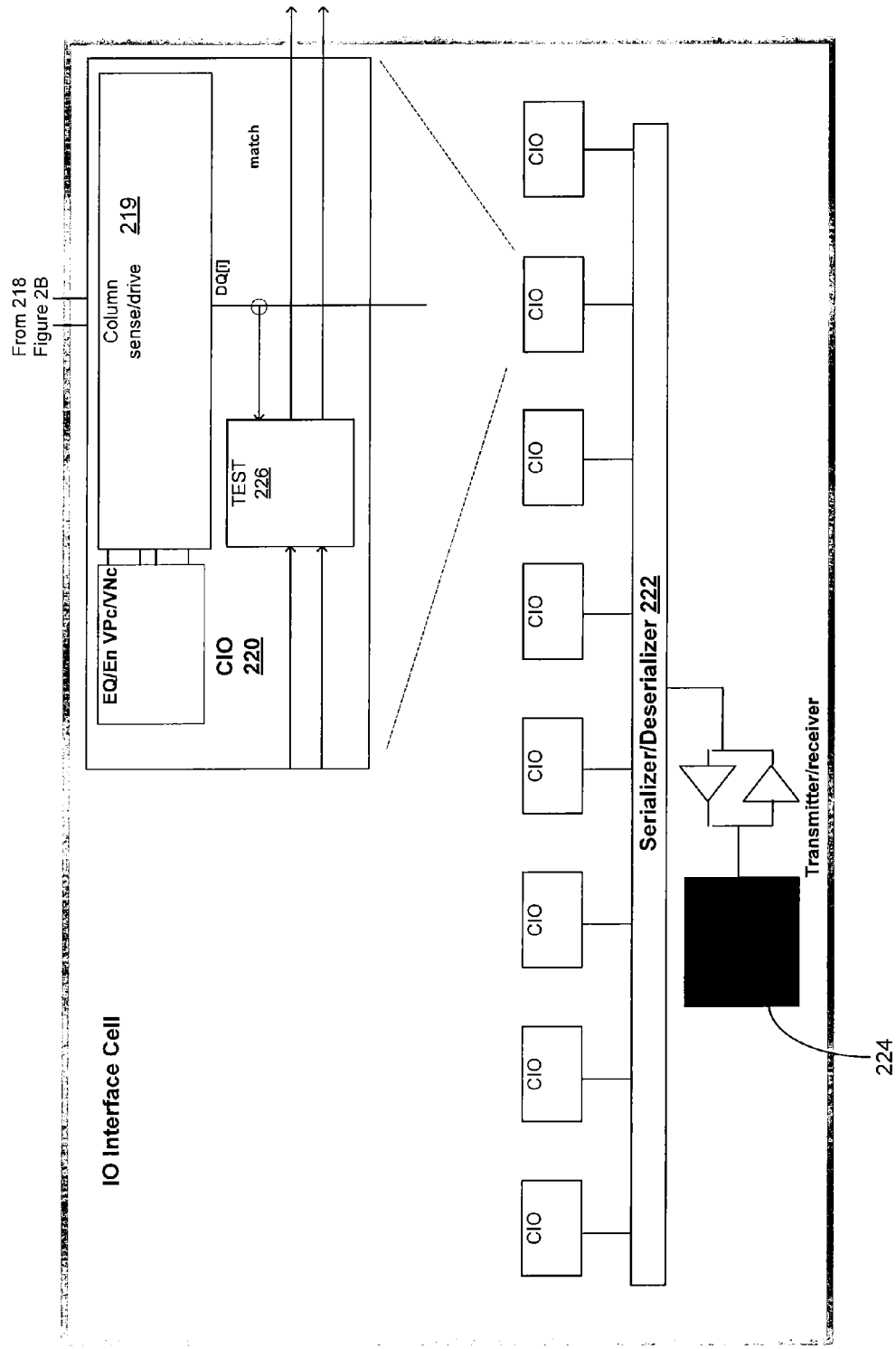

FIG. 2A illustrates a plan view of the entire DRAM component, generally designated 200. The DRAM component in this example includes four banks B0-B3 that are organized into an array of 64×64 mat blocks (4096 total) 202. FIG. 2B illustrates one specific embodiment of a mat block. The DRAM component 202 also includes an input/output (I/O) interface 204 that employs a strip of I/O interface cells 206. FIGS. 2C-2E illustrate further details of specific embodiments relating to an interface cell. Hardware in the form of a self-refresh sequence state machine 208 and a retention test sequence state machine 210 reside in the strip of I/O cells. Specific embodiments of the respective state machines are shown in FIG. 3.

Further referring to FIG. 2A, in accordance with the present embodiments, each bank of a DRAM contains multiple mat stripes 212, with two mat stripes (such as 214 and 216) having an additional row of storage cells for retention testing. For example, one embodiment that has 30 mat stripes would have 16 mat stripes with the additional row per bank, and the other 14 mat stripes without this additional row. In these embodiments that have 4K rows per bank, the additional rows represent an additional 0.05% increase in the row count.

Referring now to FIG. 2B, in one specific embodiment, each mat includes a 256×256 array of storage cells "c" arranged in rows and columns. As noted above, in one embodiment, two of the mat rows in each of the four banks B0-B3 have an extra row added. The two extra mat rows are located below fourteen typical mat rows in each of the four banks. Each mat having the added rows also receives an extra row address signal "GRX" which provides row access.

The eight extra rows in the DRAM are added to the 16,384 rows already present, increasing the height of the DRAM component by about 0.05%.

Further referring to FIG. 2B, each storage cell "c" includes a capacitor element (not shown) and an access transistor element (not shown). The storage cells "c" are connected to horizontal word line paths 212 driven by row decoders 214. Each row decoder 214 uses global row address signals "GRL" to assert one (or none) of the 256 word lines to access the associated 256 storage cells connected to that line.

The charge in the 256 accessed storage cells is dumped onto vertical bit lines 216 and amplified by sense amplifier cells SA. One of the 256 sense amplifiers is selected by a global column address signal "GCL", and this sense amplifier is coupled to global column IO paths 218 routed vertically through the mat.

Referring now to FIG. 2C, the "global column IO" path 218 connects to a column sense/drive circuit 219 in a column I/O (CIO) interface cell 220. The global column IO signals are aggregated by a serializer/deserializer 222 and (in this example) transmitted or received at a bit rate at a data pad 224 that is 8× a column access bit rate.

In any row access cycle, a horizontal row of 64 mat cells (out of 4096 total) will each assert one of their 256 word lines so that a row of 256 storage cells are placed into the associated 256 sense amplifiers. The other 4032 mat cells will need to inhibit their word lines. This is accomplished with respective global row high "GRH" and an associated bank address signal "GRB". The 4096 mats are organized into the four independent banks B0-B3, with each bank having 16 horizontal groups of 64 mats. The bank address signals "GRB" select one of the four banks, and the global row high signals "GRH" select one of the 16 horizontal groups of mats in that bank.

In any column access cycle, a row of 64 mat cells (out of 4096 total) will each couple one sense amplifier SA (of the 256 total) onto the 64 global column IO signal paths, to be serialized/deserialized onto eight data IO pads 224. The other 4032 mat cells inhibit their global column IO access devices. This is accomplished with respective global column and bank address signals "GCH" and "GCB". The 4096 mats are organized into four independent banks, with each bank including 16 horizontal groups of 64 mats. The bank address signals "GCB" select one of the four banks, and the column address signals "GCH" select one of the 16 horizontal groups of mats in that bank.

Note that the global column address signals "GCH" match the global row address signals "GRH" that have been previously asserted for the corresponding bank address "GCB/GRB". In other words, a column of a mat can only be accessed if it has been previously sensed with a row access. In some embodiments, the GCB and GCH signals are auto-generated during the column access by looking up the GRB and GRH values that were stored during the row access (this will be described in connection with FIG. 4).

Further referring to FIG. 2C, a "TEST" block 226 is provided in the "CIO" cell 220 that couples to the global column IO paths 218 running through each column of mats. Further detail pertaining to the TEST block 226 is shown in FIG. 2D. The TEST block 226 employs two registers 228 and 230 for storing column data from two different rows. In aggregate, the 64 TEST blocks or cells can store two 64-bit words of column data. A pair of control signals "EN8" and "EN9" cause each of the two 64-bit registers 228 and 230 to be loaded. There is also an array of 64 XNOR gates 232 which can compare these two 64-bit column words to see if they match or don't match. In the simplest embodiment, each XNOR gate is logically ANDed by an AND gate 234 with an input match signal "match(i)", which becomes an output match signal "match(o)" passed to a TEST-MAIN block 236 (FIG. 2E). In a practical embodiment, a look-ahead circuit would be added to the AND chain so that the worst case delay is reduced from 64 AND delays to about 6-to-8 AND delays.

In one embodiment, the contents of one of the 64-bit registers 228 or 230 may be driven onto the global column IO paths 218 and written into a column location in one of the currently accessed rows. A control signal "EN10" is used to enable this functionality.

Additionally, if the two one-bit values in the TEST block 226 don't match, and if all of the TEST blocks to the left of it do match, then a bit index (0-63) of that TEST block is driven onto the "bit" signal paths. In this way, when there are one or more mismatches, the leftmost bit position that mismatches will be transferred to the right. It is expected that a mismatch will be a relatively rare event, and there will normally be a maximum of one bit index to record per row.

Referring to FIG. 2E, the "TEST-MAIN" block 236 receives the "bit" and output match signals "match(o)" from the 64 TEST blocks 226. Note that in FIG. 2A, the TEST-MAN block is located in the center of the strip of IO interface cells, and will receive "bit" and "match" signals from the left and right halves of the DRAM component 200. It will merge the two "match" signals by logically ANDing them, and will merge the two "bit" index values by using the one whose match value is not HIGH.

Referring back to FIG. 2E, the TEST-MAIN block 236 includes a match register 238 and a bit register 240. The registers are loaded by a control signal EN6, and are set to an initial value of HIGH by a further control signal EN7. The matching operation is performed across an entire row of data (256 of the 64-bit column words), such that the "bit" and "match" signals are generated on each of the 256 column compare operations and merged into final values "BIT" and "MATCH".

As noted above, the strip of interface cells 204 (FIG. 2A) contains two finite state machines 208 and 210 to carry out a self-refresh sequence and a retention test sequence. These finite state machines also create the various control or enable signals shown in FIGS. 2A-2E and described above. The I/O strip 204 also includes a block of logic (not shown) that receives command/control/address (CA) signals used for normal operation. This block of logic creates the row and column addresses needed to access the mats for both normal operation and for the self-refresh and retention test modes of operation.

Retention Test—Row Swapping Operation

Before describing the detailed structure and functional aspects of the self-refresh and retention test state machines, a brief overview of a first retention test method is now provided. This method is described more fully below in the description corresponding to FIGS. 3-8. Hereinafter, the first method is also referred to as "the retention test method."

Figure 4:
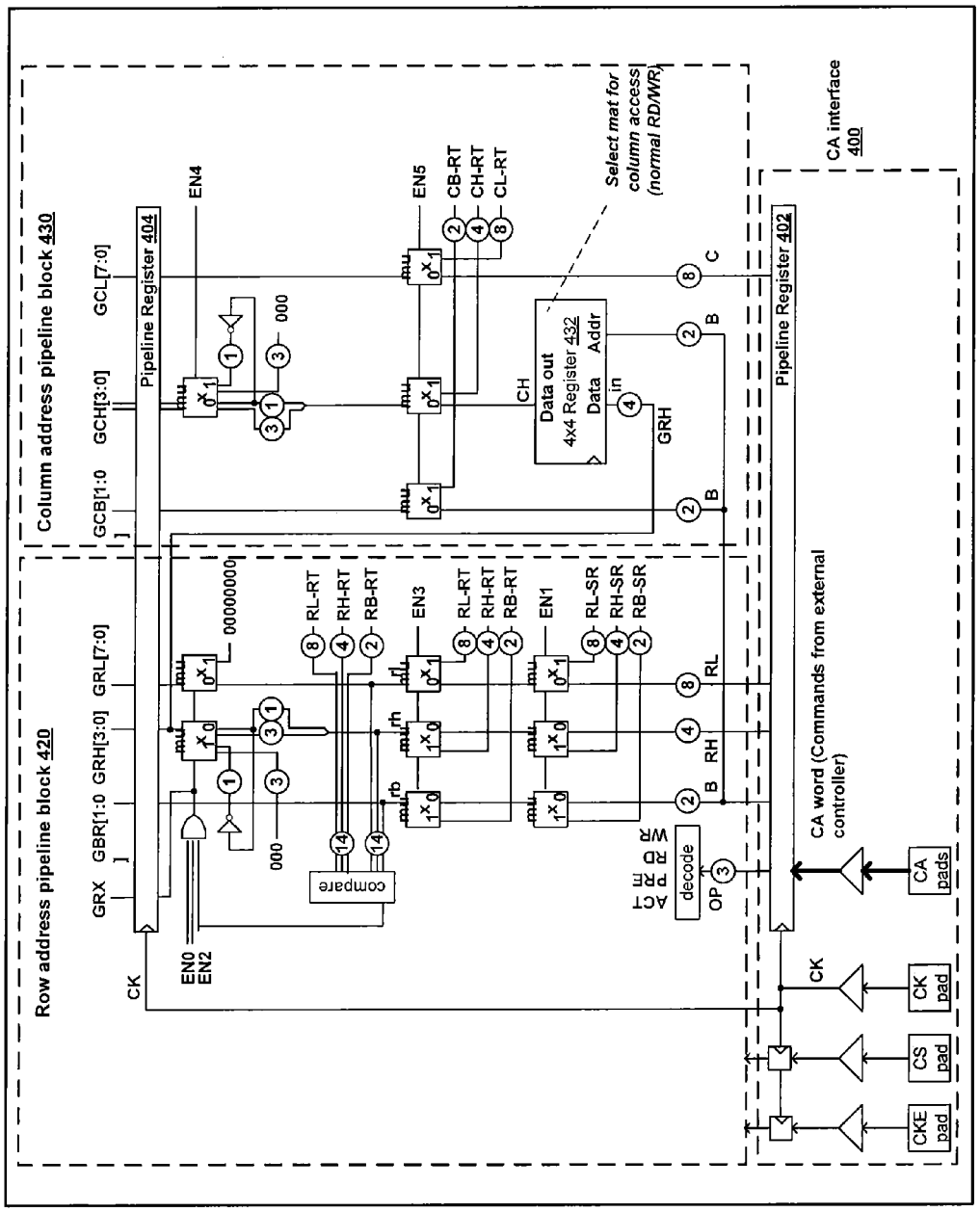
FIG. 4 illustrates a CA interface block, a row address pipeline block and a column address pipeline block that interact with the two finite state machines of FIG. 3, according to some embodiments.

During self-refresh, the self-refresh state machine 310 (FIG. 3) copies the row undergoing retention test into one of the two extra rows associated with the mat stripes. During self-refresh, the original row is not refreshed, but the copy in the extra row is refreshed. After a programmed amount of time (the timing example of FIG. 4 shows an example of the longest interval of ~16 seconds), the original row is compared to the copy. If a bit doesn't match (out of 16 kb per row), the bit becomes a candidate for adding to the weak bit list for repair/correction.

Optionally, the complement of the copy may be written back to the original row and the test repeated (so every cell is tested while retaining both a zero and a one). This refinement is not explicitly shown in the timing diagrams, but could be added with relatively small effort.

Another alternative is to store one or more algorithmically-generated patterns into the row under test (the extra row would still contain a copy of the row under test). This would result in slight modifications to the retention test in the match/restore/copy sequences in FIGS. 6, 7, and 8.

Once the retention test is complete for the row, the copy is written back to the original row, and the next row is tested. This continues until every row in the DRAM has been tested.

Following test, the match results (and a list of weak storage cell addresses) are held in a local storage area in the DRAM. A state machine can update a local tag array for the DRAM (for repair/correction), and can use an I$^2$C interface between the DRAM and the external flash memory to update the external flash memory containing the primary tag array (for loading at the next initialization).

In one embodiment, the extended retention time interval used for checking each row can be adjusted over a wide range. This allows the state machine to start with relatively short intervals, and incrementally increase the intervals until failures begin to occur. For example, assuming an 8 Gb DRAM with 1 kB rows, it will take approximately 9 hours to test the device using a 128 ms second retention interval on all 10^6 rows. A 1.0s retention time test would require about 3 days. The retention test time is proportional to the length of the retention interval and to the number of rows in the DRAM component. The retention test time could be reduced by testing more than one row at a time. This would involve multiple copies of the 14-bit compare logic shown in FIG. 3.

One aspect of this method is that the retention test can be interrupted at any point without adding to the exit latency of the self-refresh operations. This is accomplished with compare logic shown in FIG. 4. When the DRAM exits self-refresh and enters a normal operating mode, it uses the extra row (with the copied data) whenever the row undergoing retention test is referenced. This is carried out because the data in the row undergoing retention test has possibly been corrupted. This feature prevents the exit latency of self-refresh from increasing by about 2.6 us (the time needed to perform about 512 column operations) when the copied row is restored back to the row undergoing retention test.

It would be possible to carry out the retention test during normal operation using logic already present in the DRAM for retention test during self-refresh. However, once it is time to restore one row and copy another, about 7.8 us worth of transactions would need to be scheduled by the memory controller during normal transactions, impacting the performance of the running application. This would occur once during each extended retention time interval, so it would not impact average system bandwidth, but it could impact real-time applications.

A performance cost of this method (in addition to the extra rows) according to an embodiment, may be a small increase in the pipeline latency in a command/address decode path, shown in FIG. 4. The largest incremental delay is in the row address path due to the comparing of the bank and row fields for an activate operation. This may add about a half dozen gate delays, probably adding another CK cycle of pipeline delay of the CA input path for the activate operation (this will increase the tRCD time). There will be a much smaller amount of delay in the column address path, essentially one multiplexer of incremental gate delay.

Retention Test—Row Swapping—Constraints

A constraint, according to an embodiment, is that the retention test method should (ideally) not impact the performance of normal operations of the DRAM. This means that retention test should not reduce the available transaction bandwidth, and should not add to the latency of transactions. This is accomplished with the first retention test method by operating it during self-refresh. Self-refresh is an operating mode in which no external accesses are performed; the DRAM simply maintains the contents of its storage cells. While the storage cells are maintained, storage cell retention time is also tested in parallel, one row at a time. The address of cells with inadequate retention time are recorded and replaced by spare storage elements with a repair method.

If this constraint is relaxed; i.e. if it is permissible for the retention test process to interfere with accesses from an external controller, then the retention test can be performed any time the DRAM is powered up, including periods in which normal read and write accesses are being made to the DRAM. This is possible because while the retention test is performed on a particular row, all read and write accesses to that row are instead directed to a copy of that row.

For this mode of operation, it may be advantageous to use a known pattern (or patterns) in the row undergoing retention test. That means the "match" sequence no longer needs to compare the row undergoing test and the copy of the row. Instead the "match" sequence will simply compare the row undergoing retention test with the known pattern. The copy of the row undergoing retention test will be available for normal read and write accesses.

The only part of the retention test that will impact normal read and write accesses are the "restore" and "copy" sequences, since it will be necessary to perform column accesses to live data in one of the two rows (in the row undergoing retention test in the case of "copy", and in the copy of the row undergoing retention test in the case of "restore").

If a worst case incremental access delay of up to about 7.8 us can be tolerated by the controller, then it's simply a matter of scheduling the Match/Restore/Copy-next sequences (described in FIGS. 6, 7, and 8) while holding off all external accesses.

If this incremental access delay can't be tolerated, then the Match/Restore/Copy-next sequences will need to be broken into individual column operations, and the controller will need to hold off accesses to the row undergoing retention test (but allow accesses to all other rows). The worst case access incremental access delay to the row undergoing retention test will be 7.8 us (as before), but the worst case incremental access delay to the other rows will be a tRC interval (about 50 ns).

A final alternative is to allow the "restore" and "copy" sequences to be interrupted in the middle of the 512 column operations. This will allow a normal read or write access to be made to the live data (in the row undergoing retention test during the "copy" sequence, and in the copy of the row undergoing retention test during the "restore" sequence). Since the live data changes, it will be necessary for the retention test state machine to restart the "copy" or "restore" sequence at the beginning, but this will probably be an acceptable tradeoff. The benefit of this is that the worst case incremental access delay to all rows (including the live data in the row undergoing retention test) will be a tRC interval (about 50 ns).

Another important constraint that is addressed by the first retention test method is the need to incorporate testing margin in the retention test. When the retention time parameter of a DRAM is checked during the manufacturing process, the supply voltage, temperature, and refresh interval can all be set to the worst case values (plus test margin). This is possible because the DRAM contains algorithmically-generated test patterns during these tests, and there is no problem if the data being held in storage cells is lost.

In a system that is under operation, the data in the DRAM is live, and it must be held reliably during a background test process. A system that is under operation will also have supply voltage, temperature and refresh interval that is not at the worst case values (plus test margin).

The first retention test method handles this issue by making a copy of the row under test in one of the extra rows, and incorporating this extra row in the normal refresh list. The row under test can now be subjected to a longer refresh interval, requiring a longer retention time in the storage cells in the row.

This longer refresh interval will compensate for the supply voltage and temperature which are not necessarily at their worst case values. In this way, storage cells with marginal (but not failing retention times can be detected and replaced before they become an issue for system reliability.

Self-Refresh State Machine (SR-FSM)

FIG. 3 illustrates specific embodiments of self-refresh and retention test finite state machines 310 and 320. The self-refresh finite state machine (SR-FSM) 310 is coupled to a retention test finite state machine (RT-FSM) 320. The SR-FSM 310 includes four registers "T-SR", "RB-SR", "RH-SR", and "RL-SR". The registers "RB-SR", "RH-SR", and "RL-SR" respectively generate 2-bit, 4-bit, and 8-bit row addresses needed during self-refresh. Each 14-bit combination specifies one row of the 16,384 rows (each with 16,384 bits). This 14-bit value is incremented by an "INC0" control signal generated by the SR-FSM 312. For purposes of discussion herein, "self-refresh" is an operating mode which maintains the states of all storage cells on the DRAM, but does not permit normal read and write accesses to the DRAM storage cells through the interface.

The SR-FSM 312 generates control signals EN0 and EN1, which generate row address signals during self-refresh (see FIG. 4 below). The SR-FSM 312 also generates a set of handshake signals "StartMatch", "StartRestore" and "StartCopy" to coordinate the retention test. The SR-FSM also receives a further set of handshake signals "DoneMatch", "DoneRestore" and "DoneCopy" as part of this coordination process. Finally, the SR-FSM 312 generates a clock enable signal "EN2" for an oscillator "CK-RT" used during the retention test so that power associated with the oscillator CK-RT is not consumed when various sequences of the retention test (e.g., match, restore, or copy) are not operating.

The 14-bit registers "RB-SR", "RH-SR", and "RL-SR" are clocked by an oscillator "CK-SR". The oscillator "CK-SR" generates the proper clock source to ensure that all storage cells of the DRAM are refreshed every tREF interval. The tREF interval is compensated for the current junction temperature and supply voltage of the DRAM.

The register "T-SR" takes the form of an 8-bit timer that increments each time the 14-bit registers "RB-SR", "RH-SR", and "RL-SR" overflow. The timer "T-SR" permits a single row in the DRAM to be given a tREF interval that is a multiple (1× to 253×) of the tREF value being used by the other rows during self-refresh. A copy of the test row is made and held in a spare row. The spare row is included in the rows covered by self-refresh, so the data is maintained reliably.

The timer register "T-SR" can be set to time intervals that are longer than the maximum value that is appropriate for the current temperature and supply voltage. This may detect weak storage cells—storage cells whose retention time has degraded since manufacture. Each one of the 16 kbits of the row under test will be checked against the 16 kbits that were copied (and maintained) in the spare row at the end of the extended tREF interval.

A particular extended tREF value may be used to check every row in the DRAM. If there are no mismatches, indicating no weak cells, the tREF value can be increased by increasing the timer register "T-SR" counting range and repeating the retention test on all rows again.

In some embodiments, a nominal value for tREF during self-refresh is 64 ms. If it is assumed that there are a million rows in the DRAM (e.g., an 8 Gb DRAM with 1 kB rows), then the approximate time needed for a retention test on every bit in the DRAM in self-refresh mode is listed in Table 1.

TABLE 1

| Retention time | Retention-test duration |
| --- | --- |
| 64 ms | 4.5 hours |
| 128 ms | 9 hours |
| 256 ms | 18 hours |
| 512 ms | 36 hours |
| 1 s | 3 days |
| 2 s | 6 days |
| 4 s | 12 days |
| 8 s | 24 days |
| 16 s | 48 days |

Note that the exemplary DRAM illustrated in FIGS. 2A-2E only has 256 Mb worth of storage cells and 2 kB rows, so the exemplary DRAM would finish its retention tests about 64 times faster than the time listed in Table 1. The duration of the retention test is proportional to the number of rows in the DRAM and to the retention time being tested.

Retention Test State Machine (RT-FSM)

With continued reference to FIG. 3, the retention test finite state machine "RT-FSM" 320 includes six registers "RB-RT", "RH-RT", "RL-RT", "CY-RT", "CL-RT", and "CX-RT". The first three registers "RB-RT", "RH-RT", and "RL-RT" respectively generate 2-bit, 4-bit, and 8-bit row address of the row that is currently undergoing retention test. Each 14-bit combination specifies one row of the 16,384 rows (each with 16,384 bits). This 14-bit value is incremented by a control signal "INC2" generated by the SR-FSM 312. The registers "RB-RT", "RH-RT", and "RL-RT" are clocked by the clock "CK-SR", similar to the registers "RB-SR", "RH-SR" and "RL-SR" in the SR-FSM 310.

The registers "CY-RT", "CL-RT", and "CX-RT" are clocked by the retention clock "CK-RT", which is separately generated from the self-refresh clock "CK-SR". The retention clock CK-RT runs much faster than the self-refresh clock CK-SR. In one embodiment, the retention clock CK-RT runs at an approximate frequency of 200 MHz, and the self-refresh clock CK-SR runs at only about 1 MHz. The retention clock CK-RT is used for manipulating the individual column words (e.g., 64b each) of the row undergoing retention test. As previously described, the copy of this row is held in one of the extra rows. The retention clock "CK-RT" rate should not be faster than the 1/tCC column cycle rate parameter of the DRAM, but it can be slower. For example, the retention clock "CK-RT" might generate a clock with a nominal cycle time of 7.5 ns, which has a minimum/maximum range of 5.0 ns/10.0 ns.

As mentioned above, the SR-FSM 312 generates the clock enable signal "EN12" which turns the retention clock "CK-RT" on and off. When the clock is stable, the SR-FSM 312 generates a set of handshake signals ("StartMatch", "StartRestore", "StartCopy") for the RT-FSM 322 to initiate the three phases ("match," restore", or "copy") of the retention test. The RT-FSM 322 returns a set of handshake signals ("DoneMatch", "DoneRestore", "DoneCopy") to indicate when each phase is complete. Alternatively, a single "Start/Done" handshake pair may be used, and the RT-FSM 322 may step through the three phases sequentially.

The register "CL-RT" register generates the 8-bit column address needed to access the 256 64-bit-column-words in each row. The register "CX-RT" register, in an embodiment, is a single-bit register, which allows the RT-FSM 322 to alternate between column access operations in the two open rows. This allows two rows to be compared one column at a time, or allows one row to be written to another one column at a time. The register "CY-RT" is a single bit register, and gives the RT-FSM 322 additional states to allow the necessary row access operations to be performed (e.g., two row activate operations and two row precharge operations).

The RT-FSM 322 generates control signals EN2, EN3, EN4, EN5, EN6, EN7, EN8, EN9, EN10, and EN11 which are used for generating row address and column address signals during the retention test. Exemplary embodiments that utilize these control signals are illustrated in throughout this disclosure including, for example, FIGS. 2 and 4.

The RT-FSM 320 also includes a storage element 326 to record the address of a weak storage cell that is detected during the retention test. The address includes address components "RB-RT", "RH-RT", and "RL-RT" (the row address of the row undergoing retention rest), plus "CL-RT" (the column address of the column words in the two rows being compared), plus "BIT" (the six-bit address within the 64-bit-column-word).

The recorded address can then be transferred to an external storage element (e.g., an external Flash memory component) via a serial connection interface such as $I^2C$. This external non-volatile storage element is used at initialization time to load the local tag memory of the DRAM for the error correction/repair method that has been implemented.

The recorded address can also be used to immediately update the local tag memory used for DRAM repair so that the weak cell will not show up in subsequent retention tests.

CA Interface Block

Now referring to FIG. 4, a CA interface 400 is illustrated that converts the commands (e.g., op command/control/address information) received on the CA interface into the row addresses ("GRX", "GRB", "GRH" and "GRL") and column addresses ("GCB", "GCH" and "GCL") used to access the mat array in the DRAM. The CA interface 400 also includes logic circuitry that merges the self-refresh addresses ("RB-SR", "RH-SR", and "RL-SR") and the retention-test addresses ("RB-RT", "RH-RT", "RL-RT", "CB-RT", "CH-RT", and "CL-RT").

This logic circuitry is shown in between two pipeline registers 402 and 404 which are clocked by the interface clock signal "CK". Because the self-refresh and retention-test signals are generated in different clock domain ("CK-SR" and "CK-RT", respectively), and because these operating modes are not latency-sensitive, in some embodiments, it may be desirable to merge them into the address pipeline at a later point, allowing the CA latency of normal transactions to be optimized. However, for simplicity, the logic circuitry is shown merged into the first address pipeline stage in the embodiment shown in FIG. 4.

Row Address Pipeline

A row address pipeline block 420 is illustrated on the upper-left side of FIG. 4. It begins by extracting fields "B", "RH", and "RL" from a received CA word for an activate ("ACT") command. These fields are respectively 2 bits, 4 bits, and 8 bits in width according to one embodiment. If self-refresh is being performed, then the self-refresh addresses ("RB-SR", "RH-SR", and "RL-SR") are merged in by asserting the control signal "EN1". If retention-test is being performed, then the retention-test addresses ("RB-RT", "RH-RT", "RL-RT") are merged in by asserting the control signal "EN3".

At this point, the 14-bit modified row address fields ("rb", "rh", "rl") are compared to the 14-bit retention-test addresses ("RB-RT", "RH-RT", "RL-RT"). If they match, and if the control signals "EN0" and "EN2" are both asserted, then the "rh[3:0]" field is replaced with "000q" (where "q" is the complement of "rh[0]"), and "rl[7:0]" is replaced with "00000000". Otherwise, rh[3:0] and rl[7:0] remain unchanged and "rb[1:0]" is unmodified. The states of the fields "rb[1:0]", "rh[3:0]", and "rl[7:0]" are registered and are used to drive the global row address signals ("GRB", "GRH" and "GRL"). The extra global row address signal "GRX" is asserted if the 14-bit compare results in a match and the control signals "EN0" and "EN2" are both asserted.

Note that the final address GRH[3:0] is stored in a 4×4 register 432 indexed by the bank address. More details of the 4×4 register 432 are described with regard to the column address pipeline block 430 below.

The above comparison step checks if the row address to be accessed is the row undergoing retention test. If so, the address of the extra row is substituted. If the retention-test row address is one of the eight odd mats of the bank, then the extra row in mat[0] is used. If the retention-test row address is one of the eight even mats of the bank, then the extra row in mat[1] is used. This ensures that there will be no change in the bank interference rate when normal operation is resumed, since the extra row is in the same bank as the row undergoing retention-test. Further, the retention-test row and extra row are in different mats of the same bank, so it is possible to have them both open for performing column-by-column matching, restoring, and copying with higher efficiency.

Column Address Pipeline

A column address pipeline block 430 is illustrated on the upper-right side of FIG. 4. It begins by extracting the "B" and "C" fields from the received CA word for a read or write ("RD" or "WR") command. These fields are respectively 2 bits and 8 bits in width in this embodiment. Note that on the previously-described activate command ("ACT"), which accesses the row of this bank, the "GRH" field is retained in the 4×4 register 432. This "GRH" value is accessed by using the "B" bank address as an index, and is used to form a "CH" field for the read or write command. This "CH" field is needed to select the appropriate mat row within the bank for performing the column access.

In alternative embodiments, this mat-selection information can be retained further upstream in the address pipeline or even within the mat element. The retaining of the mat-selection information is shown explicitly at this first stage of the address pipeline in the exemplary embodiment of FIG. 4 for clarity.

The "CB", "CH", and "CL" fields from the received CA word and the 4×4 register 432 are replaced by the "CB-RT", "CH-RT", and "CL-RT" column addresses when the retention test is being performed. This occurs when the control signal "EN5" is asserted. Note that the column address "CL-RT" is transmitted from the register "CL-RT" in the RT-FSM 320, an embodiment of which is illustrated in FIG. 3. The column addresses "CB-RT" and "CH-RT" are transmitted from the row address registers "RB-RT" and "RH-RT" in the RT-FSM 320 as well.

In a final step, the column address "CH-RT" will be replaced by "000q" (where "q" is the complement of "CH-RT[0]") if the control signal "EN4" is asserted. This is needed for alternating between column addresses in the row undergoing retention test and the extra row in mat[0] or mat[1].

Self-Refresh (SR) Timing Sequence

Figure 5:
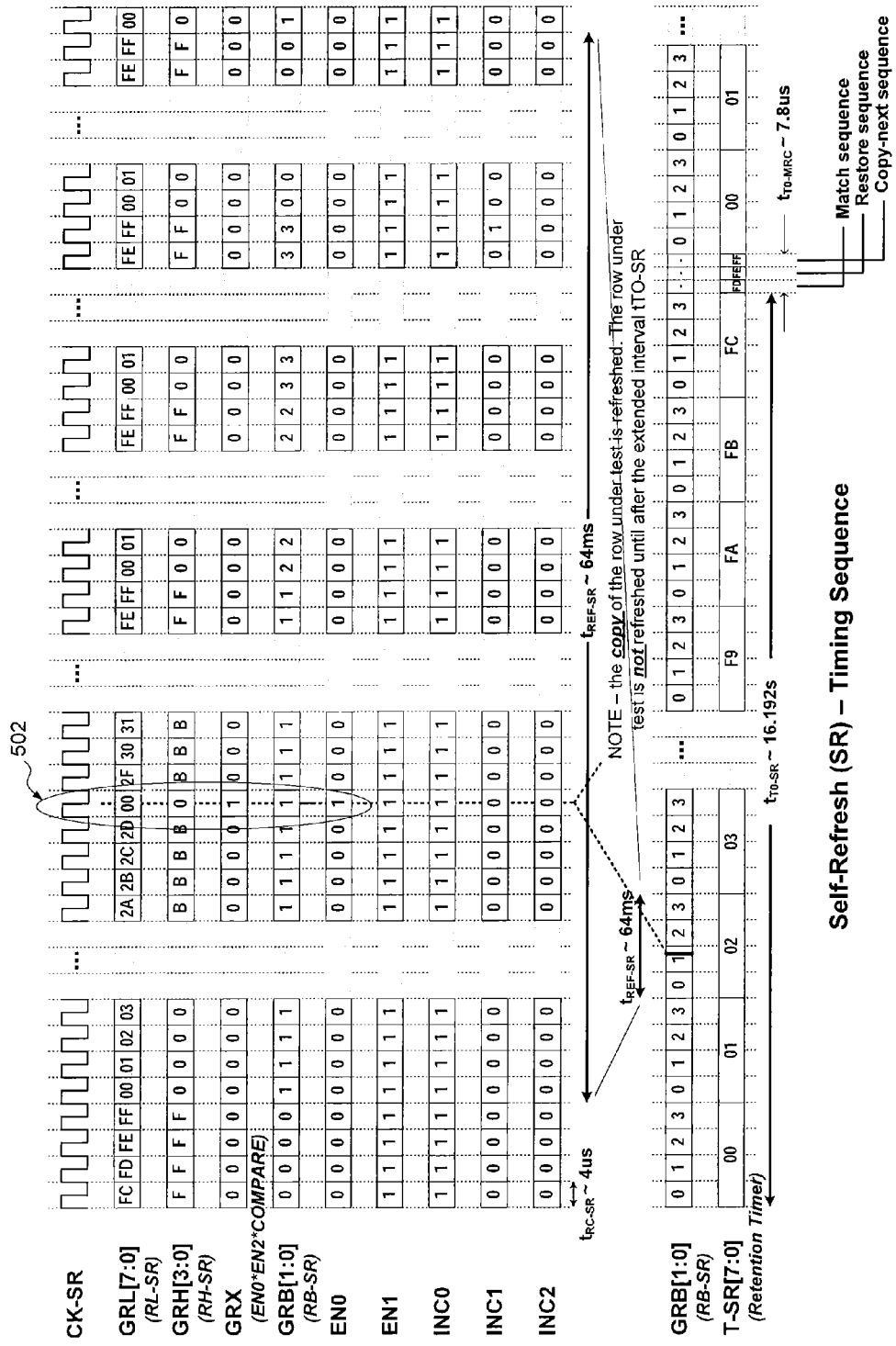
FIG. 5 illustrates an exemplary timing sequence for the self-refresh (SR) operation.

FIG. 5 shows an exemplary timing sequence for the self-refresh (SR) operation. An internal oscillator provides the "CK-SR" clock used by the associated circuitry. The frequency of this clock is typically in the range of 0.3-3 MHz. The frequency of the CK-SR satisfies the constraint:

$$f(CK\text{-}SR) > N(ROW)/tREF \qquad (1)$$

wherein N(ROW) is the total number of rows on the DRAM component (16,384 in this example) and tREF is the refresh interval for the DRAM (which is typically in the range of 16-128 ms). The tREF interval is a function of supply voltage and junction temperature. Typically, the internal oscillator is designed to adjust the tREF interval to reduce refresh power while still maintaining the tREF interval within the specification.

The self-refresh addresses ("RB-SR", "RH-SR", and "RL-SR") are steered from the associated registers in FIG. 3 onto the global row address signal paths ("GRB", "GRH" and "GRL") in FIG. 4. These 14 address bits count through the $2^{14}=16,384$ row addresses in the DRAM in a repeating fashion.

The single exception to this pattern is highlighted (where arrow 502 points at) in the timing diagram, and occurs when the "RB-SR[1:0]" value is "1", when the "RH-SR[3:0]" value is "B", and when the "RL-SR[7:0]" value is "2E". These values match the current value of the registers "RB-RT", "RH-RT", and "RL-RT" in FIG. 3, which specify the address of the row currently undergoing retention test. However, in this case, the address of the extra row is used.

Therefore, in the highlighted timing example pointed by arrow 502 in FIG. 4, the global row address signals "GRH [3:0]" are changed from "B" to "0", "GRL[7:0]" from "2E" to "00", and "GRX" from "0" to "1". The original contents of the row undergoing retention test had been previously copied to this extra row, and the self-refresh sequence continues to refresh it during the retention test interval.

The self-refresh state machine (e.g., logic 312 of FIG. 3) also generates the control signals "EN0", "EN1", "EN12", "INC0", "INC1", and "INC2". The values of some of these control signals are shown in the timing example.

Notably, according to some embodiments, the ten waveforms at the top of FIG. 5 show a timeframe of approximately 64 ms, which is the nominal value of tREF. Each row of the 16,384 rows is refreshed once in this interval. The two waveforms at the bottom of FIG. 5 show a larger timeframe of the self-refresh sequence. It shows a plurality of 64 ms tREF intervals (253 of them in the embodiment shown in FIG. 5) extending over an interval of about 16.192s. This represents the largest retention test interval ("tT0-SR") that is possible using this embodiment. Smaller retention test intervals can be programmed with the "T-SR" timer register; the range is 64 ms to 16.192s, in 64 ms increments. Of course, other embodiments can have different ranges with different increment granularity.

At the end of the retention test interval, when "T-SR[7:0]" reaches a value of "FC", the self-refresh state machine initiates three sequences in the retention test state machine (e.g., logic 322 of FIG. 3). The sequences are the "Match" sequence, the "Restore" sequence, and the "Copy-next" sequence. Each of these uses one state, namely "FD", "FE", and "FF," of the "T-SR[7:0]" register. Each sequence consumes a relatively short interval (about 2.6us in this embodiment), and each is described below with regard to FIGS. 6, 7, and 8.

The three handshake signals ("StartMatch", "StartRestore" and "StartCopy") are used to initiate each sequence. The self-refresh state machine (e.g., logic 312 of FIG. 3) receives a set of handshake signals ("DoneMatch", "DoneRestore" and "DoneCopy") which indicate that whether the state machine should advance to the next sequence. Alternatively, a single pair of handshake signals could be used, and the retention test state machine (e.g., logic 322 of FIG. 3) could perform all three sequences automatically.

When the three sequences have finished, the self-refresh state machine restarts with the next retention test interval, which is illustrated in the embodiment of FIG. 5 with the "T-SR[7:0]" register at a value of "00". If a shorter retention test interval is used, the initial T-SR[7:0]" may be adjusted to be larger (and closer to the final state value of "FC").

Finally, it should be noted that the self-refresh sequence can be interrupted at any point, with the last row address retained in self-refresh registers ("RB-SR", "RH-SR", and "RL-SR") in FIG. 3. Typically, a worst case self-refresh-exit latency of around 150 ns may be needed to complete the refresh operation in progress.

The addition of an ongoing retention test does not affect this worst case self-refresh-exit latency. This is because the row undergoing retention test has been copied to an extra row, and the 14-bit compare logic in FIG. 4 continues to substitute the row address even for normal transactions. However, it will be necessary to restart the retention test at the row value in "RB-RT", "RH-RT", and "RL-RT", since an unknown amount of time will have elapsed.

Retention Test (RT) Match Sequence

Ideally, every storage cell has a retention time greater than the tREF refresh interval. However, due to manufacturing error and other reasons, some cells will have less margin than the others. Further, the retention time of some cells may degrade over time. The purpose of the retention test is to identify those storage cells with the smallest retention margin and replace them to increase the reliability of the DRAM component.

Figure 6:
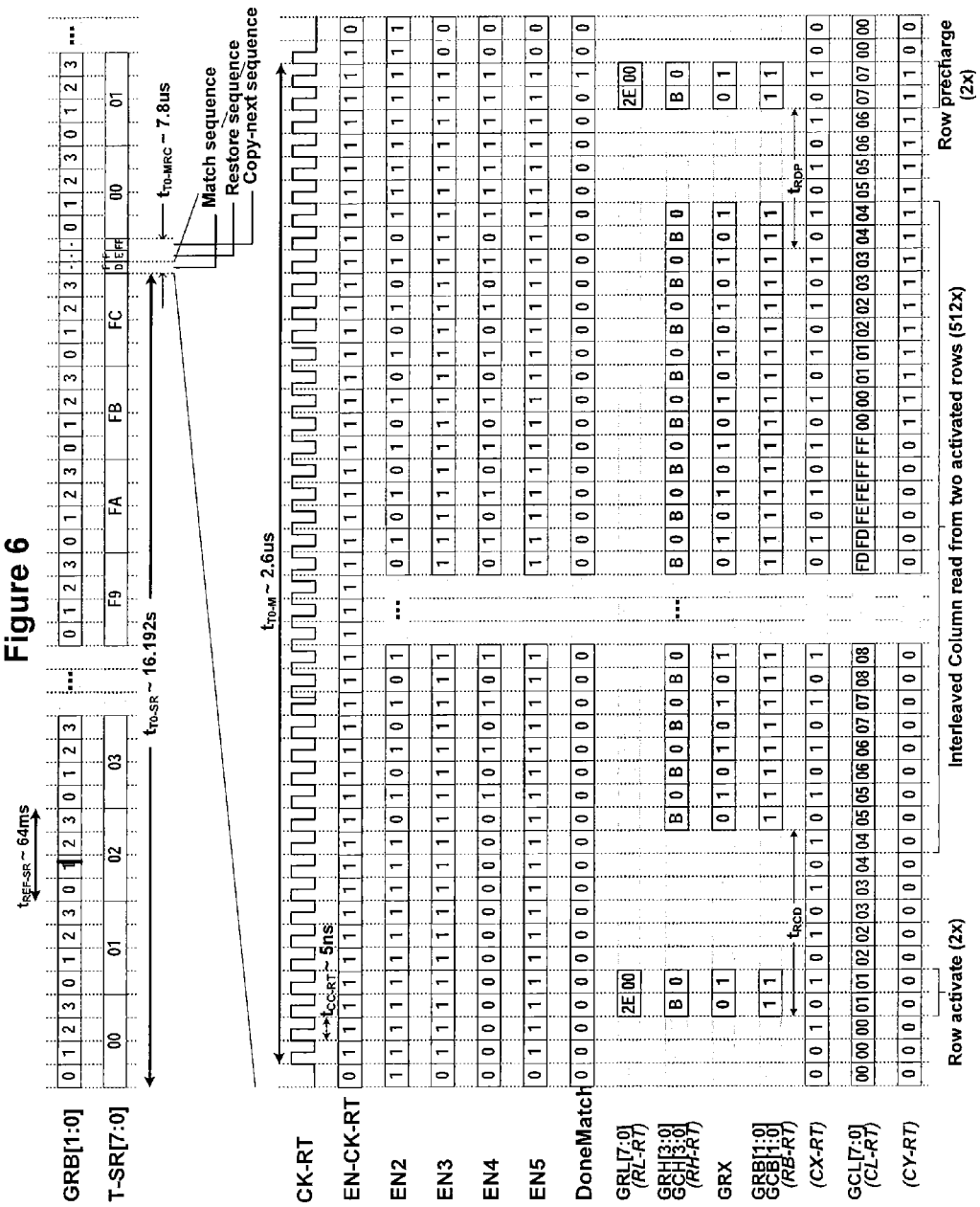
FIG. 6 illustrates an exemplary "match" sequence of the retention test.

FIG. 6 shows the details of the first of three sequences (Match, Restore, and Copy-Next) of the retention test described herein. For purposes of discussion herein, the Match sequence of the retention test is also referred to as the "first sequence;" the Restore sequence is also referred to as the "second sequence;" and, the Copy-Next sequence is also referred to as the "third sequence." Prior to this first sequence, the row undergoing test will have had its data copied to an extra row, and will have been excluded from self-refresh for a programmed interval (e.g., "tT0-SR" in FIG. 5).

The Match sequence starts when the retention clock "CK-RT" is enabled. This clock is much faster than the self-refresh clock "CK-SR". According to the present embodiments, the frequency of the retention clock CK-RT is close to the column cycle rate of around 200 Mhz (which represents a tCC cycle time of around 5 ns), although in some other embodiments the retention clock's speed is reduced by some amount so as to ensure an adequate margin under all operating conditions.

As noted above, the RT-FSM 322 generates a number of control signals for coordinating the generation of row and column addresses for the three processes. Relevant control signals are shown in the sequence in FIG. 6.

Also referring to FIGS. 4 and 5, the registers "CY-RT", "CL-RT", and "CX-RT" contain the state of the RT-FSM 322. In particular, the register "CL-RT" contains a column address value. Each of the three sequences accesses every column (256 64-bit column words per row) of the row undergoing retention test, and the extra row holds a copy of its value.

The Match sequence begins by issuing two activate ("ACT") commands to the row undergoing retention test, with the extra row holding a copy of its value. These rows are in the same bank (e.g., bank[1]), but are in different mats (e.g., mat[B] and mat[0]). This is ensured by using the complement of the least significant bit of the register "RH-RT[3:0]" in determining the extra register for the copy. There is an extra register in both mat[0] and in mat[1].

Because the two rows are in different mats, the row values are simultaneously accessible in the two sets of sense amplifiers via column operations. After an interval "tRCD" has elapsed, the column operation begins.

The first column address used is "CL-RT[05]". This is because the first eight states of the RT-FSM 322 are consumed by the activation operations. The order in which the columns are compared is not important. The column addresses progress until they reach to "CL-RT[FF]" and wrap around to "CL-RT[04]". The register "CY-RT" provides the additional state for this.

Each column address is used twice—once for reading a column from the row undergoing retention test, and once for reading a column from the extra row holding a copy. After the second column is read, the two 64-bit column words are compared with the logic in the "TEST" and "TEST-MAN" blocks in FIG. 2. If any bit is different, it is recorded as previously described, and the associated DRAM cell is eventually repaired with a spare storage resource.

Once all columns are compared, the retention test state machine 322 issues two precharge ("PRE") commands, which close the sense amplifiers in the row undergoing retention test and the extra row holding a copy of its value. Alternatively, if the RT-FSM 322 performs all three sequences automatically, it can leave the two rows open and simply start the second sequence. Note that the third sequence would involve a new pair of activation operations for this alternative embodiment, since the address of the row undergoing retention test would be changed.

Retention Test (RT) Restore Sequence

Figure 7:
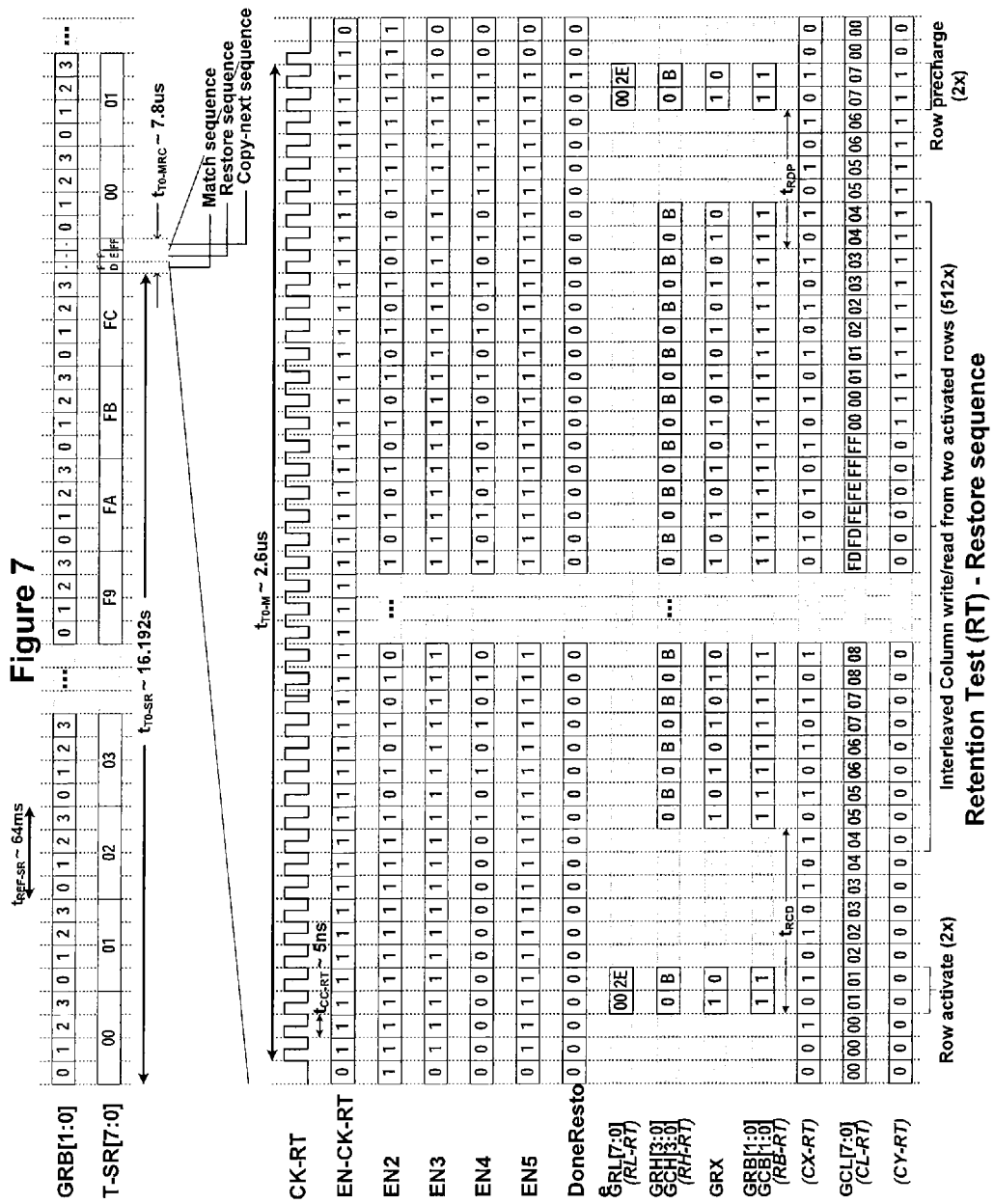
FIG. 7 illustrates an exemplary "restore" sequence of the retention test.

FIG. 7 shows the details of the second of three sequences (Match, Restore, and Copy-Next) of the retention test described herein. Prior to the first sequence, the row undergoing test will have had its data copied to an extra row, and will have been excluded from self-refresh for a programmed interval (e.g., "tT0-SR" in FIG. 5). The second sequence restores this copied data back to the original row undergoing the retention test. Alternatively, if no mismatch between the two rows is found in the first sequence from FIG. 6, this restore sequence may be skipped.

The restore sequence is almost identical to the match sequence of FIG. 6, except that each 64-bit column word is read from the extra row, and is written back to the corresponding column of the row undergoing the retention test. In the timing waveform shown in FIG. 6, these column operations are shown occurring with no gaps needed. Depending on different types of DRAM embodiments, it might be necessary to add a turnaround cycle between read/write and write/read transitions. This would require a second bit in the register "CX-RT", and would approximately double the time of the restore sequence (which would be about 5.1us according to some embodiments).

Retention Test (RT) Copy-Next Sequence

Figure 8:
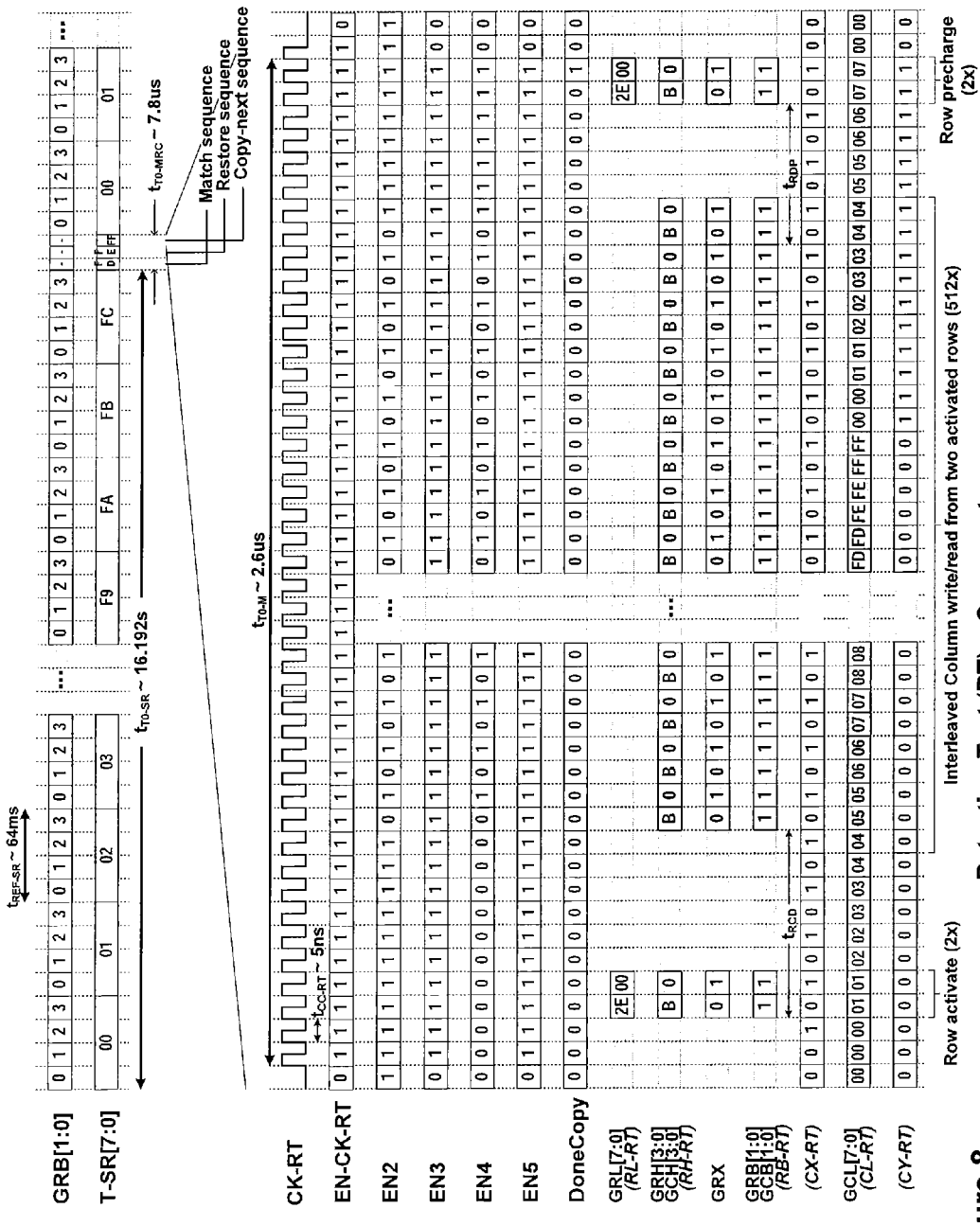
FIG. 8 illustrates an exemplary "copy-next" sequence of the retention test.

FIG. 8 shows the details of the third of three sequences (Match, Restore, and Copy-Next) of the retention test described herein. This third sequence increments the value of the row undergoing retention test (RB-RT", "RH-RT", and "RL-RT"), and then copies this row into an appropriate extra row.

The copy-next sequence is almost identical to the match sequence of FIG. 6, except that each 64-bit column word is read from the new row undergoing the retention test, and is written back to the extra row, which may be the same extra row used as the last test or may be a new extra row. In the timing waveform illustrated in FIG. 8, these column operations are shown occurring with no gaps needed. However, depending on different types of DRAM embodiments, it might be necessary to add a turnaround cycle between read/write and write/read transitions. This would involve a second bit in the register "CX-RT", and would approximately double the time of the restore sequence (which would be about 5.1us according to some embodiments).

Retention Test—Alternative Method

An alternate method of performing the retention test is described hereafter. For explanation purposes, the following assumptions are adopted: a group contains 64 bits; only one group is tested during a refresh operation; the actual contents of the group under test are stored (e.g., the contents represent the state of the group under test); and the temporary storage of the initial state of the group under test and the compare operation are performed in the I/O interface cell. However, a person having ordinary skill in the art will understand that these assumptions can be modified when practicing the present embodiments DRAM Component Overview for Alternative Method FIGS. 9A-9E illustrate an overview of a DRAM component that implements the alternate retention test method described herein, according to one embodiment. For purposes of clarity, the DRAM component is illustrated and described at a high-level.

Figure 9A:
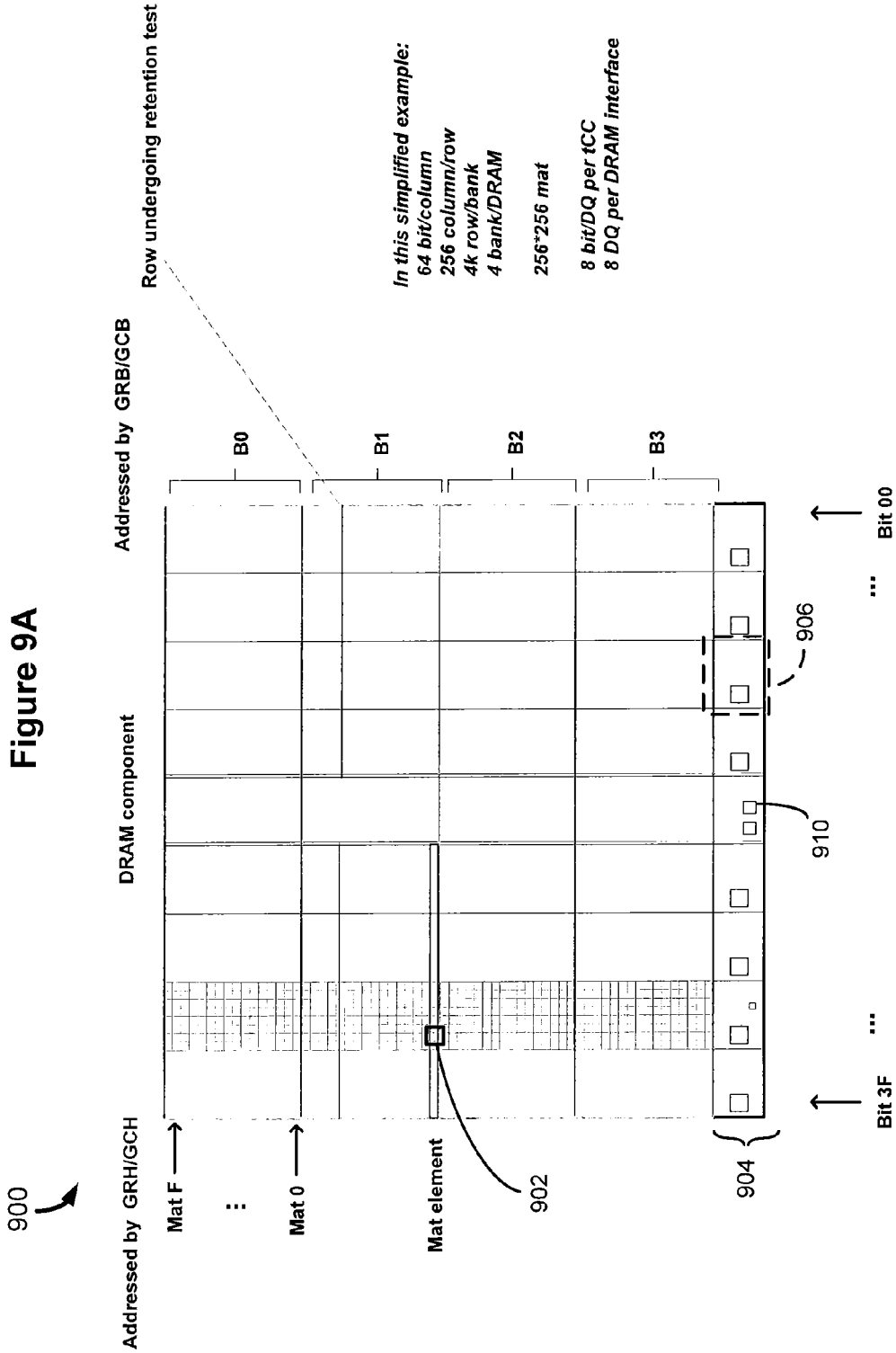
Figures 9B, 9C:
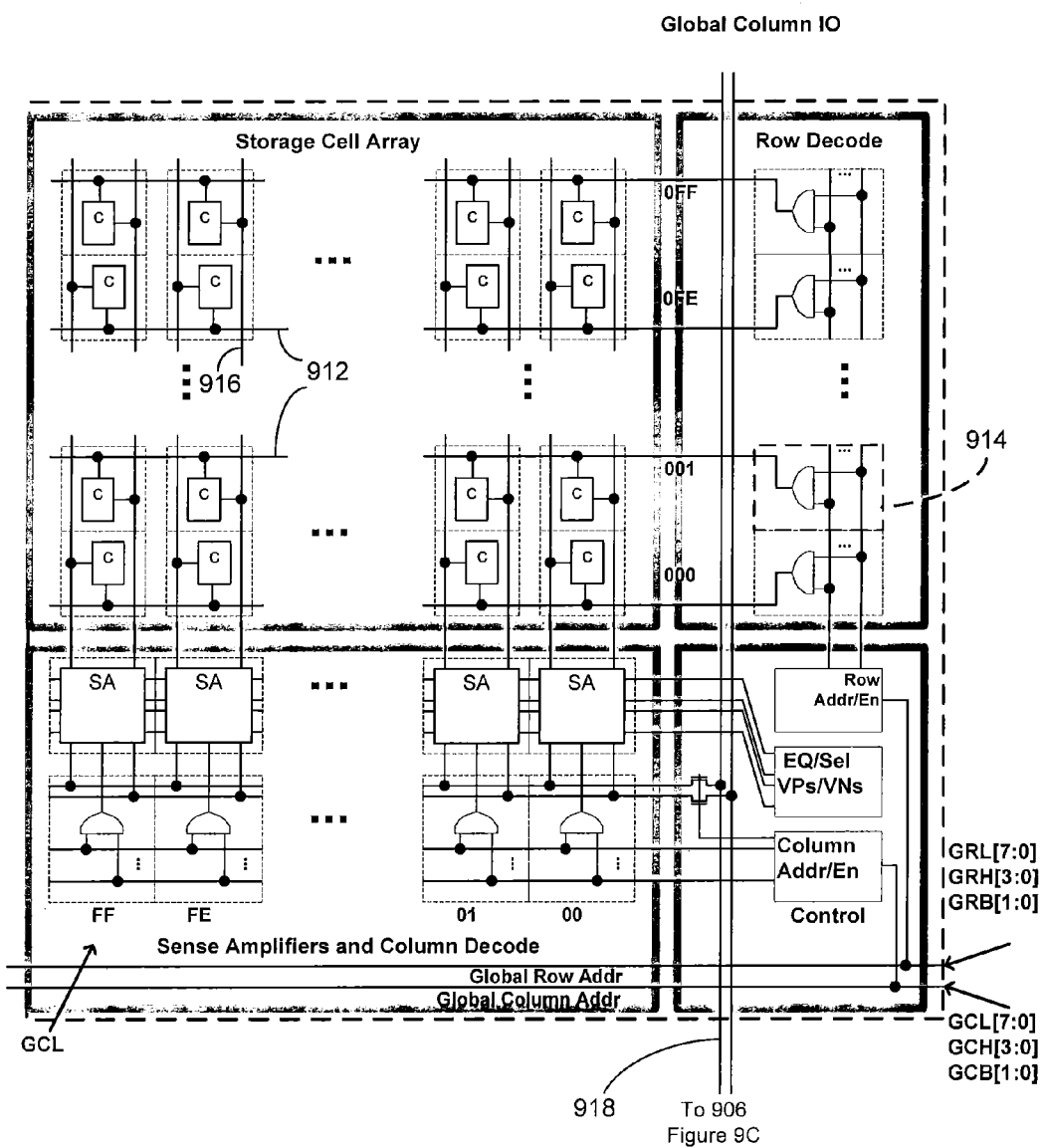
Figure 10:
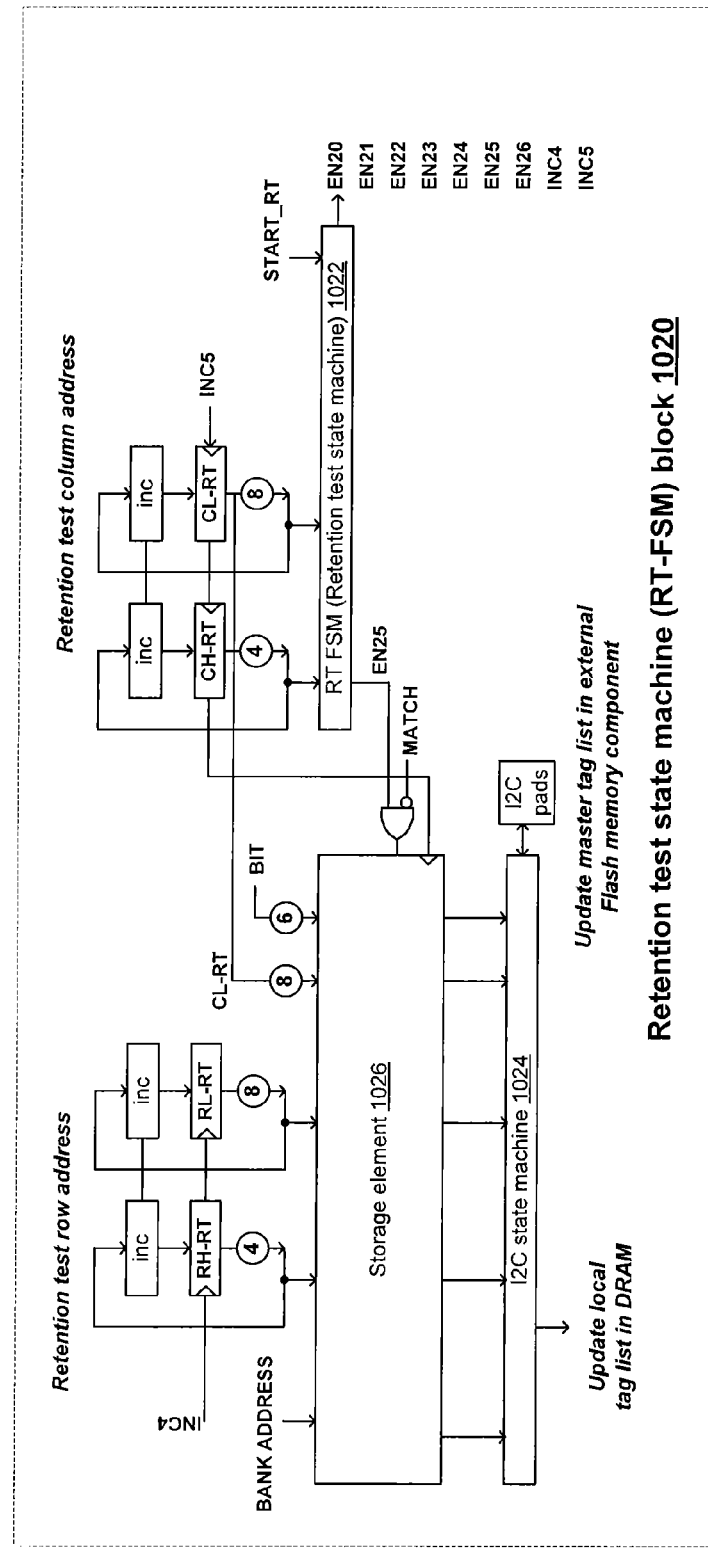
FIG. 10 illustrates an embodiment that implements the finite state machines described in FIGS. 9A-9E.

FIG. 9A illustrates a plan view of an entire DRAM component, generally designated 900. The DRAM component in this example includes four banks B0-B3 that are organized into an array of 64×64 mat blocks (4096 total) 902. FIG. 9B illustrates one specific embodiment of a mat block. The DRAM component 902 also includes an I/O interface 904 that employs a strip of I/O interface cells 906. FIGS. 9C—9E illustrate further details of specific embodiments relating to an interface cell. Hardware in the form of a retention test sequence state machine 910 (that implements the alternative retention test) resides in the strip of I/O cells. Specific embodiments of the retention test sequence state machine 910 are shown in FIG. 10.

Referring now to FIG. 9B, in one specific embodiment, each mat includes a 256×256 array of storage cells arranged in rows and columns. Each storage cell "c" includes a capacitor element (not shown) and an access transistor element (not shown). The storage cells "c" are connected to horizontal word line paths 912 driven by a row decoder 914.

The row decoder 914 uses address signals "GRL" to assert one (or none) of the 256 word lines to access the associated 256 storage cells connected to that line.

The charge in the 256 storage cells is dumped onto the vertical bit lines 916 and amplified by the sense amplifier cells SA. One of the 256 sense amplifiers is selected by address signals "GCL", and this sense amplifier is coupled to global column IO paths 918 routed vertically through the mat.

Referring now to FIG. 9C, the "global column IO" path connects to a column I/O (CIO) interface cell 920. The global column IO signals are aggregated by a serializer/deserializer 922 and (in this example) transmitted or received at a bit rate at a data pad 924 that is 8× the column access bit rate.

In any row access cycle, a horizontal row of 64 mat cells (out of 4096 total) will each assert one of their 256 word lines so that a row of 256 storage cells are placed into the associated 256 sense amplifiers. The other 4032 mat cells will need to inhibit their word lines. This is accomplished with the address signals "GRH" and "GRB". The 4096 mats are organized into four independent banks B0-B3, with each bank having 16 horizontal groups of 64 mats. The bank address signals "GRB" select one of the four banks, and the signals "GRH" select one of the 16 horizontal groups of mats in that bank.

In any column access cycle, a row of 64 mat cells (out of 4096 total) will each couple one sense amplifier SA (of the 256 total) onto the 64 global column IO signal paths, to be serialized/deserialized onto the eight data IO pads 924. The other 4032 mat cells will need to inhibit their global column IO access devices. This is accomplished with the address signals "GCH" and "GCB". The 4096 mats are organized into four independent banks, with each bank including 16 horizontal groups of 64 mats. The bank address signals "GCB" select one of the four banks, and the signals "GCH" select one of the 16 horizontal groups of mats in that bank.

Note that the address signals "GCH" match the signals "GRH" that have been previously asserted for bank "GCB"/"GRB". In other words, a column of a mat can only be accessed if it has been previously sensed with a row access. In fact, the signals GCB and GCH can be auto-generated during the column access by looking up the GRB and GRH values that were stored during the row access.

Further referring to FIG. 9C, a "TEST" block 926 is provided in the "CIO" cell that couples to the global column IO paths 918 running through each column of mats. Further detail pertaining to the TEST block 926 is shown in FIG. 9D. This TEST block 926 employs two register 928 and 930 for storing column data (associated with the group under test) from the same row but at successive refreshes of that row. In aggregate, the 64 TEST cells can store two 64-bit words of column data. A pair of control signals "EN20" and "EN21" cause each of the two 64-bit registers to be loaded. There is also an array of 64 XNOR gates 932 which can compare these two 64-bit column words to see if they match or don't match. In the simplest embodiment, each XNOR gate is logically ANDed by an AND gate 934 with an input match signal "match(i)", which becomes an output match signal "match(o)" passed to a TEST-MAIN block 936 (FIG. 9E). In a practical embodiment, a look-ahead circuit would be added to the AND chain so that the worst case delay is reduced from 64 AND delays to about 6-to-8 AND delays.

In one embodiment, the contents of one of the 64-bit registers (or its complement) may be driven onto the global column IO paths 918 and written into a column location in the currently accessed row. A control signal "EN22" is used to enable this functionality.

Additionally, if the two one-bit values in the TEST block 926 don't match, and if all the TEST blocks to the left of it do match, then a bit index (0-63) of that TEST block is driven onto the "bit" signal paths. In this way, when there are one or more mismatches, the leftmost bit position that mismatches will be transferred to the right. It is expected that a mismatch will be a relatively rare event, and there will normally be a maximum of one bit index to record per row.

Referring to FIG. 9E, the "TEST-MAIN" block 936 receives the "bit" and "match" signals from the 64 TEST blocks. Note that in FIG. 9B, the TEST-MAIN block is located in the center of the strip of IO interface cells, and will receive "bit" and "match" signals from the left and right halves of the DRAM component 900. It will merge the two "match" signals by logically "ANDing" them, and will merge the two "bit" index values by using the one whose "match" value is not HIGH.

The TEST-MAN block 936 includes a match register 938 and a bit register 940. The registers are loaded by a control signal EN23, and are set to an initial value of HIGH by a further control signal EN24.

As noted above, the strip of interface cells 904 (FIG. 9A) contains a state machine 910 to carry out a retention time test sequence. This finite state machine creates the various control or enable signals shown in FIGS. 9A-9E and described above. The I/O strip 904 also includes a block of logic (not shown) that receives CA (command/control/address) signals used for normal operation. This block creates the row and column addresses needed to access the mats for both normal operation and self-refresh operation as well as for the retention time test mode of operation.

Alternative Retention Test State Machine (RT-FSM)

FIG. 10 illustrates one detailed embodiment of a retention test finite state machine RT-FSM2 1020 that corresponds to the state machine 910 described in FIGS. 9A-9E. The RT-FSM 1020 includes four registers "RH-RT", "RL-RT", "CL-RT", and "CH-RT". The first two registers "RH-RT" and "RL-RT" respectively generate 4-bit and 8-bit row addresses of a row that is currently undergoing the alternative retention time test in a given bank. Each 12-bit combination specifies one row of the 4,096 rows (each with 16,384 bits). This 12-bit value is incremented by a control signal "INC4" that is generated by RT-FSM logic 1022. In some embodiments, the retention time test circuitry is shared among all banks. In such embodiments, the RT-FSM 1020 also contains a register "RB-RT" (not shown in FIG. 10) for the bank address bits.

The registers "CH-RT" and "CL-RT" respectively generate the 4-bit and 8-bit addresses of the group under test. This 12-bit value is incremented by a control signal "INC5" that is generated by the RT-FSM logic 1022. This signal pauses after each group of bit cells has been tested.

The address register "CL-RT" generates the 8-bit column address needed to access one of the 256 64-bit-column-words (i.e. one of the groups) in each row. The register "CH-RT" specifies the row that is being currently refreshed, and thus has the same value as the register "RH-RT".

The RT-FSM logic 1022 generates control signals EN20, EN21, EN22, EN23, EN24, EN25, EN26, INC4, and INC5 that are used for generating the row and column address of the group under test as well as the signals needed to perform the retention time test. Exemplary embodiments that utilize these control signals are illustrated throughout this disclosure including, for example, FIGS. 9 and 11.

The RT-FSM 1020 also includes a storage element 1026 to record an address of a weak storage cell that is detected during the retention test. The address includes the bank address of the group undergoing retention time test, the row address of the group undergoing the test ("RH-RT" and "RL-RT"), the column address of the group under test ("CL-RT"), and the six-bit address of the weak bit within the 64-bit column-word ("BIT").

The recorded address can then be transferred to an external storage element (for example, an external Flash memory component) via a serial connection interface such as I²C. This external non-volatile storage element is used to load a local tag memory of the DRAM for the error correction/repair method that has been implemented.

The recorded address can also be used to immediately update the local tag memory used for DRAM repair so that the weak cell will not show up in subsequent retention tests.

CA Interface

Figure 11:
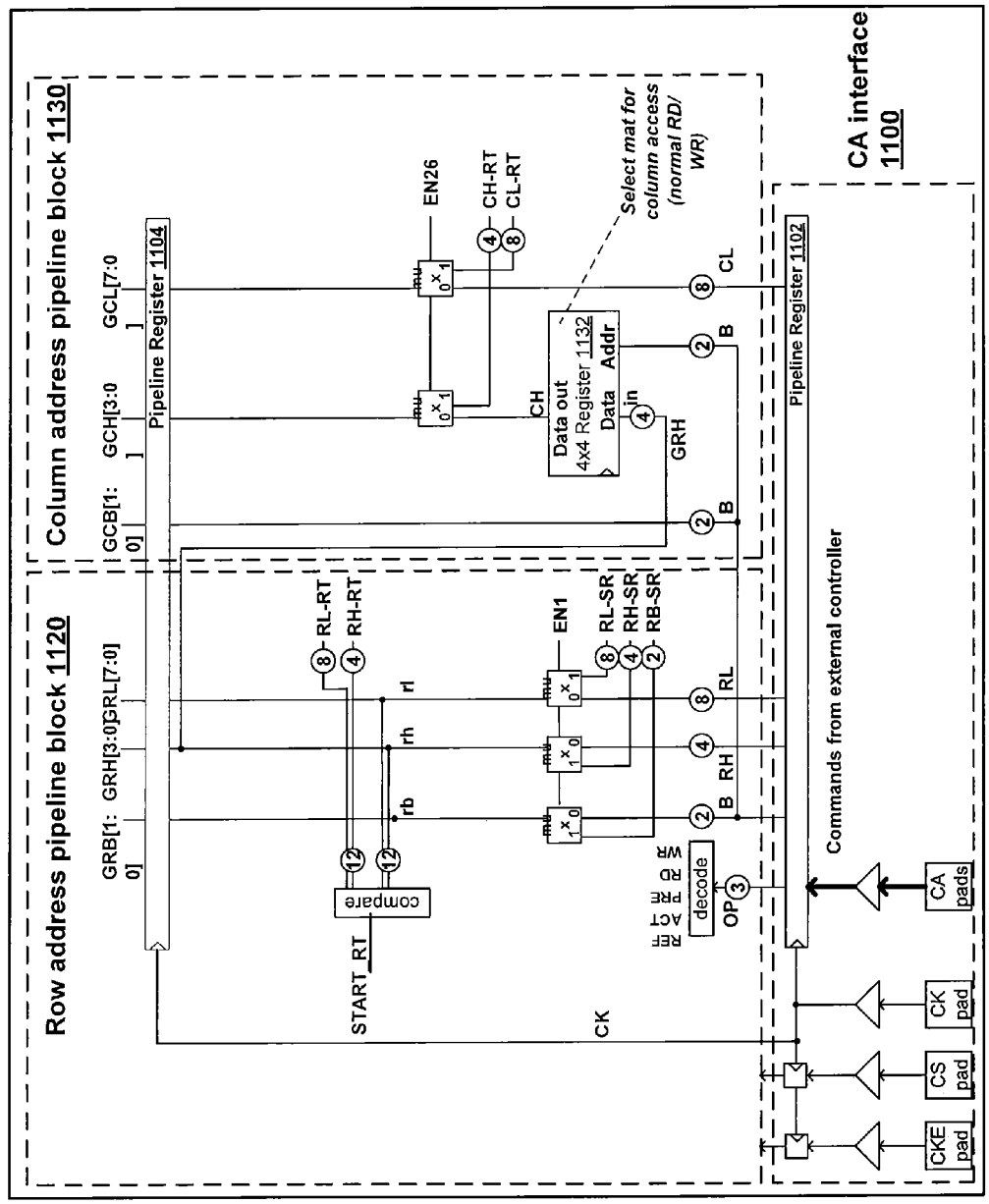
FIG. 11 illustrates a CA interface block, a row address pipeline block and a column address pipeline block that interact with the finite state machine of FIG. 10, according to some embodiments.

FIG. 11 illustrates a CA interface 1100 that converts the commands (e.g., op command/control/address information) received on the CA interface into the row addresses ("GRB", "GRH" and "GRL") and column addresses ("GCB", "GCH" and "GCL") used to access the mat array in the DRAM. The CA interface 1100 also includes logic circuitry that merges the self-refresh addresses ("RB-SR", "RH-SR", and "RL-SR") and the retention-test addresses ("RH-RT", "RL-RT"), as well as logic circuitry needed to compare the retention-test addresses ("RH-RT", "RL-RT") with the address of the row being refreshed. These pieces of logic circuitry are shown in between two pipeline registers 1102 and 1104, which are clocked by an interface clock signal "CK".

Row Address Pipeline

A row address pipeline block 1120 is illustrated in the upper-left side of FIG. 11. It begins be extracting fields "B", "RH", and "RL" from the received CA word for a refresh ("REF") command. These fields are respectively 2 bits, 4 bits, and 8 bits in width according to one embodiment. If self-refresh is being performed, then the self-refresh addresses ("RB-SR", "RH-SR", and "RL-SR") are merged in by the self-refresh logic block (not shown in this figure) asserting the control signal "EN1".

At this point, the 12-bit field ("rh", "rl") of the 14-bit modified row address ("rb", "rh", "rl") is compared to the 12-bit retention-test row address ("RH-RT", "RL-RT"). If they match, a retention time test (e.g., the alternative retention test) can be performed at this refresh operation. This is indicated by asserting a START_RT signal. The "rb[1:0]", "rh[3:0]", and "rl[7:0]" fields are registered and drive the global row address signals ("GRB", "GRH" and "GRL").

Note that the final GRH[3:0] address is stored in a 4×4 register 1132 indexed by the bank address. More details of the 4×4 register 1132 are described with regard to a column address pipeline 1130 described below.

Column Address Pipeline

A column address pipeline block 1130 is illustrated on the upper-right side of FIG. 11. The content of the 4×4 register 1132 and the "CL" field from a received CA word respectively are replaced by the "CH-RT" and "CL-RT" column addresses when the retention test is being performed. This occurs when the control signal "EN26" is asserted. Note that the column addresses "CL-RT" and "CH-RT" come from the registers "CL-RT" and "CH-RT" in the RT-FSM 1022, embodiments of which are illustrated in FIG. 10.

Retention Test—Group State Comparison Operation—Overview

Figure 9C:
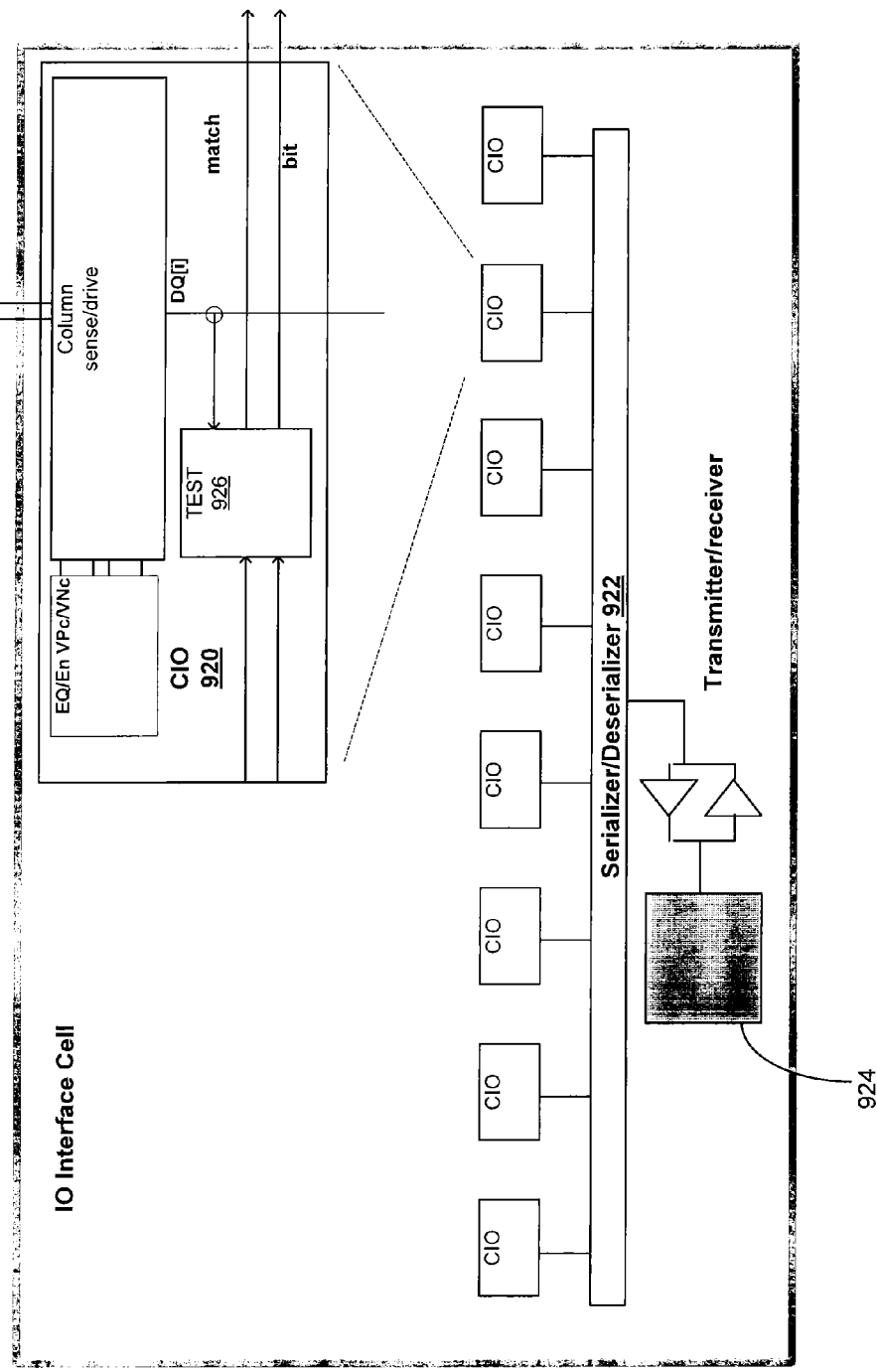

A quick overview of a second retention test method employed by the DRAM component and state machine described more fully in the descriptive text corresponding to FIGS. 9-11. Hereinafter, the second method is also referred to as "the alternative retention test method."

The alternate method of performing a retention test involves comparing the state of a group of DRAM cells at successive refreshes of that particular group of bit cells (also called bits or cells). The group can include one or more DRAM bit cells, up to and including all the bit cells in a row. An overview of this method is described below.

A retention time test counter holds the address of the group that is currently being tested. The group address includes a row address field and a column address field. The row address field contains the row address of the group under test. The column address field indicates the starting column address of the group under test. For example, an 8 Kb row will contain 128 64-bit groups. So, a 7-bit column address field is required to store the starting column address of the group under test. For the case of 32-bit groups, an 8 Kb row will contain 256 groups, thus requiring an 8-bit column address field. Upon initialization of the DRAM, the retention time test counter is cleared.

Each bank in a DRAM has a retention time test counter. Alternately, a single retention time test counter can be shared across all banks in a DRAM, in which case, the retention time test counter also contains a bank address field. For the purpose of explanation, it is assumed that each bank has a dedicated retention time test counter.

At every refresh operation (initiated and managed by an external controller or by the self-refresh logic in the DRAM), the row address field of the retention time test counter is compared to the address of the row being refreshed. If there is a match, then the state of the group corresponding to the column address field in the retention time test counter is copied to a temporary storage. When the same row is refreshed the next time, the state of the same group is compared to the previously saved state. If the two states match, then all the cells in the group under test meet the minimum retention time guaranteed by the manufacturer. The column address field is then incremented to the next group and the retention time test repeated. The row address field is incremented when the column address increment operation results in an overflow. When the row address overflows on an increment, all the groups in that bank have been tested. The retention time test can then restart immediately and retest each group of bits from the first group in the first row to the last group in the last row. Alternately, the test can be restarted after some period of time has elapsed.

If a read or write command is directed to the row containing the group under test between the refresh operation at which the state of the group under test is saved in temporary storage and a following refresh operation in which the state of the group under test is compared against the saved state, then the retention time test is invalid and must be repeated. One way of performing this check is to compare the row address associated with an activate (or active) operation to a specific bank with the contents of the row address field of the retention time test counter associated with that bank. If there is match, the saved state of the group under test is invalidated and the retention time test state machine is reset so as to restart the test of the current group under test at the next refresh operation.

If all the bits in the group under test pass the retention time test, a further option would be to retest the same group but with the bits in the group inverted. This ensures that each bit cell in the group is tested for retention time of a logic "0" and a logic "1". In this option, the bits of the group under test are tested in two stages. The first stage of the test is described in the previous paragraphs, where the state of the group under test is stored in temporary storage during a refresh operation and then compared with the state of the same group at a following refresh operation. A successful match advances the test to the second stage. In this stage, the bits of the group under test are inverted and written back to the corresponding bit cells in the DRAM array. The inverted value is saved in temporary storage. At a following refresh operation, the inverted state of the group under test is compared with the previously inverted and saved state. If the match is successful, the bits in the group under test are inverted back to their original state and written back to the corresponding bit cells in the DRAM array. The retention time test then advances to the next group. If a read or write operation is directed to the row containing the group under test during the second stage of the retention time test, the bits in the group under test are inverted back to their original state after the bits have been transferred from the memory cells to the sense amplifiers. The retention time test state machine is then reset so as to restart the test of the current group under test from the first stage.

If there is a mismatch between the current state of the group and the previously saved state of the group, the differing bit or bits become candidates for adding to the weak bit list for repair/correction. Since the mismatch may be due to a soft error caused by external radiation or any other noise, an optional implementation may be to update the state of the group under test with the previously stored state and re-test the same group using the method described previously. If the mismatch occurs at the same bit locations, then the bit or bits that are different become candidates for adding to the weak bit list for repair/correction. If a mismatch occurs in the second stage of a two stage retention time test, the bits in the group under test are inverted back to their original stage and the bit or bits that were different become candidates for adding to the weak bit list for repair/correction.

An external controller is any semiconductor device that is coupled to the DRAM and is capable of controlling the DRAM. Some examples are CPUs, ASICs with memory controllers, buffers, and registers.

The state of the group under test can be the actual bit values (logic 0s and 1s) of the bit cells in the group, an ECC syndrome for the group (e.g. obtained using a 72/64 ECC code), a CRC checksum for the group, parity bits, Hamming codes, or any other representation of the bits in the group.

The initial state of the group under test can be stored in a number of places. One option would be store each bit of the group under test in the associated mat itself. Another option would be to use the existing column selection/steering logic to route the 64-bits of the group under test to the I/O interface and store the state in temporary storage in the I/O interface.

Retention Test—Second Method—Constraints

In the alternate method, the retention time test is performed as and when the group under test is being refreshed. Since multiple rows are typically refreshed during a refresh operation, the retention time test can be performed on the first row being refreshed during that operation. This allows the test to overlap the refreshes of other rows, thus reducing or eliminating any latency penalty due to the test. Optionally, multiple temporary storage circuits can be used to perform retention time test of multiple groups at any given refresh operation. These multiple groups may all be on one row that is being refreshed or may be on multiple rows that are being refreshed.

Alternative DRAM Core

Figure 12:
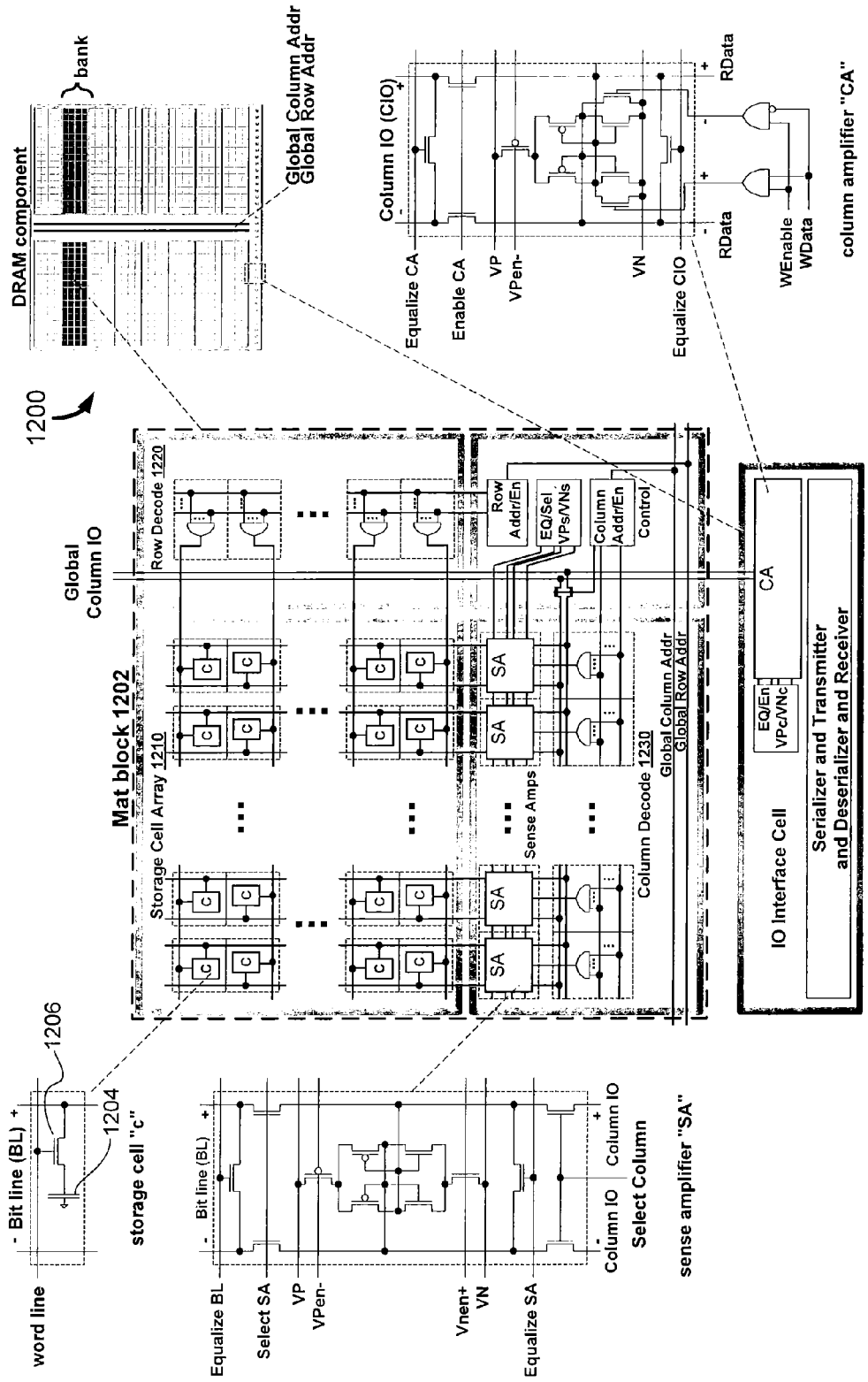
FIG. 12 illustrates an example of a mat block for a DRAM component, according to some embodiments.

FIG. 12 shows an example of a mat block for a DRAM component 1200, according to some embodiments. The DRAM component 1200 includes 1024 mat blocks (such as mat block 1202). The mats included in the DRAM component 1200 are arranged into eight independent banks, with each bank containing four mat blocks vertically and 32 mat blocks horizontally. Of course, this 4×32 mat arrangement is merely one embodiment. Other embodiments may include any suitable mat block arrangements.

The mat block 1202 includes an array 1210 of storage cells "c". Each storage cell c includes a storage capacitor 1204 and an access transistor 1206. The gate of the access transistor 1206 connects to the word line which passes horizontally though the cell c. The drain of the access transistor connects to the bit line (BL) which passes vertically though the cell. The source of the access transistor connects to the storage capacitor 1204.

The mat block 1202 receives a set of global row address signals. The global row address signals are passed to a plurality of row decoders 1220 so that a single word line is asserted. The global row address may also include enable signals which select the entire mat block 1202. If the enable signal is not asserted, then none of the word lines are asserted.

When a word line is asserted, the associated row of storage cells is accessed. The charge on each storage cell is dumped onto the associated bit line by its access transistor (e.g., transistor 1206). This creates a small signal on the bit line. This small signal is amplified by an associated sense amplifier (SA) at the bottom of the array 1210.

Before the row access starts, the bit lines and sense amplifiers will have been placed into a precharged condition, in which the bit line voltages have been equalized to a level that is between the two supply voltages. Also note that each sense amplifier SA connects to two bit lines. During the row access, only half of the bit lines (depending upon odd or even wordline) are coupled to storage cells, and the other half remain at the equalized (precharge) level.

The sense amplifier SA includes a cross-coupled inverter/latch circuit, which amplifies the small differential signal on the two bit lines into full CMOS (rail-to-rail) voltage levels.

The mat block 1202 also receives a set of global column address signals. The global column address signals are passed to a plurality of column decoders 1230 so that a single column select signal (connected to an associated sense amplifier) is asserted. The global column address may include enable signals which select the entire mat block 1202. If the enable signal is not asserted, then none of the column select signals are asserted.

When a column select is asserted, the associated sense amplifier is accessed. The sense amplifier is connected to the global column IO signal, which passes vertically through the right-hand side of the mat block 1202. This initially creates a small differential signal on the global column IO signal. This small signal is amplified by the column amplifier (CA) at the bottom of the DRAM.

Before the column access starts, the global column IO and column amplifiers will have been placed into a precharged condition, in which the voltages have been equalized to a level that is between the two supply voltages.

When the data is stable in the column amplifiers, it can be serialized and transmitted through the DQ output pins for the case of a column read.

In the case of a column write, the data from the DQ input pins is deserialized and driven by the column amplifier through the global column IO signal to the sense amplifier selected by the column decoder. The sense amplifier is set to this new value by the column write operation.

Further, the sense amplifier drives through the bit lines to the storage cell (which is still accessed by the associated word line), so the accessed row has the same contents as the copy of the row held in the sense amplifiers.

Number of Repairable Bits in DRAM

Figure 13:
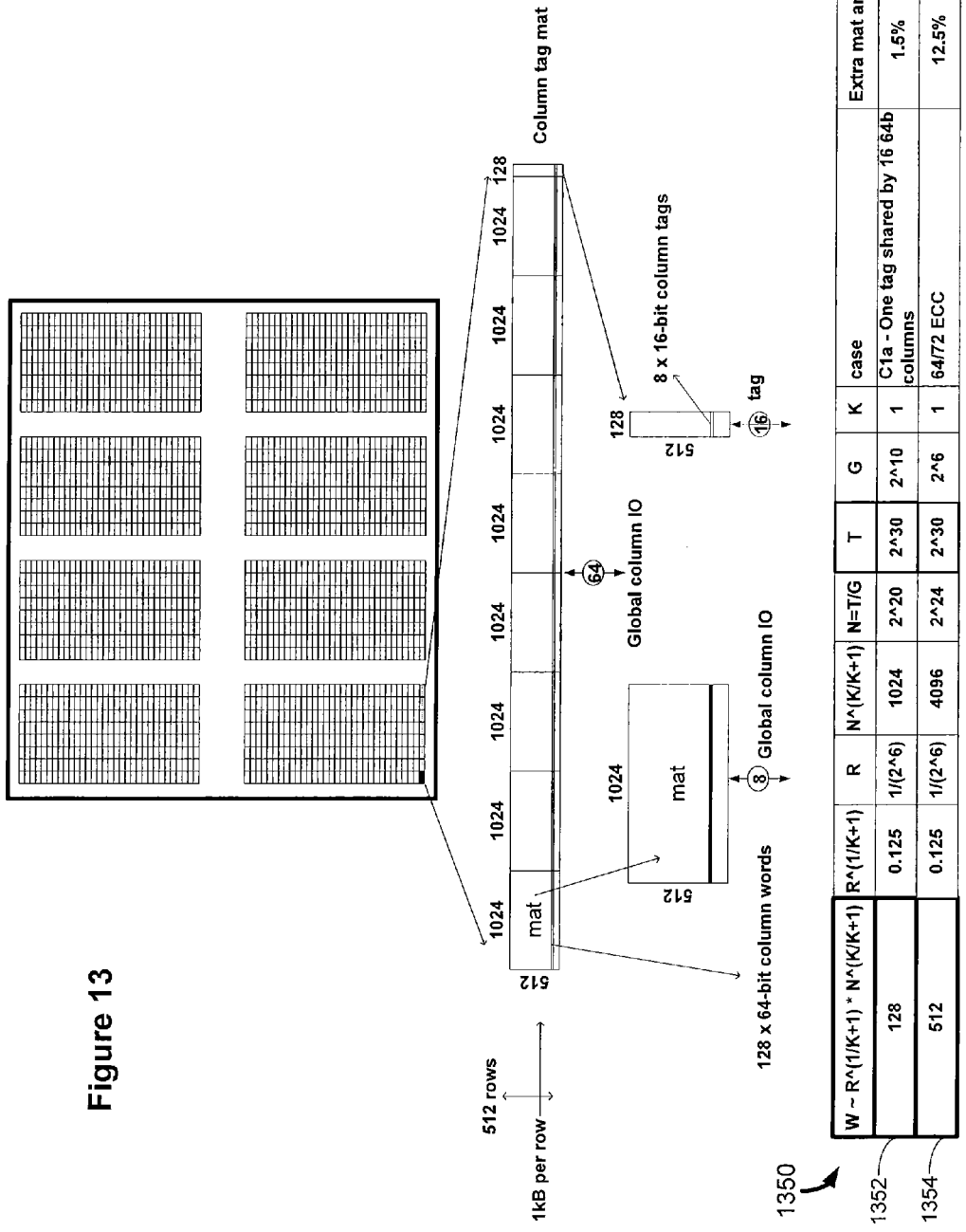
FIG. 13 demonstrates the number of marginal or failed storage cells (also referred to as weak cells) which can be repaired on a DRAM using different repair methods.

FIG. 13 demonstrates the number of marginal or failed storage cells (also referred to as weak cells) which can be repaired on a DRAM using different repair methods. For simplicity, the following discussion is based on a DRAM embodiment that has the capacity of 2^30 (1 Gb). Also, the following definitions are used:

T=total DRAM capacity (1 Gb)
R=fraction of unrepairable DRAMs
G=total number of bits in a repairable group
N=T/G=the number of groups in the DRAM
K=number of repairable bits in a group
W=number of weak bits repaired in DRAM The parameters that call for attention are G, the number of bits within a "repair group", and K, the number of bits that can be repaired within the "repair group". Note that the number of repair groups within the DRAM is simply given by T/G.

For one embodiment, the fraction of unrepairable DRAM bits is set at 1.6% (=1/64). This represents the fraction of DRAMs with one or more repair groups with more than "K" weak storage cells. Typically, it is desirable to find the number of randomly distributed weak bits that can be repaired across the entire 2^30 bit DRAM as a function of the (R,K,N) parameters. This function can be derived as explained below.

First, the probability of one group having ≥(K+1) weak bits is:

$$Pf = \left[\frac{W^{K+1}}{N^{K+1}}\right] \tag{2}$$

Then, the probability of one group having <(K+1) weak bits is:

$$Pp = 1 - Pf = 1 - \left[\frac{W^{K+1}}{N^{K+1}}\right] \tag{3}$$

Therefore, the probability for all N groups having <(K+1) weak bits is:

$$1 - R \sim \left[1 - \frac{W^{K+1}}{N^{K+1}}\right]^N \tag{4}$$

When $(W/N)^{K+1}$ is relatively small, formula (4) can be represented as:

$$1 - R \sim 1 - \left[N * \frac{W^{K+1}}{N^{K+1}}\right] \tag{5}$$

From formula (5), R can be approximately expressed as:

$$R \sim N * \frac{W^{K+1}}{N^{K+1}} \tag{6}$$

And therefore, W can be approximately expressed as:

$$W \sim R^{\frac{1}{K+1}} * N^{\frac{K}{K+1}} \tag{7}$$

Row 1352 of table 1350 shows the case "C1a" for the column repair method. In this case, a 16 bit address tag is shared across 16 64-bit column words. Thus, the size of the repair group is G=1024b, and there are N=2^20 repair groups in the DRAM. Also, the number of repairable bits per group is K=1. This results in W=128 repairable bits across the entire DRAM, with 98.6% of the DRAMs repairable, at a cost of 1.5% additional mat area.

In contrast, row 1354 of the table 1350 also shows the case for a 64/72 ECC repair method. In this case, an 8 bit syndrome is shared across a 64-bit column word. Thus, the size of the repair group is G=64b, and there are N=2^20 repair groups in the DRAM. Also, the number of repairable bits per group is K=1 (single-bit errors are corrected). This results in W=512 repairable bits across the entire DRAM, with 98.6% of the DRAMs repairable, at a cost of 12.5% additional mat area.

Additional Column Repair Cases

Figure 14:
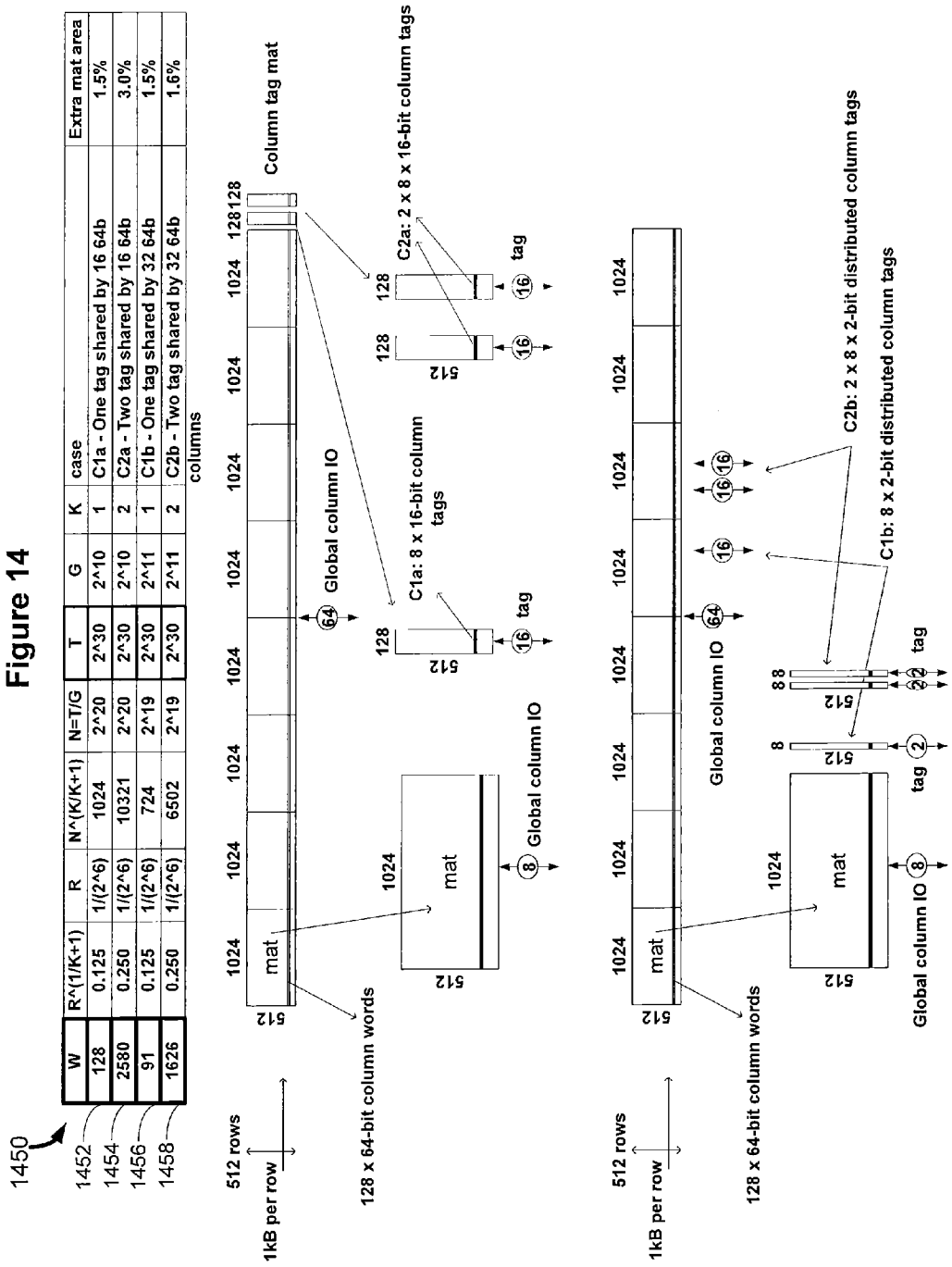
FIG. 14 illustrates additional column repair cases as compared to one embodiment that is illustrated in FIG. 13.

FIG. 14 illustrates additional column repair cases as compared to the one embodiment illustrated in FIG. 13. Row 1452 of table 1450 shows the case "C1a" for the column repair method which is illustrated in FIG. 13. Three additional cases are respectively provided in rows 1454-1458 and are described below.

In row 1454 which illustrates the case "C2a," two 16 bit address tags are shared across 16 64-bit column words. Thus, the size of the repair group is G=1024 b, and there are N=2^20 repair groups in the DRAM. Also, the number of repairable bits per group is K=1. This results in W=2580 repairable bits across the entire DRAM, with 98.6% of the DRAMs repairable, at a cost of 3.0% additional mat area.

In row 1456 which illustrates the case "C1b," the storage for the repair tag is distributed across the data tags. In this case, a 16 bit address tag is shared across 32 64-bit column words. Thus, the size of the repair group is G=2048 b, and there are N=2^19 repair groups in the DRAM. Also, the number of repairable bits per group is K=1. This results in W=91 repairable bits across the entire DRAM, with 98.6% of the DRAMs repairable, at a cost of 1.5% additional mat area. This may not provide any advantage over the C1a case, however the distributed version C2b does provide a significant improvement over C2a.

In row 1458 which illustrates the case "C2b," two 16 bit address tags are shared across 32 64-bit column words. Thus, the size of the repair group is G=2048 b, and there are N=2^19 repair groups in the DRAM. Also, the number of repairable bits per group is K=2. This results in W=1626 repairable bits across the entire DRAM, with 98.6% of the DRAMs repairable, at a cost of 1.6% additional mat area.

Thus, the "C2b" case will repair approximately 3.2× as many weak bits as a 64/72 b ECC method (e.g., as illustrated in row 1354 of FIG. 13), but at a mat area overhead that is only about ⅛th as great.

Additional Row Repair Cases

Figure 15:
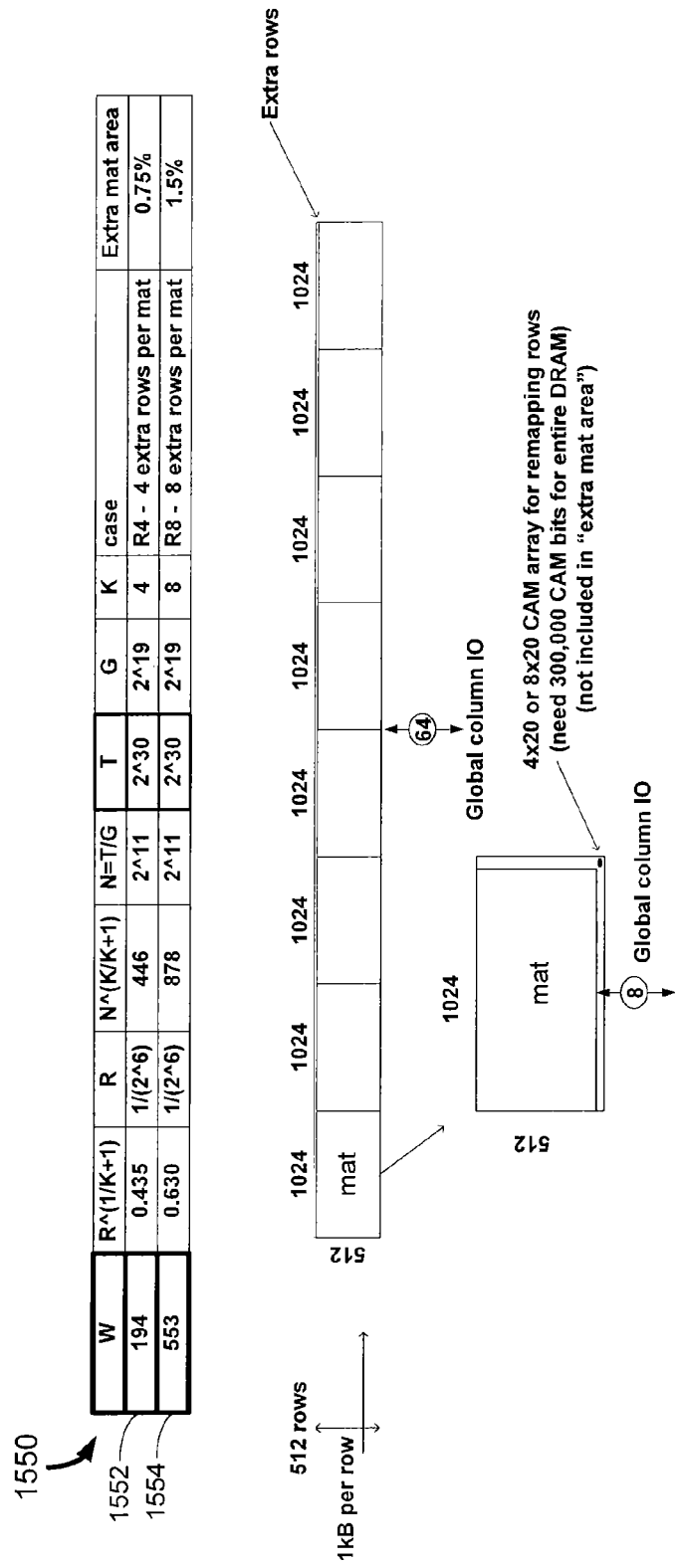
FIG. 15 illustrates additional row repair cases, according to some embodiments.

FIG. 15 illustrates additional row repair cases in accordance with some embodiments. A different repair mechanism is used in the case "R4," which is illustrated in row 1552 of table 1550, and the case "R8," which is illustrated in row 1554 of the table 1550. In the case of R4, each mat is given 4 additional rows out of the 512 rows already present. In the case of R8, each mat is given 8 additional rows out of the 512 rows already present. A content-addressable-memory (CAM) (see FIG. 18) is also added to each mat block to perform the remapping of row addresses. A row with a storage cell exhibiting a marginal or failing retention time is remapped to one of the extra rows. More details of this CAM circuit are shown in FIG. 18.

In the case R4, the size of the repair group is G=2^19 (the size of the mat block). There are N=2^11 repair groups in the DRAM. Also, the number of repairable bits per group is K=4. This results in W=194 repairable bits across the entire DRAM, with 98.6% of the DRAMs repairable, at a cost of 0.75% additional mat area. It is noted that this area estimate does not include the area needed in the row decode section of the mat block needed for implementing the 4×20 CAM block. A person practicing this embodiment should take this additional area into consideration.

In the case R8, the size of the repair group is G=2^19 (the size of the mat block). There are N=2^11 repair groups in the DRAM. Also, the number of repairable bits per group is K=4. This results in W=553 repairable bits across the entire DRAM, with 98.6% of the DRAMs repairable, at a cost of 1.5% additional mat area. It is noted that this area estimate does not include the area needed in the row decode section of the mat block needed for implementing the 8×20 CAM block.

System Configuration Examples

FIGS. 16A-16D show embodiments of different system configurations (Configuration 1-Configuration 12) employing the storage cell repair hardware and techniques discussed herein. It is noted that different configurations correspond to different initialization and maintenance of the repair mechanism.

FIGS. 16A-16D respectively show Configurations 1-3, 4-6, 7-9 and 10-12. To facilitate a better understanding, the following definition is used in each configuration:
C—memory controller component
M—Memory component
F—Non-volatile memory component (i.e. Flash)
B—Buffer component
CA—command/address interface signals
DQ—data interface signals
I2C—sideband interface for initialization In all of the configurations, the DRAM memory device components M can reside either on a module (dotted line) or on a mainboard.

In the case of a module, the module substrate may include standard FR4 material (e.g., as in DIMM or SO-DIMM units). A module can also include thick film substrate, such as a stacked die package or a stacked package-on-package (POP) assembly. In module configurations, it is convenient to have a non-volatile memory component (such as a Flash memory device) as part of the module assembly so that the non-volatile memory component can be used to store the remapping information. In this way, the remapping information is available to the components for initialization and maintenance.

In the case of the non-module configurations, it is necessary to make the remapping information available to the DRAM components M. This can be done either through a network connection or by loading a non-volatile component that resides elsewhere in the system.

In those configurations that have the Flash memory component F (e.g., Configurations 1-4 and 7-12), the Flash component contains the tag/CAM remapping information needed to repair storage cells in the DRAM components. The Flash component and the remapping information accompany the DRAM components as the system moves through manufacturing and assembly processes.

In those configurations that do not have the Flash component (e.g., configurations 5 and 6), the remapping information is communicated via a network connection, by using a serial number or other suitable type of unique identifier for each Flash component. This information can be stored in a non-volatile memory (not shown) after it has been received from the network.

Figure 16A:
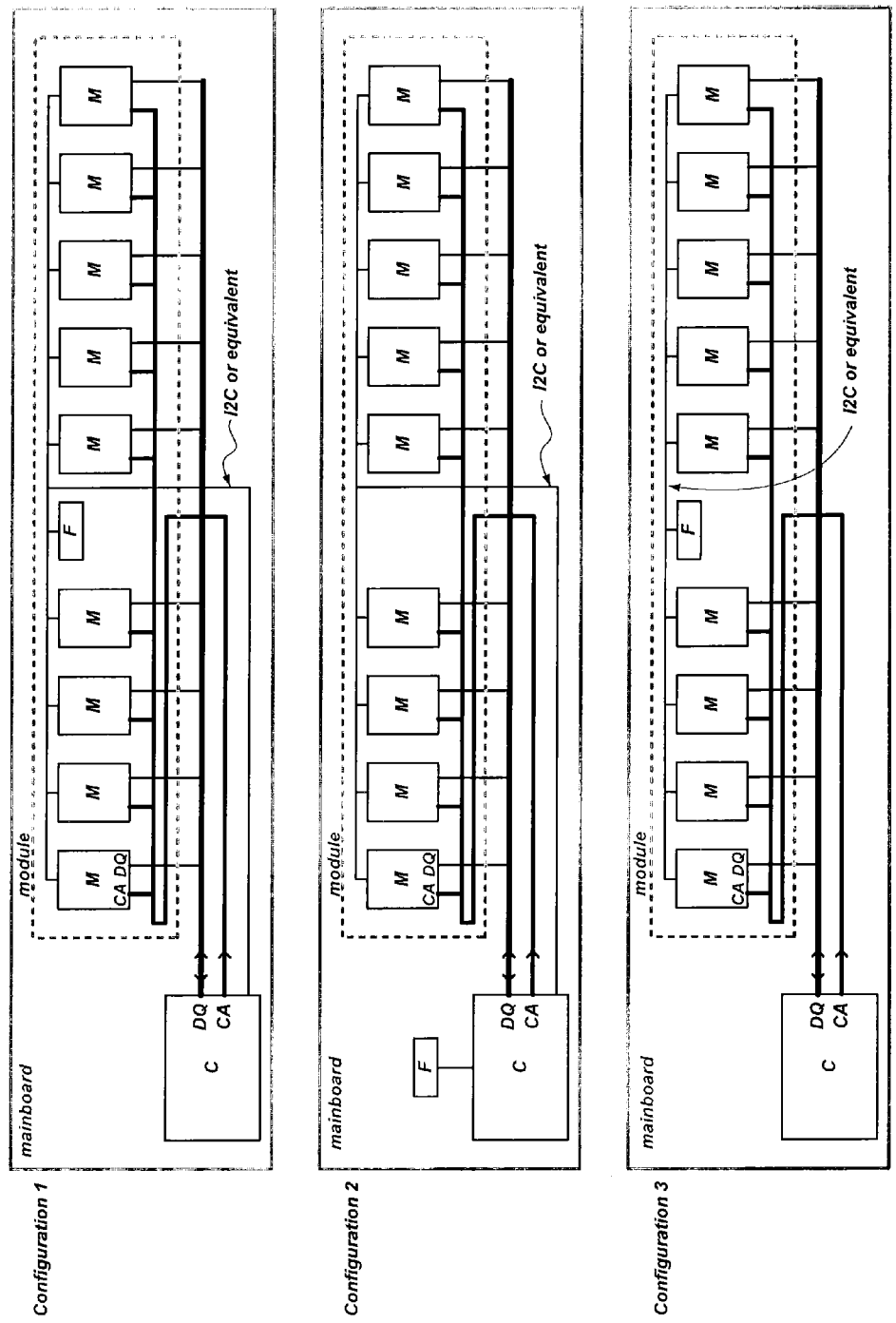

Now referring to FIG. 16A, in Configuration 1, the controller C connects to the I$^2$C bus, along with the Flash component F and the DRAM components M. The controller C can then read the remapping information from the Flash component, and write it to the appropriate DRAM component at initialization (and during subsequent maintenance operations (e.g., updating the remapping information)).

Note that in all the configurations, the sideband bus is described as an "I$^2$C" two wire connection bus. However, other suitable buses may be used for this initialization and maintenance function. In an embodiment, at least one of the components acts as a "primary device" which can initiate read/write transactions to control registers on one or more "secondary devices". Control register addresses can be assigned which can initiate memory access operations to be performed in the cores of the DRAM and Flash components. These operations include access to the tag(s) or CAM arrays that are used for repair on the DRAM components according to different techniques described herein.

Further referring to FIG. 16A, in Configuration 2, the Flash component F is on a bus other than the I$^2$C bus. The controller component C reads the remapping information from this other bus, and writes to the DRAM components M on the I$^2$C initialization bus based on the remapping information. During maintenance, updated remapping information from the retention test (as previously described) is read from the DRAM components M and written to the Flash component F to update the remapping information stored therein.

With continued reference to FIG. 16A, in Configuration 3, the Flash component F and the DRAM components M are on the I$^2$C bus. The controller component C does not connect to this bus. Each DRAM component M reads its associated remapping information from the Flash component F across the I$^2$C initialization bus. During maintenance, the updated remapping information from the retention test is written from the DRAM components M to the Flash component F.

Figure 16B:
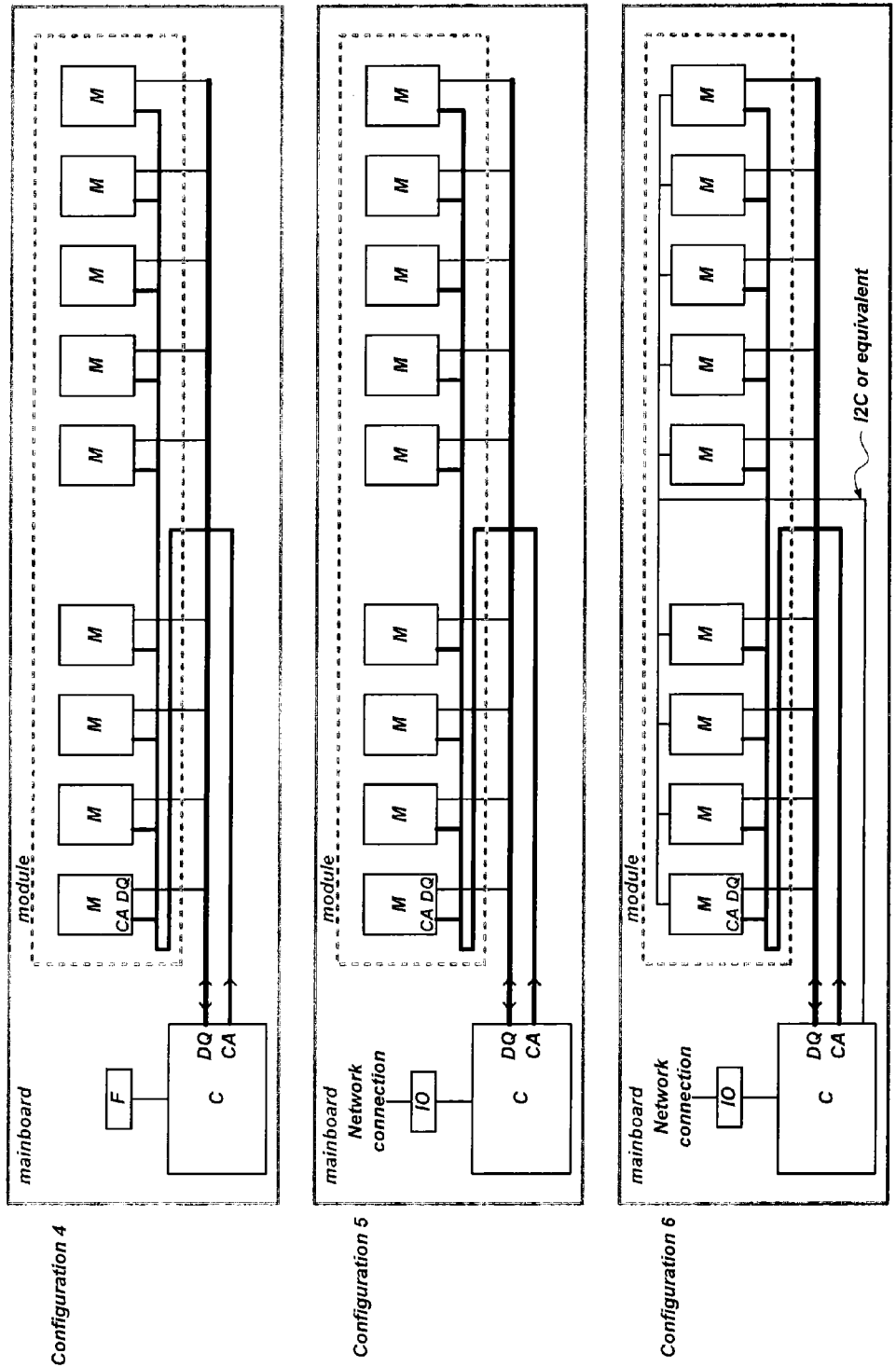

Now referring to FIG. 16B, in Configuration 4, there is no I$^2$C bus. The Flash component F is on a bus other than the DQ/CA buses. The controller C reads the remapping information from this other bus, and writes to the DRAM components M with the CA bus or the DQ bus (or both) based on the remapping information during initialization. During maintenance, the updated remapping information from the retention test is read from the DRAM components M via the CA or DQ buses, and written to the Flash component F.

Further referring to FIG. 16B, in Configuration 5, there is no I$^2$C bus. The controller C reads the remapping information from another system via a network connection, and writes to the DRAM components M with the CA bus or the DQ bus (or both) during initialization. In some embodiments, the remapping information is placed in a non-volatile storage element (not shown) after it is retrieved from the network. During maintenance, the updated remapping information from the retention test is read from the DRAM components M via the CA or DQ buses, and written to this non-volatile storage element.

Still referring to FIG. 16B, in Configuration 6, there is an I²C bus connecting the controller C to the DRAM components M. The controller reads the remapping information from another system via a network connection, and writes to the DRAM components with the I²C bus (during initialization). In some embodiments, the remapping information is placed in a non-volatile storage element (not shown) after it is retrieved from the network. During maintenance, the updated remapping information from the retention test is read from the DRAM components M via the I²C bus, and written to this non-volatile storage element.

Now referring to FIG. 16C, in Configuration 7, a buffer component B has been added between the controller component C and the DRAM components M. There are primary CA and DQ signals between the controller C and buffer B components, and there are secondary CA and DQ signals between the buffer B and DRAM components M. The buffer component B resides on the module assembly.

An I²C bus also couples the buffer B and DRAM components M to a Flash component F to communicate the remapping information. The buffer B reads the remapping information from the Flash component and writes to the DRAM components M during initialization using the I²C bus. During maintenance, the updated remapping information from the retention test is read from the DRAM components M and written to the Flash component F by the buffer B using the I²C bus.

Further referring to FIG. 16C, in Configuration 8, a buffer B has been added between the controller component C and the DRAM components M. There are primary CA and DQ signals between the controller C and buffer B components, and there are secondary CA and DQ signals between the buffer B and DRAM components M. The buffer component B resides on the module assembly.

An I²C bus also couples the buffer component B to a Flash component F to communicate the remapping information. The buffer B reads the remapping information from the Flash component F and writes to the DRAM components M (via the secondary CA and/or the secondary DQ buses) during initialization. During maintenance, the updated remapping information from the retention test is read from the DRAM components M (via the secondary CA and/or the secondary DQ buses) and written to the Flash component F by the buffer B.

Still referring to FIG. 16C, in Configuration 9, a buffer component B is added between the controller component C and the DRAM components M. There are primary CA signals between the controller C and buffer B components, and there are secondary CA signals between the buffer B and DRAM components M. The buffer component B resides on the module assembly. The DQ signals are not buffered and connect the controller component C and DRAM components M directly.

An I²C bus also couples the buffer B and DRAM components M to a Flash component F to communicate the remapping information. The buffer B reads the remapping information from the Flash component F and writes to the DRAM components M during initialization using the I²C bus. During maintenance, the updated remapping information from the retention test is read from the DRAM components M and written to the Flash component F by the buffer B using the I²C bus.

Optionally, the secondary CA bus may be used in Configuration 9 to transfer remapping information between the buffer B and DRAM components M.

Figure 16D:
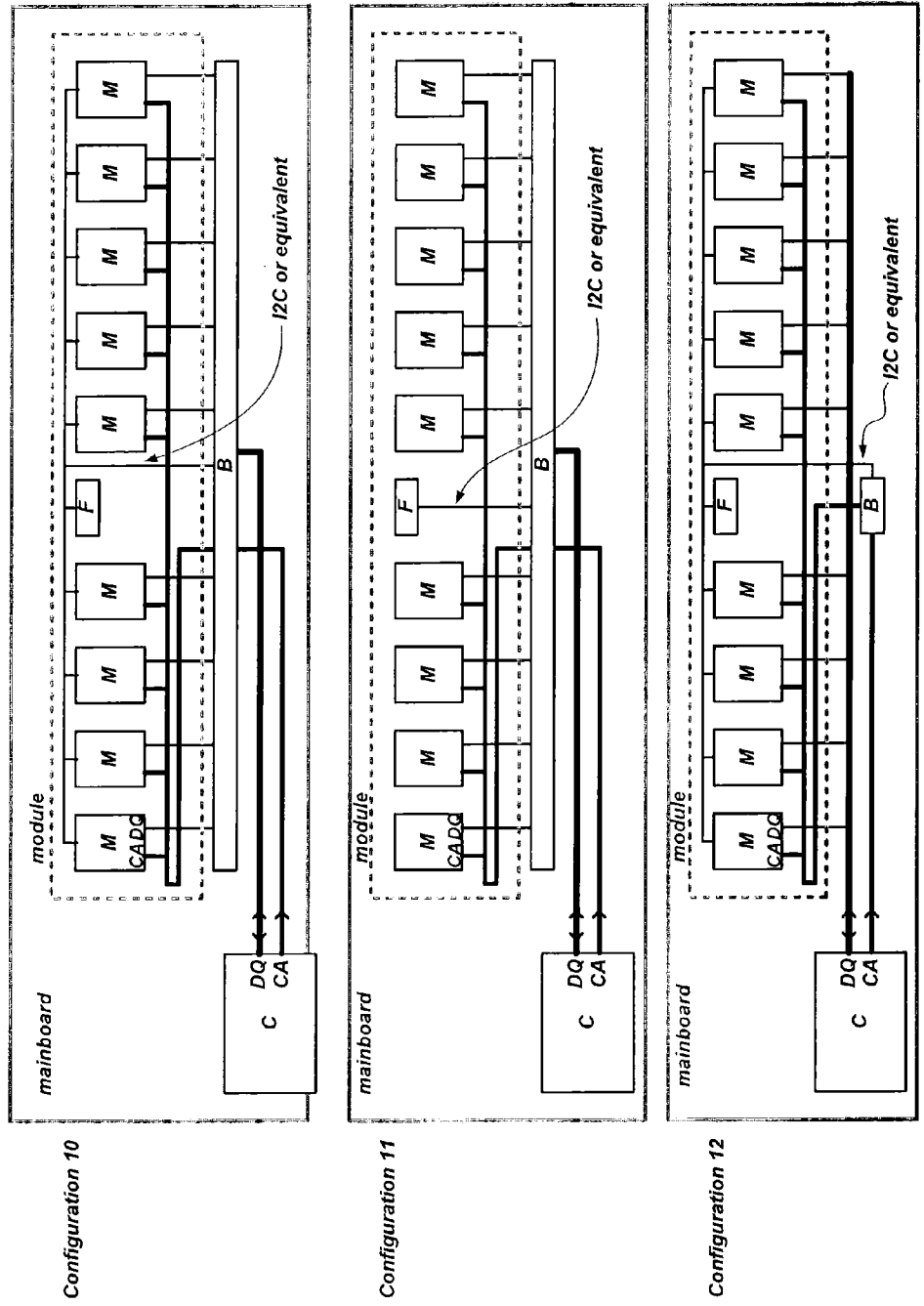

Now referring to FIG. 16D, in Configuration 10, a buffer component B has been added between the controller component C and the DRAM components M. There are primary CA and DQ signals between the controller C and buffer B components, and there are secondary CA and DQ signals between the buffer B and DRAM components M. The buffer component B resides on the mainboard.

An I²C bus also couples the buffer B and DRAM components M to a Flash component F to communicate the remapping information. The buffer B reads the remapping information from the Flash component F and writes to the DRAM components M during initialization using the I²C bus. During maintenance, the updated remapping information from the retention test is read from the DRAM components M and written to the Flash component F by the buffer B using the I²C bus.

Further referring to FIG. 16D, in Configuration 11, a buffer component B has been added between the controller component C and the DRAM components M. There are primary CA and DQ signals between the controller C and buffer B components, and there are secondary CA and DQ signals between the buffer B and DRAM components M. The buffer component B resides on the module assembly.

An I²C bus also couples the buffer component B to a Flash component F to communicate remapping information. The buffer B reads the remapping information from the Flash component F and writes to the DRAM components M (via the secondary CA and/or secondary DQ buses) during initialization. During maintenance, the updated remapping information from the retention test is read from the DRAM components M (via the secondary CA and/or secondary DQ buses) and written to the Flash component F by the buffer B.

Still referring to FIG. 16D, in Configuration 12, a buffer component B has been added between the controller component C and the DRAM components M. There are primary CA signals between the controller C and buffer B components, and there are secondary CA signals between the buffer B and DRAM components M. The buffer component B resides on the module assembly. The DQ signals are not buffered and connect the controller component C and the DRAM components M directly.

An I²C bus also couples the buffer B and DRAM components M to a Flash component F to communicate the remapping information. The buffer B reads the remapping information from the Flash component F and writes to the DRAM components M during initialization using the I²C bus. During maintenance, the updated remapping information from the retention test is read from the DRAMM components M and written to the Flash component F by the buffer B using the I²C bus.

Optionally, the secondary CA bus could be used in Configuration 12 to transfer remapping information between the buffer B and DRAM components M.

Tag Initialization

Figure 17:
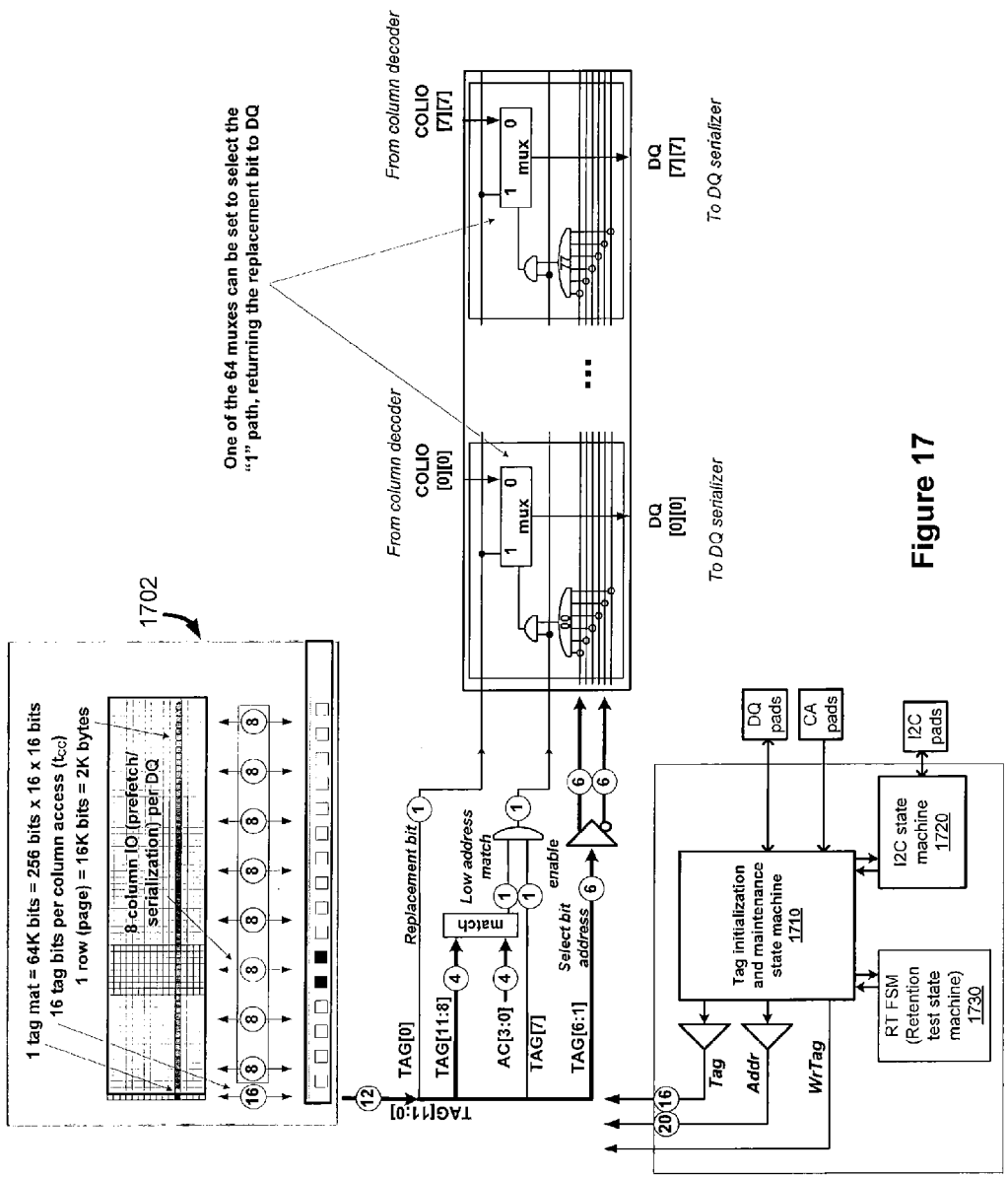
FIG. 17 illustrates an embodiment of a DRAM component that implements techniques for managing the initialization of a tag memory for repair methods.

FIG. 17 shows an embodiment of a DRAM component 1702 that implements techniques for managing the initialization of a tag memory for repair methods. The DRAM component 1702 includes a tag initialization and maintenance state machine 1710 that is coupled to DQ and CA input/output signals. In some embodiments, the status of the state machine 1710, which is controlled by a set of control registers (not shown), can in turn be controlled through these DQ and CA signals.

Alternatively, the control registers that control the status of the state machine 1710 may be accessed via a set of signals separate from the DQ and CA signals used for normal accesses to the DRAM component 1702. In FIG. 17, these separate signals are represented by one or more "I²C" pads, which are coupled to an I²C state machine 1720. An "I²C" bus is a standard two wire (SCK clock and SDA data wires) interconnection bus, and may be used for these initialization and maintenance activities. Of course, any other suitable interconnection buses may be used as alternative embodiments without falling out of the scope of the current disclosure.

A retention test state machine (RT-FSM) 1730 is also coupled to the initialization and maintenance state machine 1710. Embodiments of this RT-FSM 1730 are described in FIG. 3. The RT-FSM 1730 performs a background test of the retention time of storage cells in each row, and records the address of cells with inadequate retention time margin. Then, the RT-FSM 1730 transfers these addresses to a storage element (e.g., an external non-volatile memory device) via the I²C interface or the DQ/CA interface. These steps add the addresses of cells with inadequate retention time margin to the list which is to be used at the next initialization. In an alternative embodiment, the RT-FSM 1730 can also transfer the correct tag entry corresponding to these addresses, so that the repair mechanism takes effect immediately and excludes the weak storage cell as indicated by these addresses.

The exemplary DRAM component 1702 in FIG. 17, which includes a capacity of 1 Gb, contains 64 k rows. Each row contains 64 normal mats with 256 1-bit columns and one tag mat with 16 16-bit tags. When the DRAM component 1702 is powered up, it goes through an initialization process, which includes a plurality of steps that clear all the tag values.

A first initialization step starts with a write to a corresponding control register. The state machine 1710 must progress through the 64 k rows and write each of the 16 tags. The length of this progress is affected by the number of tag write operations needed, with each tag write operation requiring approximately 5 ns. Therefore, it requires about 5 ms for the entire 1 Gb DRAM (e.g., DRAM 1702).

A second initialization step takes place after the state machine 1710 clears the tags. The second step includes downloading the tag values for the column bits which are to be replaced. Typically, only a fraction of the total available tags have a non-zero value. As a result, the time to perform the tag writes for the second step may take merely a fraction of the time the first step requires. For example, the DRAM 1702 in FIG. 17 has 1M tag entries, each entry being able to correct a single bit for the associated 16 64-bit column words. The DRAM 1702 is able to utilize about 128 of these tags, assuming a random distribution of storage cells needing repair. Each tag write is made to one or more control registers (not shown) to transfer the tag value (e.g., 16 bits in FIG. 17), and the tag address (e.g., 20 bits in FIG. 17). This tag address is adequate to specify one of the 1M tag locations on the DRAM 1702 (which contains 64 k rows, each row with 16 tag entries). Of course, these DRAM configurations are for explanatory purposes only, as it is apparent that other suitable DRAM configurations could use other tag and tag address lengths to practice the present embodiments.

Bit Replacement Utilizing Spare Rows

The above discussion regarding various embodiments assumes that a repair mechanism is performed in conjunction with column accesses in the DRAM. Specifically, the repair mechanism includes tag entries associated with a group of column words and specifying which bit or bits are to be replaced by storage space in the tag.

Figure 18A:
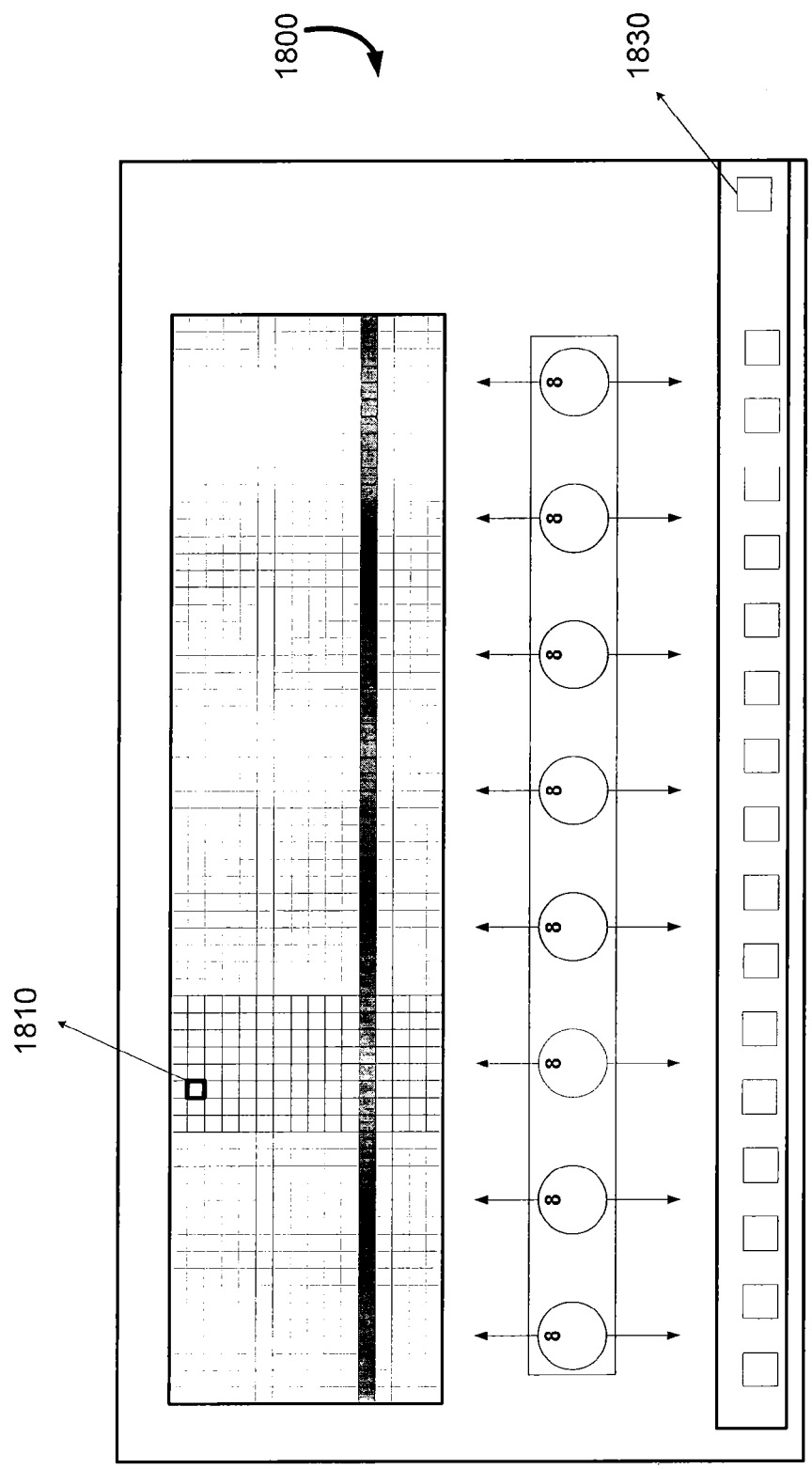
FIG. 18A-18C illustrate an alternative repair mechanism that is performed in conjunction with row accesses in a DRAM instead of column accesses.
Figure 18B:
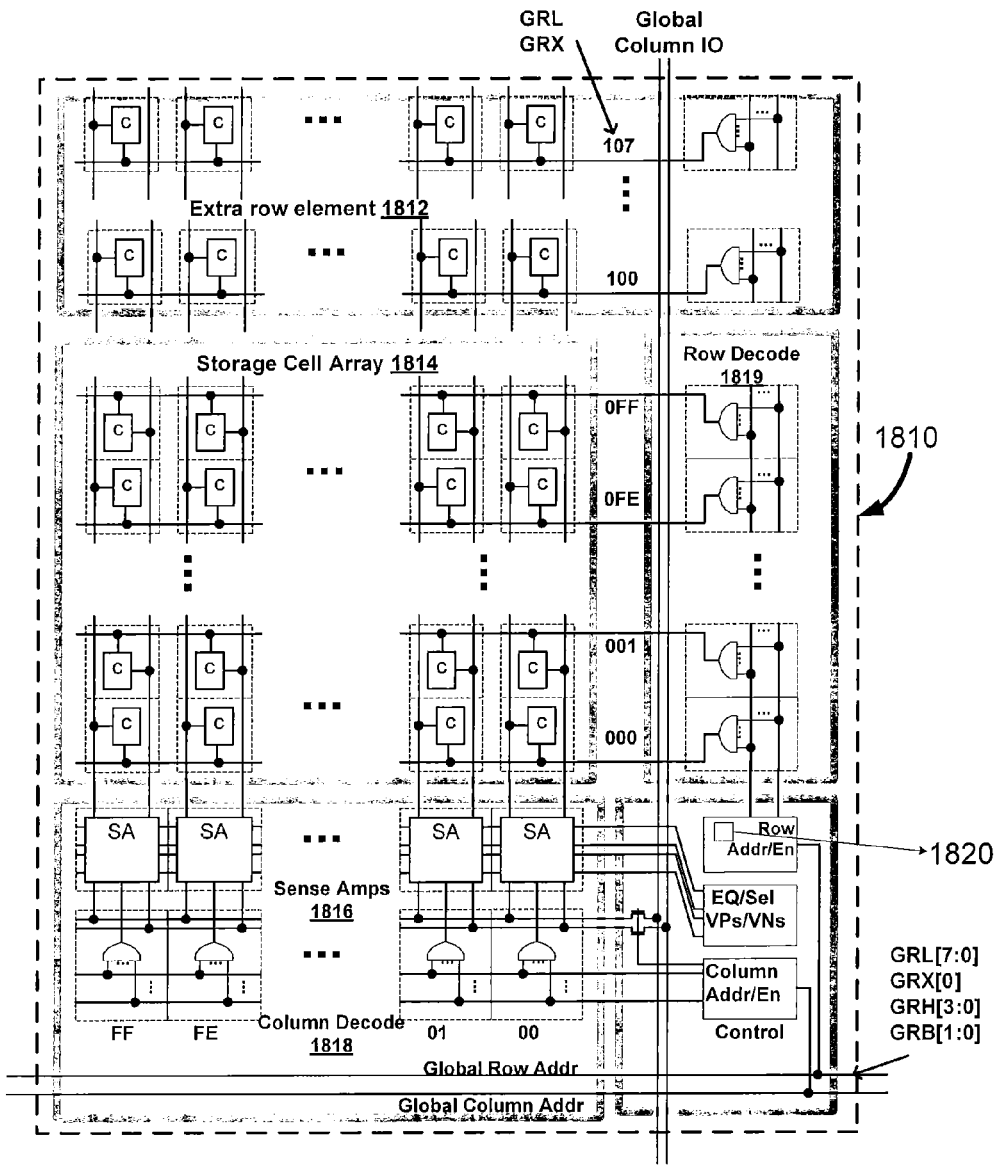
Figure 18C:
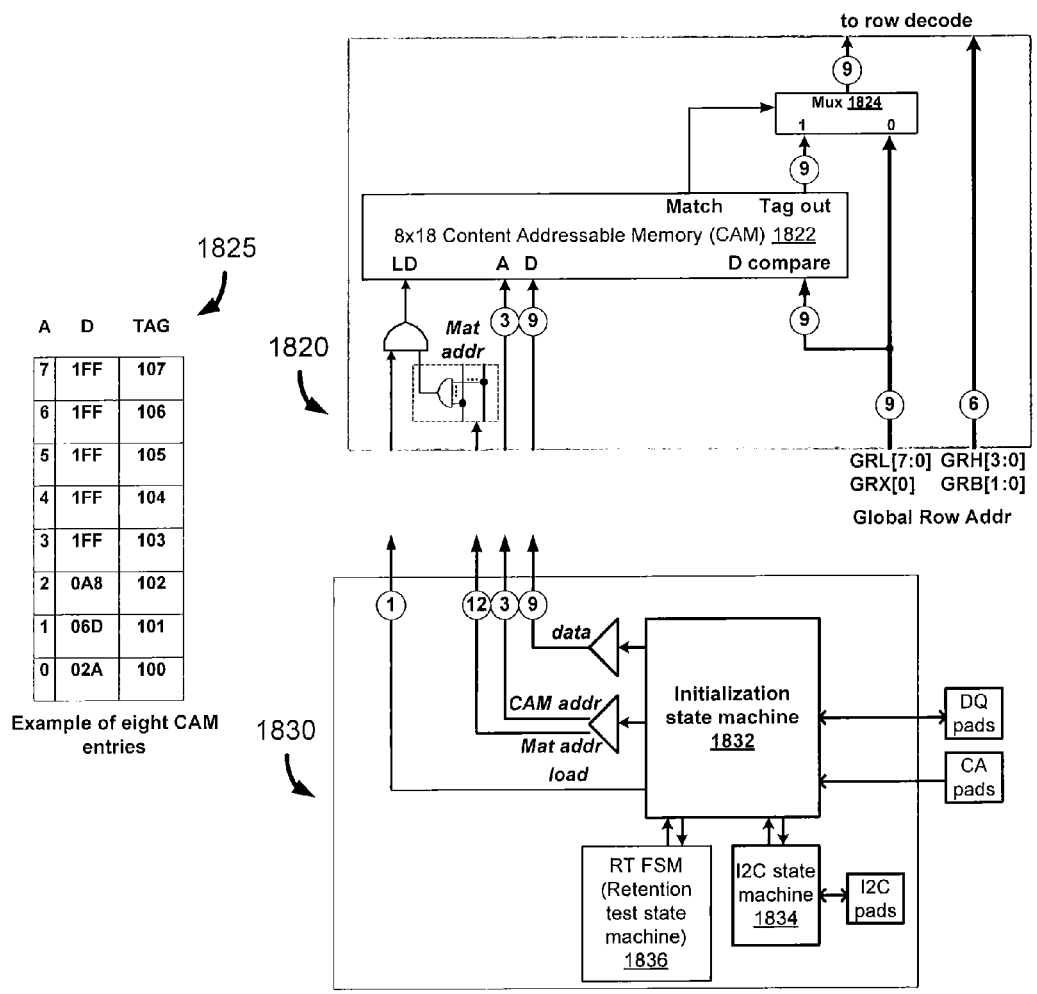

FIGS. 18A-18C illustrate an alternative repair mechanism that is performed in conjunction with row accesses in a DRAM 1800 instead of column accesses. In FIG. 18A, a DRAM 1800 includes a plurality of mat elements (e.g., mat element 1810), and each mat element is given a plurality of extra row elements 1812, which are illustrated in FIG. 18B. In the embodiment shown in FIG. 18B, eight extra rows are added to the 256 rows that are already present in the storage cell array 1814, representing a 3% mat area increase. Note that the configuration of the DRAM component 1800 is similar to the DRAM component in FIG. 2, which has a capacity of 256 Mb and contains 4096 mat elements.

With continued reference to FIG. 18B, an extra global row address "GRX[0]" is added to access these additional rows within the mat element. The decoding of nine address bits "GRX[0]" and "GRL[7:0]" takes place in row decoders 1819.

A row remapping block 1820 has also been added to each mat element. The details of the row remapping block 1820 are shown in FIG. 18C. Block 1820 remaps up to eight of the lower 256 rows (e.g., array 1814) into the upper eight extra rows (e.g., elements 1812). Each of the 4096 mat elements in the DRAM have unique remapping information.

Now referring to FIG. 18C, in some embodiments, the remapping is performed with a content-addressable memory ("CAM") element 1822. The CAM 1822, in this embodiment, has eight entries, each containing two 9-bit words and a 9-bit comparator. An example of the contents of the "CAM" 1822 is shown in the three-column table 1825. The "A" column shows the address of each of the eight entries. The "D" column shows the contents of the first 9-bit word. The "TAG" column shows the contents of the second 9-bit word.

More specifically, according to one embodiment, when a 9-bit value is placed on the "D-compare" input of the "CAM", it is compared to each of the 9-bit "D" words. If any of them is the same, then a "Match" output is asserted, and the accompanying 9-bit "TAG" word is placed on a "Tag out" output. A 2-1 multiplexer block 1824 passes this "TAG" value to the "Row Decode" section (e.g., decoders 1819 of FIG. 18B) of the mat instead of the "GRX[0]" and "GRL[7:0]" values.

For example, assume that the "GRX[0]" and "GRL[7:0]" global row address value is "06D". This is matched to the entry at "A"="1" in the table. Therefore, the "Match" output is asserted, the "TAG" entry of "101" is placed on the "Tag out" output, and "101" is placed on the output to the "row decode" section of the mat (instead of the original value of "06D").

Note that the table (e.g., table 1825) in this example only uses three of the eight extra rows. The five "D" entries for "A"={3,4,5,6,7} are set to "1FF". They do match any input values on the "GRX[0]" and "GRL[7:0]" global row address signals. The "1FF" value in each D entry represents the default value which is set at initialization, either with a control signal that sets the value, or with a state machine mechanism that steps through the address of each entry and loads the value.

The three interface buses "LD", "A", and "D" are coupled to the "CAM" block 1822. These interfaces are used to load the eight "D" entries for the CAM 1822 at initialization. Note that, in some embodiments, the "A" and "TAG" values used by the exemplary table entries (of table 1825) are hard-wired into the circuitry of the CAM 1822, and therefore do not need to be initialized.

A "D" entry is loaded by placing the 9-bit "D" value on the "D" interface, placing the desired 3-bit "A" address value on the "A" interface, and asserting the "LD" load control signal. Depending on embodiments, these steps may be done by an initialization process or by a maintenance process.

Referring to both FIGS. 18A and 18C, an initialization and maintenance block 1830 contains elements for the initialization and maintenance of the CAM 1822, according to one embodiment. It is similar to the initialization and maintenance logic described above in FIG. 17 for the column tag repair method. As shown in FIG. 18C, the block 1830 includes an initialization state machine 1832, an I²C state machine 1834, and an RT-FSM 1836. They work in a similar fashion as the initialization and maintenance state machine 1710, the I²C state machine 1720, and the RT-FSM 1730 in FIG. 17, respectively.

Distributed DEC Architecture

Figure 19:
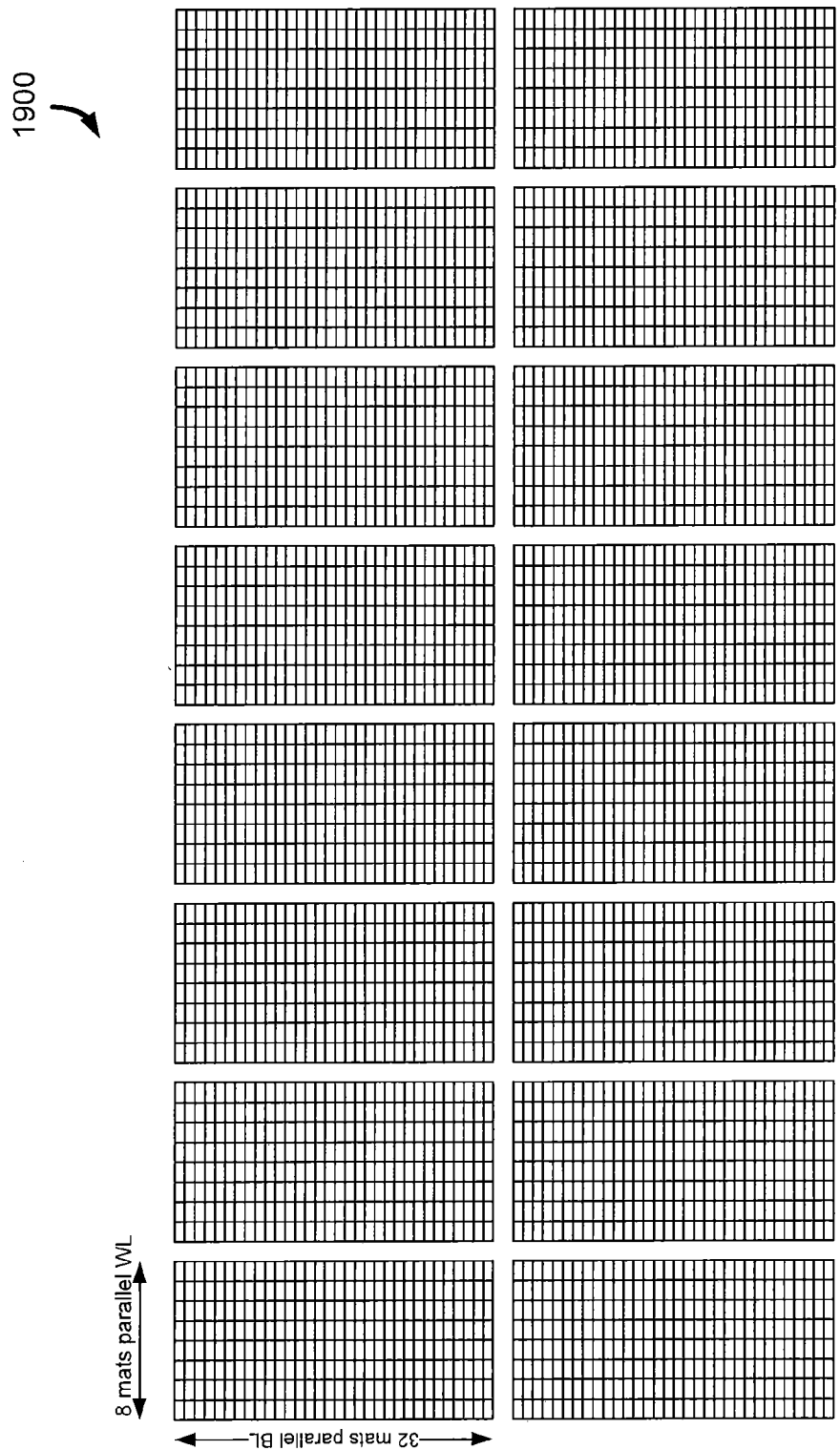
FIG. 19 illustrates a distributed DEC architecture with which current embodiments may be implemented, according to embodiments.

FIG. 19 illustrates a distributed architecture with which current embodiments may be implemented. According to the present embodiments, in a design where the switches between the local and global array data lines are distributed in the sense-amplifier stripe, it is possible to put both the tag and the data needed for replacing bits with marginal retention time bit into the regular mats, thereby saving the overhead of an extra mat.

Figure 20A:
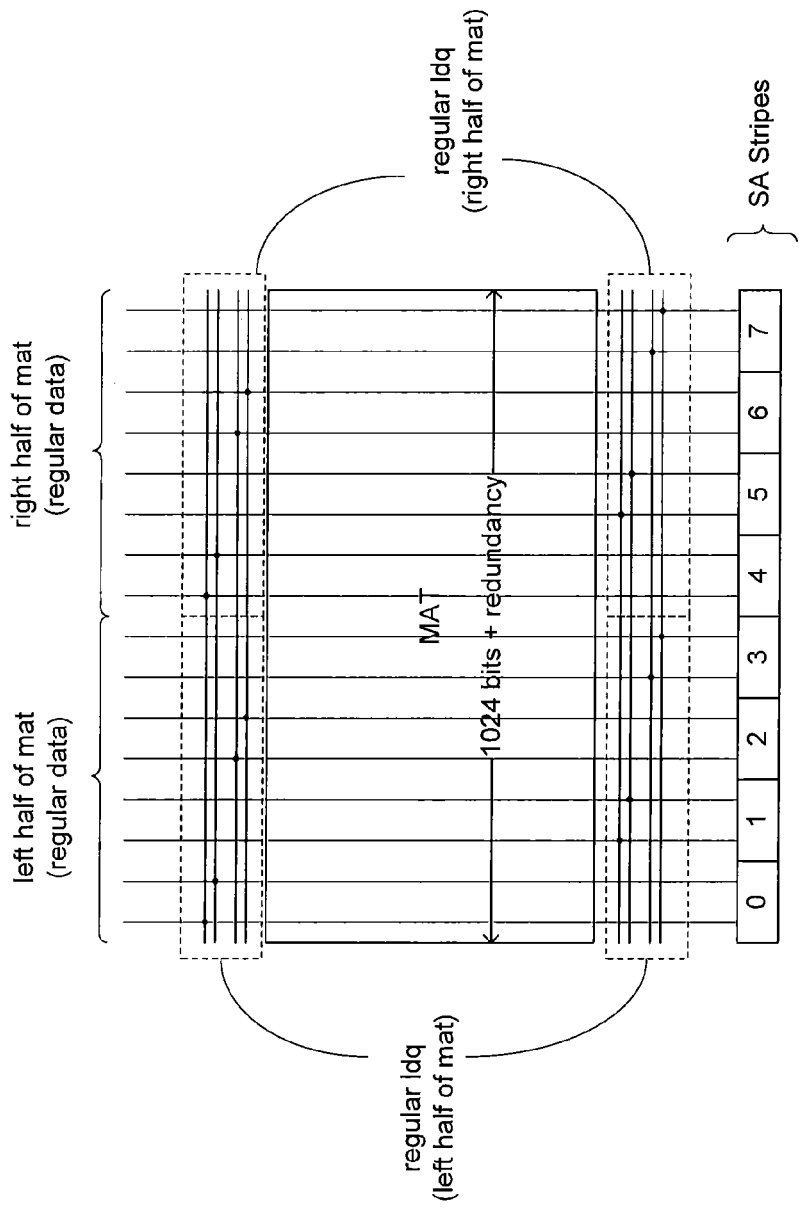
FIGS. 20A-20C illustrate some embodiments of the memory array and mat design that provide exemplary implementation of the architecture of FIG. 19.
Figure 20B:
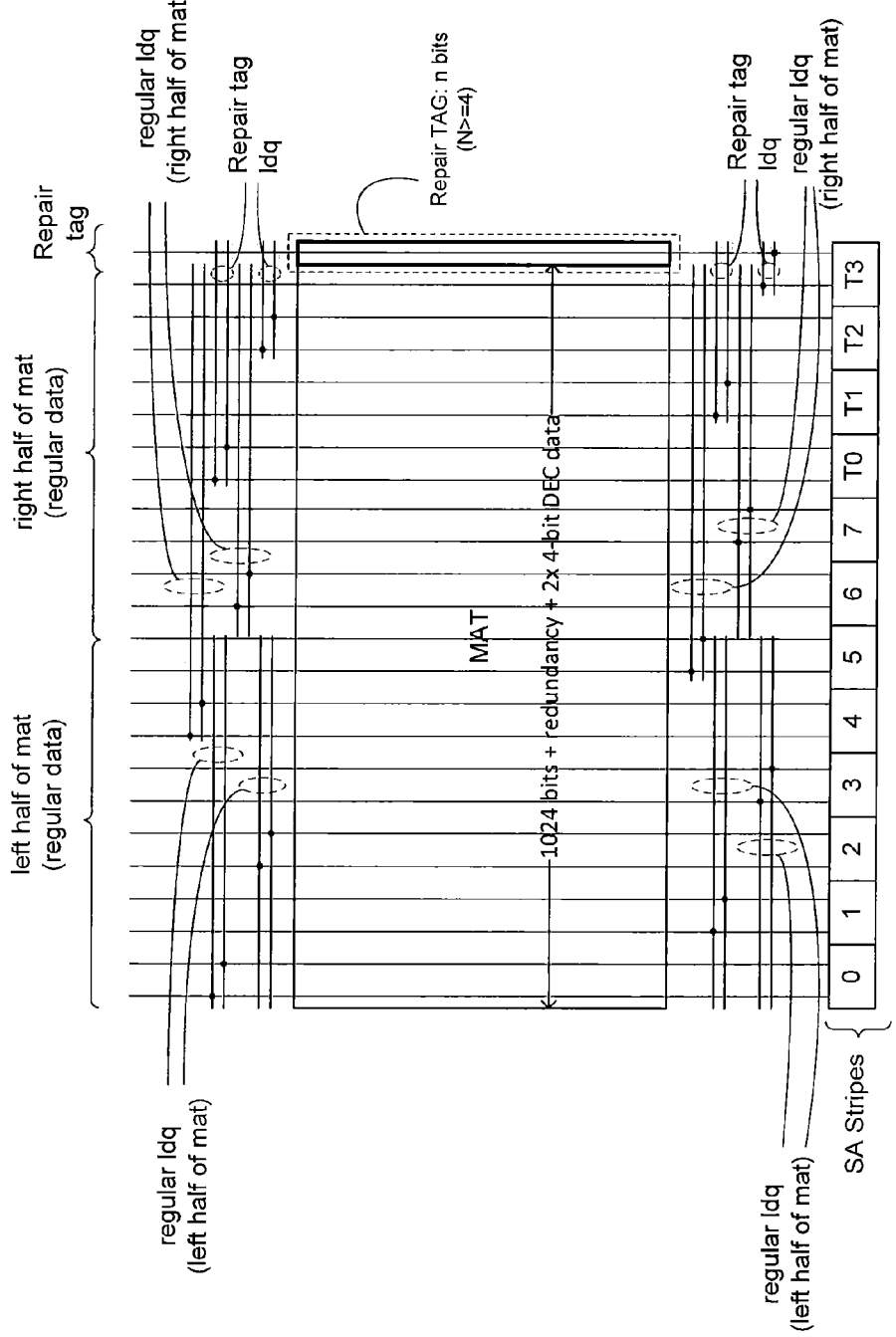
Figure 20C:
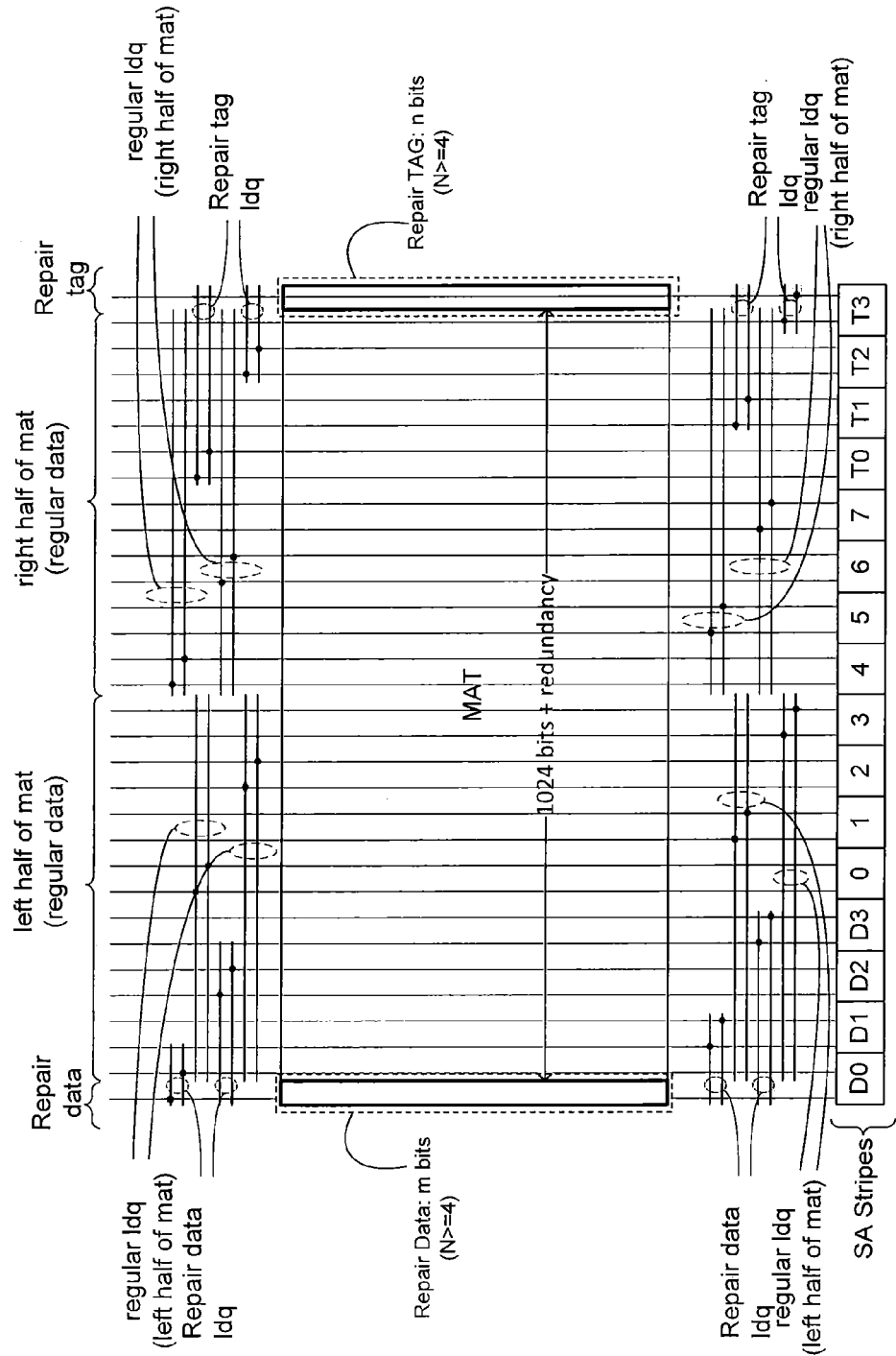

For purposes of explanation, a 2 Gb memory core is used as an example for FIGS. 20A-20C, which illustrate some embodiments of the memory array and mat design according to the architecture of FIG. 19. An overview of the 2 Gb memory core (or "die") is shown in FIG. 19 and is labeled as 1900. The memory core 1900 is equipped with 16 sub-banks. Each sub-bank has 128 Mb. Each sub-bank also has 32×8 mats, which equals to 256 mats. Therefore, each mat may represent a storage space of 512 kb. The memory core 1900 also has 1024 word lines (WLs) and 512 bit lines (BLs) per mat. According to one embodiment, the memory core 1900 has a dimension (or die size) of 7.43×4.81 mm2. As such, 1 µm per sense-amp stripe adds 64 nm to die height, which represents a 1.3% overhead. Similarly, 1 µm per local word line driver adds 72 µm to die width, which represents a 1.0% overhead. Each additional column select line with 4 bit lines per mat adds 4×93 nm×8×8=23.8 nm to die width, which represents a 0.32% overhead.

FIGS. 20A-20C illustrate some embodiments of the memory array and mat design that provide exemplary implementation of the architecture of FIG. 19. Some key concerns and restrictions of these embodiments are the arrangements of the global array data lines. For the embodiments illustrated in FIGS. 20A-20C, the data lines are as shown based on an exemplary die with the capability of accessing 64 bit simultaneously in a 1 kB page (e.g., a ×8 DDR3 type of memory die). If such a chip has 8 mats, and each mat is 1024 bits wide, then the chip needs to access 8 bits per mat. FIG. 20A shows a conventional mat. Four bits are typically associated with one column select line. Therefore, the mat is divided in two halves to deliver eight bits. At a single access, one column select line is active in the left half of the mat, and another one is active in the right half of the mat. Both local and global array data lines are differential, so that two wires are needed per bit. Local array data lines (ldq) extend over the width of one half of the mat and are coupled to two bits in the top and bottom sense-amplifier stripes. The width along which the local data lines are coupled to the sense-amplifiers (dotted box regions) is identical with the length of the local data lines. The global data lines are equally spaced. A sense-amplifier stripe contains one switch for each four bits (dots on local data lines) to connect a local data line to a global data line. FIG. 20B shows an embodiment where four bits of the tag are added to a mat. If embodiments require a total of 16 bits are required to be simultaneously accessed, then it is sufficient to have half of the mats architected in that fashion. For embodiments that require 32 bits of simultaneous access, all eight mats need to be modified. If there are only 4 bits added to the mat, then the tag has only one column select line and is accessed at every column access to the bank. The tag can also include more than one column select line in accordance with one embodiment. Such embodiment does not increase the number of simultaneously available tag bits, but it increases the repair flexibility because different column addresses can have different tags.

A notable difference of the new mat compared to a conventional mat is that the width of the additional columns for the tag is much smaller than the width of additional data circuitry. Without taking into account redundancy, the original mat has 1024 bits corresponding to 256 column select lines. The minimum tag adds only one column select line, an increase of 0.4%. On the other hand, the original mat has data circuitry for eight bits, while the new mat with tag has data circuitry for 12 bits, an increase of 50%. A consequence of this mismatch is that the local data lines corresponding to the tag need to be extended through the sense-amplifier stripe, thereby requiring eight parallel wire tracks instead of four in the conventional mat. In one embodiment, the pitch of these wires is 0.25 µm, and therefore 1 µm is added to each sense-amplifier stripe. In the embodiment, there are 66 sense-amp stripes in the height of a 2 Gb DRAM with such architecture illustrated by FIG. 20B, the added height is approximately 66 µm, or 1.3% overhead for a die of 4.8 mm height.

With continued reference to FIG. 20B, the repair data lines share the local data lines with the regular data they replace. It is therefore necessary to have one column select line of repair data per local data line (e.g., two column select lines or 2×4 bits per mat). Repair data therefore represents a 0.64% of overhead. As such, 12 additional address bits are needed (Because column select line in a half mat is 1 out of 128, and there are 16 half mats. Additionally, one enable bit is required). The required tag arrays add one column select line to ⅜ mats in a sub-bank, which represents a 0.12% overhead to the die area. Total die area impact is 1.3%+0.64%+0.12%, or around 2% in total for the embodiments that employ the minimum approach. Repair of two simultaneous bits adds 3 more tag column select lines for a total impact of 2.1%. Notably, in these embodiments, there is no need to provide more data lines, because a single half mat only accesses one column select line at a time, and therefore there can only be one failure. According to the present embodiments, two simultaneous failures should only take place in two different half mats.

FIG. 20C illustrates an embodiment that is similar to the embodiment in FIG. 20B, except that the embodiment in FIG. 20C includes additional wiring tracks, which are used to provide repair data with their own local data lines. In this way, it is no longer necessary to have a data column select line in each half mat. There is only one repair data column select line needed for each set of tags and for simultaneously repairable failures. Of course, this implementation requires more complex routing of repair data across the full sub-bank and the need to squeeze the data circuitry on half the pitch as in the array without repair capability. As compared to the embodiment of FIG. 20B, the overhead becomes 1.3% (wire tracks)+⅛×0.32% (data)+⅜×0.32% (tag)=1.5% for a single simultaneous failure. Similarly, for two simultaneous failures, the overhead is 1.3% (wire tracks)+⅖×0.32% (data)+ ⁶⁄₈×0.32% (tag)=1.6%.

Overview of Column Repair Method

Figure 21:
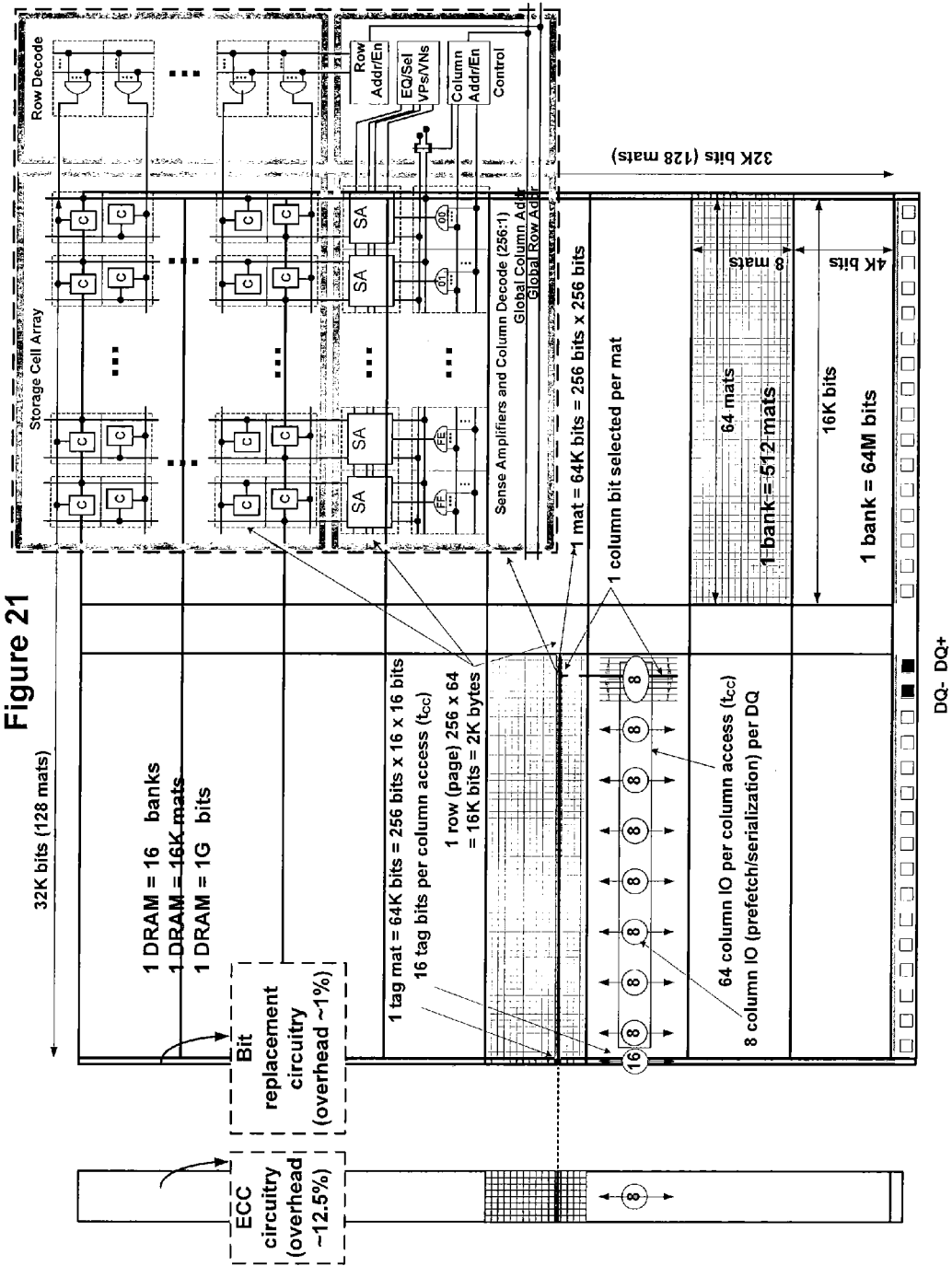
FIG. 21 shows an exemplary DRAM component within which the column repair method disclosed herein can be implemented.

FIG. 21 shows an exemplary DRAM component within which one embodiment of a column repair method disclosed herein can be implemented. The DRAM contains 1 Gb of storage cells, arranged as 16 banks. Each bank contains an array of 16 mats vertically by 64 mats horizontally. Each mat contains 256 rows, and each row contains 256 bits of storage cells.

Each mat supplies one global column IO signal, with two independent 64-bit column words accessed during each column cycle interval. These two 64-bit column words are serialized 8-1 onto two sets of 8 DQ output links (for a read operation). A write operation reverses the data direction.

Figure 23:
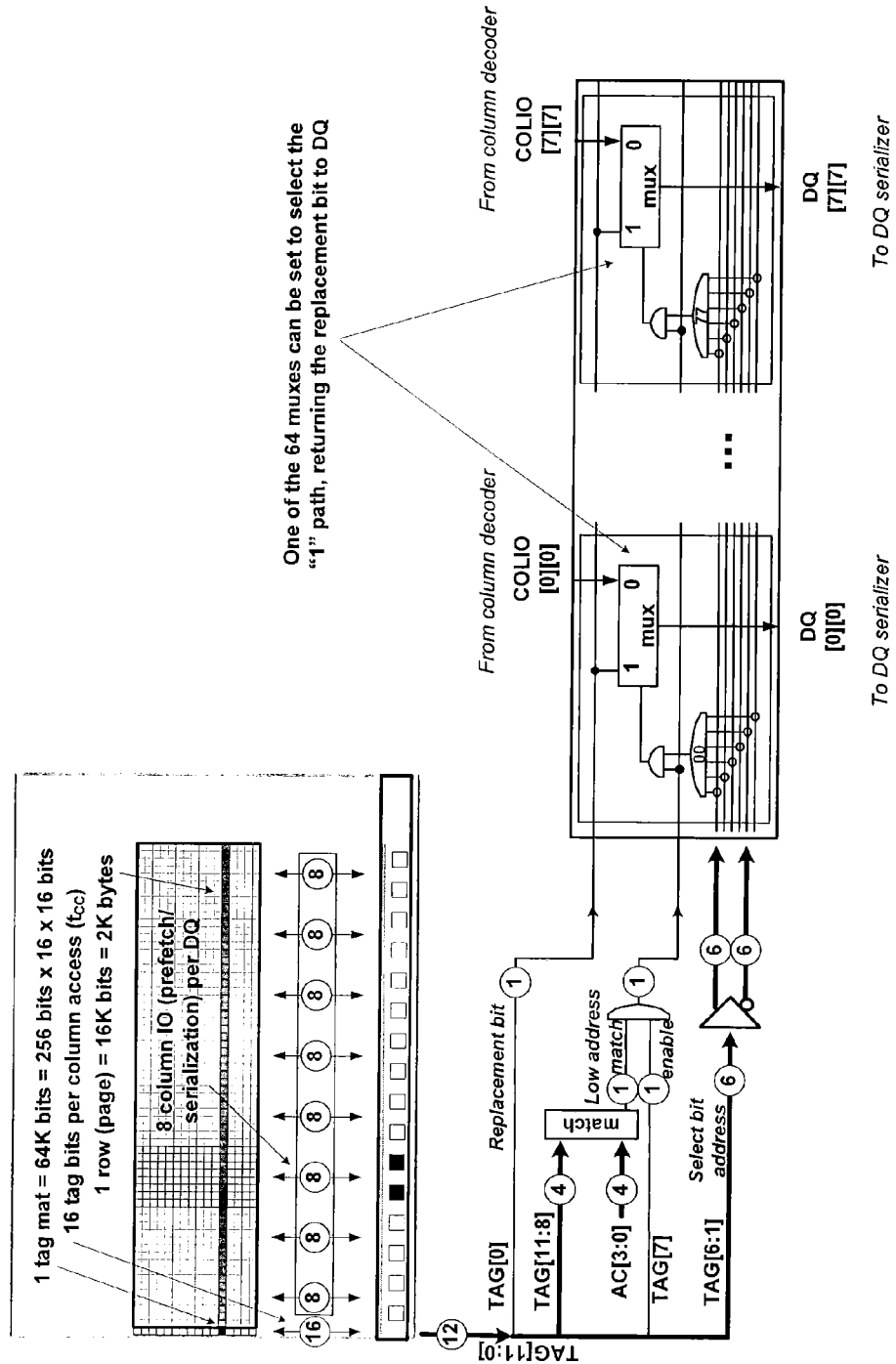
FIG. 23 illustrates further details of one embodiment of the special mat cell disclosed in FIG. 22.

Two repair methods are illustrated in FIGS. 21-23. A conventional 64/72 ECC single bit correction method can be applied to each of the 64-bit column words. This involves extending the 64 horizontal mats in each bank by 8 additional mats, a 12.5% increase in mat area. The associated circuitry required to perform the ECC single bit correction method is labeled as "ECC circuitry" on the left side of FIG. 21.

A second repair method is to add a single additional mat cell to the 64 horizontal mats in each bank. This additional mat cell is a special one, details of which are described in FIGS. 22-23. According to the present embodiments, the overhead for the second repair method is only around 1%. The associated circuitry required to perform the second repair method is labeled as "Bit replacement circuitry" on the left side of FIG. 21.

Mat Detail for Column Repair Method

In FIG. 22, a special mat 2200 used to implement the column repair method is shown on the left of FIG. 22. To facilitate a better understanding of the present embodiments, a normal mat 2250 is juxtaposed with the special mat 2200. The special mat 2200 has 16 global column IO signals instead of just one, as in the normal mat 2250. The column selection logic is therefore modified in the special mat 2200 so that one of 16 16-bit column groups is selected. As a comparison, in the normal mat 2250, the column selection logic chooses one of 256 1-bit column groups.

The 16-bit column group is called TAG[15:0], and it holds address information needed for bit repair of the storage cells in the normal mats.

Tag Logic for Column Repair Method

FIG. 23 illustrates how the 16-bit TAG value is accessed in parallel with the 64-bit column word on the 80 global column IO signals during a column access. Only TAG[11:0] are used in this embodiment; TAG[15:12] are reserved.

The AC[7:0] column address is used to access one of the 16 16-bit-tags held in the row, and AC[7:0] is used to access one of the 256 64-bit-column-words held in the row.

The TAG[11:8] field is compared to the AC[3:0] column address used for accessing the 64-bit column word. If it matches, and if the TAG[7] enable bit indicates the TAG is valid, then the TAG[0] spare bit replaces one of the 64-bits in the column word. This is determined by the TAG[6:1] value, which controls a distributed decoder and insertion multiplexer in the path of the 64-bit column word.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A method of operation in an integrated circuit (IC) memory device, the method comprising:
   refreshing a first group of storage rows in the IC memory device at a first refresh rate during a normal mode of operation;
   testing retention time for each of the rows, the testing for a given row under test carried out during the normal mode of operation and including
      refreshing at a second refresh rate that is slower than the first refresh rate; and
      interrupting the testing based on an access request for data stored in the given row under test.

2. The method of claim 1 and further comprising:
   storing a copy of data stored in a first row under test in a secondary storage location within the IC memory device;
   writing second data into the first row under test; and
   accessing the copy of the data in the secondary storage location for direct access when the testing is interrupted.

3. The method of claim 2 and further comprising:
   determining a pass/fail status for the first row under test based on pass/fail criteria;
   restoring the copied data to the first row under test depending on the pass/fail status; and
   repeating the testing for subsequent rows in the first group of storage rows.

4. The method of claim 3 wherein determining the pass/fail status comprises comparing the copied data to the second data.

5. The method of claim 3 and further comprising generating re-mapping information to substitute a redundant row for the first row based on the determined pass/fail status.

6. The method of claim 5 and further including storing a copy of the re-mapping information in a nonvolatile storage location.

7. The method of claim 1 and further including excluding the row under test from the refreshing at the first refresh rate.

8. The method of claim 2 wherein the testing comprises accessing the secondary storage locations and selectively enables access to the secondary storage locations by an application process.

9. The method of claim 1 wherein the testing of the given row is performed concurrent with refreshing of other rows.

10. A method of operation in an integrated circuit (IC) memory device, the method comprising:
    refreshing a first group of storage cells at a refresh rate during a normal mode of operation;
    testing a retention time parameter for the first group of storage cells during the normal mode of operation, the testing comprising
       identifying first states of the storage cells during the refreshing;
       storing the identified first states;
       performing a subsequent refresh operation on the first group of storage cells;
       identifying second states of the storage cells during the subsequent refresh; and
       comparing the first states of the storage cells to the second states of the storage cells.

11. The method of claim 10 and further comprising:
    determining a pass/fail status for one or more of the storage cells based on the comparison.

12. The method of claim 11 and further comprising:
    generating re-mapping information to substitute one or more redundant storage cells for the one or more storage cells based on the pass/fail status.

13. The method of claim 12 and further comprising:
    storing a copy of the re-mapping information in a nonvolatile storage location.

14. The method of claim 10 wherein refreshing at a refresh rate comprises self-refreshing at a nominal refresh rate.

15. An integrated circuit memory device comprising:
    an array of volatile storage cells;
    a first refresh circuit operable to refresh the array of storage cells at a first refresh rate during a normal mode of operation;
    retention test circuitry, the retention test circuitry operable during the normal mode of operation and including
       a second refresh circuit operable to refresh a given row under test at a second refresh rate that is slower than the first refresh rate; and
       interrupt circuitry to enable an external application access to data associated with the given row under test.

16. The integrated circuit memory device of claim 15 wherein the array of volatile storage cells includes primary storage for retaining data accessible to an application in a normal operating mode, and secondary storage for temporarily storing a copy of data stored in the given row under test.

17. The integrated circuit memory device of claim 15 wherein the array of volatile storage cells exhibits a longer retention time interval over time.

18. The integrated circuit memory device of claim 15, wherein the retention test circuitry further comprises:
    state detection circuitry to identify states of the first group of storage cells;
    secondary storage to store the identified states; and
    comparison circuitry to compare the identified states of the first group of storage cells to one or more previously identified states of the first group of storage cells from previous refresh operations.

* * * * *